(12) United States Patent
Tanada et al.

(10) Patent No.: US 9,742,378 B2
(45) Date of Patent: Aug. 22, 2017

(54) PULSE OUTPUT CIRCUIT AND SEMICONDUCTOR DEVICE

(71) Applicant: Semiconductor Energy Laboratory Co., Ltd., Atsugi-shi, Kanagawa-ken (JP)

(72) Inventors: Yoshifumi Tanada, Takayama (JP); Manabu Sato, Tochigi (JP); Hiroyuki Miyake, Atsugi (JP); Toshinari Sasaki, Shinagawa (JP); Kenichi Okazaki, Tochigi (JP); Junichi Koezuka, Tochigi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 443 days.

(21) Appl. No.: 13/922,685

(22) Filed: Jun. 20, 2013

(65) Prior Publication Data

US 2014/0002426 A1    Jan. 2, 2014

(30) Foreign Application Priority Data

Jun. 29, 2012 (JP) ................ 2012-147225

(51) Int. Cl.
 *H03K 3/01* (2006.01)
 *G11C 19/28* (2006.01)
 *G09G 3/36* (2006.01)

(52) U.S. Cl.
 CPC ............ *H03K 3/01* (2013.01); *G11C 19/28* (2013.01); *G09G 3/3688* (2013.01)

(58) Field of Classification Search
 CPC ............ H01L 29/7869; H01L 27/124; H01L 27/0296; G09G 3/3233; G09G 3/3291; G09G 2310/0264; G09G 3/3258
 See application file for complete search history.

(56) References Cited

U.S. PATENT DOCUMENTS 5,528,032 A    6/1996    Uchiyama
5,731,856 A    3/1998    Kim et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
(Continued)

*Primary Examiner* — Jennifer Mehmood
*Assistant Examiner* — Parul Gupta
(74) *Attorney, Agent, or Firm* — Robinson Intellectual Property Law Office; Eric J. Robinson

(57) ABSTRACT

A highly reliable semiconductor device in which a shift in threshold voltage of a transistor due to deterioration can be inhibited is provided. A pulse output circuit includes a first transistor, a second transistor, a third transistor, a fourth transistor, a fifth transistor, and a sixth transistor. A clock signal is supplied to a drain of the first transistor. A first power supply potential is applied to a source of the second transistor, and a drain of the second transistor is connected to the drain of the first transistor. A second power supply potential is applied to a drain of the third transistor. The first power supply potential is applied to a source of the fourth transistor, and a drain of the fourth transistor is connected to the drain of the third transistor. The first power supply potential is applied to a source of the fifth transistor, and a drain of the fifth transistor is connected to a gate of the third transistor. One of a source and a drain of the sixth transistor
(Continued)

is connected to the drain of the first transistor, and the other of the source and the drain of the sixth transistor is connected to the gate of the third transistor. The first transistor and the third transistor include back gates connected to each other. The first to sixth transistors have the same conductivity type.

14 Claims, 24 Drawing Sheets

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,756,816 | B2 | 6/2004 | Miyake |
| 6,788,108 | B2 | 9/2004 | Miyake et al. |
| 6,813,332 | B2 | 11/2004 | Nagao et al. |
| 6,928,136 | B2 | 8/2005 | Nagao et al. |
| 6,958,750 | B2 | 10/2005 | Azami et al. |
| 6,975,142 | B2 | 12/2005 | Azami et al. |
| 7,049,190 | B2 | 5/2006 | Takeda et al. |
| 7,057,598 | B2 | 6/2006 | Azami et al. |
| 7,061,014 | B2 | 6/2006 | Hosono et al. |
| 7,064,346 | B2 | 6/2006 | Kawasaki et al. |
| 7,068,076 | B2 | 6/2006 | Azami |
| 7,105,868 | B2 | 9/2006 | Nause et al. |
| 7,202,863 | B2 | 4/2007 | Kimura et al. |
| 7,205,610 | B2 | 4/2007 | Koyama |
| 7,211,825 | B2 | 5/2007 | Shih et al |
| 7,218,349 | B2 | 5/2007 | Kimura |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,432,737 | B2 | 10/2008 | Yoshida |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,687,808 | B2 | 3/2010 | Umezaki |
| 7,732,819 | B2 | 6/2010 | Akimoto et al. |
| 7,932,888 | B2 | 4/2011 | Miyake |
| 7,978,274 | B2 | 7/2011 | Umezaki et al. |
| 8,054,279 | B2 | 11/2011 | Umezaki et al. |
| 8,314,765 | B2 | 11/2012 | Umezaki |
| 8,330,702 | B2 | 12/2012 | Miyake et al. |
| 8,339,836 | B2 * | 12/2012 | Yamazaki ............ G11O 5/063 365/145 |
| 8,363,000 | B2 | 1/2013 | Umezaki |
| 8,369,478 | B2 | 2/2013 | Miyake |
| 8,415,665 | B2 | 4/2013 | Kimura et al. |
| 8,427,417 | B2 | 4/2013 | Koyama |
| 8,542,178 | B2 | 9/2013 | Yoo et al. |
| 8,565,369 | B2 | 10/2013 | Takahashi et al. |
| 9,171,640 | B2 | 10/2015 | Miyake et al. |
| 2001/0046027 | A1 | 11/2001 | Tai et al. |
| 2002/0017646 | A1 * | 2/2002 | Hynecek ........... H01L 27/14806 257/72 |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0026619 | A1 | 2/2010 | Umezaki |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0134396 | A1 | 6/2010 | Umezaki |
| 2010/0245304 | A1 | 9/2010 | Umezaki |
| 2010/0328281 | A1 * | 12/2010 | Okada ................. G11C 19/184 345/206 |
| 2011/0018915 | A1 | 1/2011 | Umezaki |
| 2011/0063262 | A1 * | 3/2011 | Umezaki ................. G09G 3/20 345/204 |
| 2011/0199807 | A1 | 8/2011 | Saito et al. |
| 2011/0204928 | A1 | 8/2011 | Umezaki |
| 2011/0215787 | A1 | 9/2011 | Shionoiri et al. |
| 2011/0279438 | A1 | 11/2011 | Ito |
| 2011/0285675 | A1 | 11/2011 | Amano et al. |
| 2011/0298771 | A1 | 12/2011 | Yoo et al. |
| 2012/0026774 | A1 | 2/2012 | Shionoiri |
| 2012/0286263 | A1 | 11/2012 | Miyake |
| 2012/0286855 | A1 | 11/2012 | Umezaki |

(56) References Cited

U.S. PATENT DOCUMENTS

| | | |
|---|---|---|
| 2012/0294080 A1 | 11/2012 | Endo |
| 2013/0049806 A1 | 2/2013 | Koyama |
| 2013/0082760 A1 | 4/2013 | Umezaki |
| 2013/0140617 A1 | 6/2013 | Umezaki |
| 2013/0162305 A1 | 6/2013 | Watanabe |
| 2013/0223584 A1 | 8/2013 | Umezaki |
| 2013/0278324 A1 | 10/2013 | Kaneyasu et al. |
| 2016/0042807 A1 | 2/2016 | Miyake et al. |

FOREIGN PATENT DOCUMENTS

| | | |
|---|---|---|
| EP | 2549465 A | 1/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-325798 | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-277652 | 12/2010 |
| JP | 2011-138595 A | 7/2011 |
| JP | 2011-253169 A | 12/2011 |
| WO | WO-2004/114391 | 12/2004 |
| WO | WO 2007/080813 | 7/2007 |
| WO | WO-2011/043451 | 4/2011 |
| WO | WO-2011/114562 | 9/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

(56) References Cited

OTHER PUBLICATIONS

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

PULSE OUTPUT CIRCUIT AND SEMICONDUCTOR DEVICE

BACKGROUND OF THE INVENTION

1. Field of the Invention

The present invention relates to pulse output circuits that include transistors having the same conductivity type, and semiconductor devices such as semiconductor display devices that include the pulse output circuits.

2. Description of the Related Art

Semiconductor display devices such as liquid crystal display devices and EL display devices preferably include transistors having the same conductivity type rather than CMOS transistors in order to reduce the cost of backplanes (circuit boards). Patent Documents 1 and 2 disclose techniques for forming a variety of circuits such as inverters and shift registers that are used in driver circuits of semiconductor display devices and are constituted of transistors having the same conductivity type.

In particular, for a semiconductor display device including oxide semiconductor transistors, a glass substrate of the fifth generation (1200 mm wide×1300 mm long) or later can be used. Thus, such a semiconductor display device has advantages of high productivity and low cost. The oxide semiconductor transistors generally have the same conductivity type. Thus, in the case where the oxide semiconductor is used for a semiconductor display device, a driver circuit of the semiconductor display device includes transistors having the same conductivity type. Accordingly, the oxide semiconductor transistors are suitable for transistors included in a semiconductor display device.

REFERENCE

Patent Document 1: Japanese Published Patent Application No. 2001-325798

Patent Document 2: Japanese Published Patent Application No. 2010-277652

SUMMARY OF THE INVENTION

In a semiconductor display device including transistors having the same conductivity type, in a driver circuit supplying a potential to a wiring that is connected to a plurality of pixels and is called a bus line, such as a scan line or a signal line, electrical characteristics of a transistor controlling supply of the potential to the bus line deteriorated, for example, the threshold voltage was shifted.

Under the technical background described above, it is an object of the present invention to provide a highly reliable semiconductor device in which a shift in threshold voltage of a transistor due to deterioration can be inhibited.

It has been empirically derived that electrical characteristics of a transistor deteriorate greatly, for example, the threshold voltage is shifted greatly as the frequency of variation in a potential applied to one of a source and a drain of the transistor becomes higher or the amount of variation in the potential becomes larger when the transistor is off. Actually, when a driver circuit operates, among transistors controlling supply of potentials to bus lines, a control signal whose potential varies frequently and has a large amplitude, such as a clock signal, is supplied to one of a source and a drain of a transistor whose electrical characteristics deteriorate when the transistor is off.

Thus, in order to inhibit deterioration of the electrical characteristics of the transistor, it is preferable to decrease the amplitude of the control signal. However, when the amplitude of the control signal is decreased, the amplitude of a potential applied from the other of the source and the drain of the transistor to the bus line is also decreased, which is unfavorable. Thus, in a driver circuit according to one embodiment of the present invention, a circuit having a function of adjusting the amplitude of a potential is separately provided next to the transistor usually controlling supply of a potential to a bus line. With such a structure, the amplitude of a control signal can be decreased to inhibit deterioration of electrical characteristics of a transistor whose one of a source and a drain is supplied with the control signal, and the amplitude of a signal output from a driver circuit can be set to a desired amplitude.

According to one embodiment of the present invention, it is possible to provide a highly reliable semiconductor device in which a shift in threshold voltage of a transistor due to deterioration can be inhibited.

DETAILED DESCRIPTION OF THE INVENTION

Figure 1A:
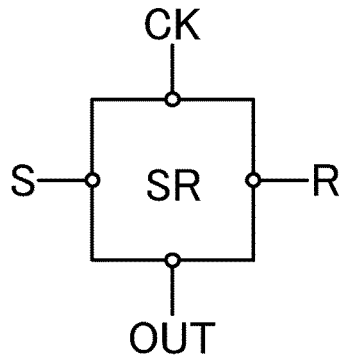
FIGS. 1A to 1C illustrate a structure of a pulse output circuit.

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that the present invention includes, in its category, all the semiconductor devices that include transistors: for example, integrated circuits, RF tags, and semiconductor display devices. The integrated circuit includes, in its category, large scale integrated circuits (LSIs) including a microprocessor, an image processing circuit, a digital signal processor (DSP), and a microcontroller and programmable logic devices (PLDs) such as a field programmable gate array (FPGA) and a complex PLD (CPLD). Further, the semiconductor display device includes, in its category, semiconductor display devices in which circuit elements including semiconductor films are included in driver circuits, such as liquid crystal display devices, light-emitting devices in which a light-emitting element typified by an organic light-emitting element is provided in each pixel, electronic paper, digital micromirror devices (DMDs), plasma display panels (PDPs), and field emission displays (FEDs).

Note that in this specification, the category of semiconductor display devices includes panels in which a display element such as a liquid crystal element or a light-emitting element is formed in each pixel, and modules in which ICs and the like including controllers are mounted on the panels.

In this specification, the term "connection" means electrical connection and corresponds to a state where current, voltage, or a potential can be supplied or transmitted. Accordingly, a connection state does not always mean a direct connection state but includes an indirect connection state through a circuit element such as a wiring, a resistor, a diode, or a transistor so that current, voltage, or a potential can be supplied or transmitted.

Note that a source of a transistor means a source region that is part of a semiconductor film functioning as an active layer or a source electrode that is connected to the semiconductor film. Similarly, a drain of a transistor means a drain region that is part of the semiconductor film or a drain electrode that is connected to the semiconductor film. A gate means a gate electrode.

The terms "source" and "drain" of a transistor interchange with each other depending on the channel type of the transistor or levels of potentials applied to terminals. In general, in an n-channel transistor, a terminal to which a low potential is applied is called a source, and a terminal to which a high potential is applied is called a drain. Further, in a p-channel transistor, a terminal to which a low potential is applied is called a drain, and a terminal to which a high potential is applied is called a source. In this specification, although the connection relation of the transistor is described assuming that the source and the drain are fixed in some cases for convenience, actually, the names of the source and the drain interchange with each other depending on the relation of the potentials.

Embodiment 1

In this embodiment, examples of a pulse output circuit included in a driver circuit according to one embodiment of the present invention are described.

Figure 1B:
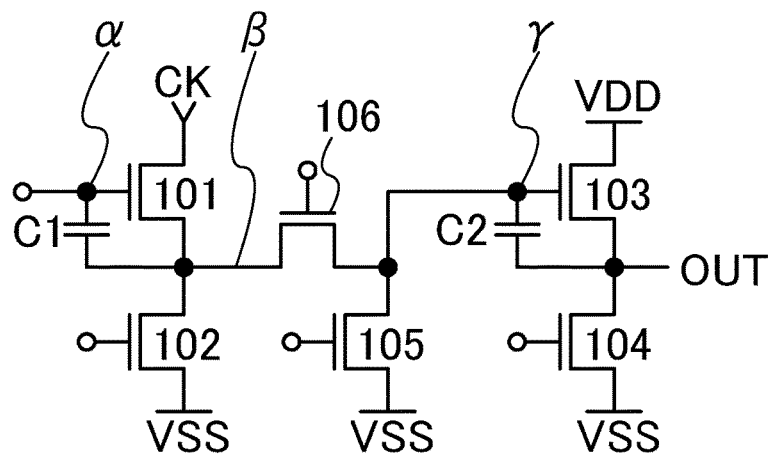
Figure 1C:
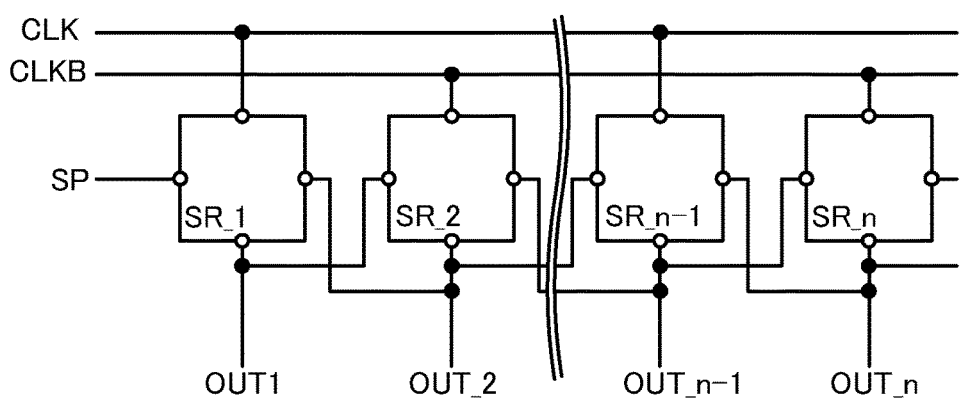

FIGS. 1A to 1C illustrate a structure example of a pulse output circuit in this embodiment. A pulse output circuit SR in FIGS. 1A to 1C has a function of outputting a pulse signal through an output end (OUT) in response to a set signal (S), a reset signal (R), and a clock signal (CK) that are input, as illustrated in FIG. 1A. Note that a plurality of clock signals may be input to the pulse output circuit SR.

The pulse output circuit SR in FIG. 1A includes transistors 101 to 106, as illustrated in FIG. 1B. The transistors 101 to 106 have the same conductivity type.

For example, the plurality of pulse output circuits SR in FIG. 1A (pulse output circuits SR_1 to SR_n (n is a natural number of 2 or more)) are used to constitute a shift register, as illustrated in FIG. 1C. In FIG. 1C, n is 4 or more. At this time, a start pulse signal (SP) is input to the pulse output circuit SR_1 as the set signal (S). A pulse signal output from a pulse output circuit SR_k−1 (k is a natural number of 2 or more and n or less) is input to a pulse output circuit SR_k as the set signal (S). A pulse signal output from a pulse output circuit SR_m+1 (m is a natural number of (n−1) or less) is input to a pulse output circuit SR_m as the reset signal (R). A clock signal CLK is input to pulse output circuits SR in odd-numbered stages as the clock signal (CK). A clock signal CLKB is input to pulse output circuits SR in even-numbered stages as the clock signal (CK). The clock signal CLKB is a signal obtained by inversion of the polarity of the clock signal CLK. In the shift register in FIG. 1C, pulse signals are output through output ends (OUT_1 to OUT_n) of the pulse output circuits SR_1 to SR_n. Note that a dummy pulse output circuit SR may be provided as an (n+1)th pulse output circuit SR_n+1. At this time, a pulse signal output from the pulse output circuit SR_n+1 is input to the pulse output circuit SR_n as the reset signal (R).

Figure 2A:
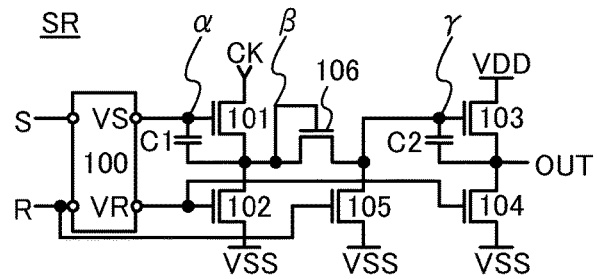
FIGS. 2A and 2B each illustrate a structure of a pulse output circuit.
Figure 2B:
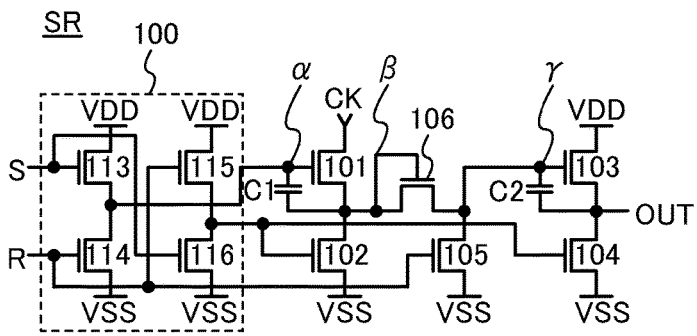

Next, the pulse output circuit SR in FIGS. 1A and 1B is described in detail with reference to FIGS. 2A to 2C. FIG. 2A is an example where a circuit 100 controlling the gate potentials of the transistors 101, 102, 104, and 105 is added to the components in FIG. 1B. FIG. 2B is an example where the circuit 100 includes transistors 113 to 116. Components are described below.

The gate potential of the transistor 101 is controlled by the set signal (S) and the reset signal (R). For example, when the transistor 113 is turned on in response to the set signal (S) as illustrated in FIG. 2B, the gate (node α) potential of the transistor 101 is increased. In addition, when the transistor 114 is turned on in response to the reset signal (R), a power supply potential VSS is applied to the gate of the transistor 101. Such control of the gate potential of the transistor 101 by the set signal (S) and the reset signal (R) includes indirect control, for example, control of the gate potential of the transistor 101 by control of the operating states of the transistors 113 and 114 by the set signal (S) and the reset signal (R).

A control signal such as the clock signal (CK) is input to one of a source and a drain of the transistor 101. The potential of one of the source and the drain of the transistor 101 is changed in response to the clock signal (CK). Note that one embodiment of the present invention is not limited to the above structure. A capacitor whose one electrode is supplied with the clock signal (CK) and whose other electrode is connected to one of the source and the drain of the transistor 101 may be provided.

A capacitor C1 may be formed between the gate and the other of the source and the drain of the transistor 101. For example, parasitic capacitance between the gate and the other of the source and the drain of the transistor 101 may be used as the capacitor C1. Alternatively, a capacitor is separately provided as the capacitor C1.

The power supply potential VSS is applied to one of a source and a drain of the transistor 102, and the other of the source and the drain of the transistor 102 is electrically connected to the other of the source and the drain of the transistor 101. The potential of the gate of the transistor 102 is controlled by, for example, the set signal (S) and the reset signal (R). For example, when the transistor 116 is turned on in response to the set signal (S) as illustrated in FIG. 2B, the power supply potential VSS is applied to the gate of the transistor 102. In addition, when the transistor 115 is turned on in response to the reset signal (R), the gate potential of the transistor 102 is increased. However, this embodiment is not limited thereto. The gate potential of the transistor 102 may be controlled by another signal.

When a portion where the other of the source and the drain of the transistor 102 is connected to the other of the source and the drain of the transistor 101 is denoted by a node β, the transistor 101 has a function of controlling whether to set the potential of the node β in accordance with the clock signal (CK). The transistor 102 has a function of controlling whether to apply the power supply potential VSS to the node β.

A power supply potential VDD is applied to one of a source and a drain of the transistor 103, and the potential of the other of the source and the drain of the transistor 103 is the potential of a pulse signal output. The transistor 103 has a function of controlling whether to apply the power supply potential VDD to the output end (OUT).

A capacitor C2 may be formed between a gate and the other of the source and the drain of the transistor 103. For example, parasitic capacitance between the gate and the other of the source and the drain of the transistor 103 may be used as the capacitor C2. Alternatively, a capacitor is separately provided as the capacitor C2.

The power supply potential VSS is applied to one of a source and a drain of the transistor 104, and the other of the source and the drain of the transistor 104 is electrically connected to the other of the source and the drain of the transistor 103. The gate potential of the transistor 104 is controlled by, for example, the set signal (S) and the reset signal (R). For example, when the transistor 116 is turned on in response to the set signal (S) as illustrated in FIG. 2B, the power supply potential VSS is applied to the gate of the transistor 104. When the transistor 115 is turned on in response to the reset signal (R), the gate potential of the transistor 104 is increased. However, this embodiment is not limited thereto. The gate potential of the transistor 104 may be controlled by another signal. The transistor 104 has a function of controlling whether to apply the power supply potential VSS to the output end (OUT).

The power supply potential VSS is applied to one of a source and a drain of the transistor 105, and the other of the source and the drain of the transistor 105 is electrically connected to the gate of the transistor 103. The gate potential of the transistor 105 is controlled by, for example, the reset signal (R). However, this embodiment is not limited thereto. The gate potential of the transistor 105 may be controlled by another signal. The transistor 105 has a function of controlling whether to apply the power supply potential VSS to the gate (node γ) of the transistor 103.

One of a source and a drain of the transistor 106 is electrically connected to the other of the source and the drain of the transistor 101, and the other of the source and the drain of the transistor 106 is electrically connected to the gate of the transistor 103. When a gate of the transistor 106 is electrically connected to one of the source and the drain of the transistor 106 as illustrated in FIG. 2B, for example, the transistor 106 is diode-connected. Note that this embodiment is not limited thereto. A signal may be separately input to the gate of the transistor 106. The transistor 106 has a function of controlling conduction between the other of the source and the drain of the transistor 101 and the gate of the transistor 103. The transistor 106 can make the gate of the transistor 103 floating and thus can increase the gate potential of the transistor 103.

The power supply potential VDD is applied to one of a source and a drain of the transistor 113, and the other of the source and the drain of the transistor 113 is electrically connected to the gate of the transistor 101. The set signal (S) is input to a gate of the transistor 113.

The power supply potential VSS is applied to one of a source and a drain of the transistor 114, and the other of the source and the drain of the transistor 114 is electrically connected to the other of the source and the drain of the transistor 113 and the gate of the transistor 101. The reset signal (R) is input to a gate of the transistor 114.

The power supply potential VDD is applied to one of a source and a drain of the transistor 115, and the other of the source and the drain of the transistor 115 is electrically connected to the gate of the transistor 104. The reset signal (R) is input to a gate of the transistor 115.

The power supply potential VSS is applied to one of a source and a drain of the transistor 116, and the other of the source and the drain of the transistor 116 is electrically connected to the other of the source and the drain of the transistor 115, the gate of the transistor 102, and the gate of the transistor 104. The set signal (S) is input to a gate of the transistor 116.

Note that a potential difference between a high-level potential of the clock signal (CK) and the power supply potential VSS is preferably, for example, higher than the threshold voltage of the transistor 103. With such a structure, when the potential of the clock signal (CK) is a high-level potential, the transistor 106 can be surely turned on. In addition, a potential difference between a low-level potential of the clock signal (CK) and the power supply potential VSS is preferably, for example, lower than the threshold voltage of the transistor 102. For example, the low-level potential of the clock signal (CK) may be equal to the power supply potential VSS. With such a structure, the transistor 102 can be surely turned off when the power supply potential VSS is applied to the gate of the transistor 102.

The high-level potential of the clock signal (CK) is lower than the power supply potential VDD. With such a structure, stress applied to the transistor 101 can be reduced.

The lower limit of the high-level clock signal (CK) is described. In the case of employing a bootstrap method, the amount of change in potential of a pulse signal output is the sum of the amount of change in potential by a signal and the amount of change in potential by capacitive coupling of a source (VDD−VSS). At this time, the amount of change in potential by a signal is ideally equal to the amount of change in potential by capacitive coupling of a source; thus, the lower limit of the amplitude of the clock signal (CK) is preferably approximately (VDD−VSS)/2, and the high-level potential of the clock signal (CK) is preferably higher than or equal to (VDD+VSS)/2. However, the actual potential of the output end (OUT) is decreased by the threshold voltages of the transistors 103 and 106. Thus, when each of the threshold voltages of the transistors 101 to 106 is denoted by VthN, the lower limit of the amplitude of the clock signal (CK) is approximately (VDD−VSS)/2+2VthN, and the lower limit of the high-level potential of the clock signal (CK) is approximately (VDD+VSS)/2+2VthN. Accordingly, the high-level potential of the clock signal (CK) is preferably higher than or equal to (VDD+VSS)/2+2VthN and lower than VDD.

In the case where the plurality of pulse output circuits SR in FIG. 2B are used to constitute the shift register in FIG. 1C, a potential difference between the power supply potential VSS and the high-level potential of the clock signal (CLK/CLKB) or the start pulse (SP) is preferably higher than the threshold voltage of the transistor 103, for example. A potential difference between the power supply potential VSS and the low-level potential of the clock signal (CLK/CLKB) or the start pulse (SP) is preferably lower than the threshold voltage of the transistor 102, for example. In addition, the high-level potential of the clock signal (CLK/CLKB) or the start pulse (SP) is preferably lower than the power supply potential VDD, more preferably higher than or equal to (VDD+VSS)/2+2VthN and lower than VDD. Note that the high-level potential of the start pulse signal (SP) is not necessarily lower than the power supply potential VDD.

Next, an example of a method for driving the pulse output circuit SR in FIG. 2B is described with reference to a timing chart in FIG. 2C. Here, the power supply potential VDD is a positive power supply potential, the power supply potential VSS is a negative power supply potential, and the transistors 101 to 106 are n-channel transistors.

In the example of the method for driving the pulse output circuit SR in FIG. 2B, a pulse of the set signal (S) is input in a first period 151. Note that the potentials of the reset signal (R) and the clock signal (CK) are low.

At this time, the transistors 113 and 116 are turned on, and the node α is charged through the transistor 113. Note that the transistors 102, 104, 105, 106, 114, and 115 are off. When the transistor 113 is turned on, the node α is charged to a potential obtained by subtraction of the threshold voltage VthN of the transistor 113 from the power supply potential VDD. After the node α is charged to the above potential, the gate-source voltage of the transistor 113 becomes lower than VthN, so that the transistor 113 is turned off. At this time, the node α becomes floating, and the potential of the node α is held. Thus, the pulse output circuit is set in a set state. At this time, the clock signal (CLK) is at a low level; thus, a pulse signal output through the output end (OUT) is at a low level, and the pulse output circuit SR is set in a set state.

Figure 2C:
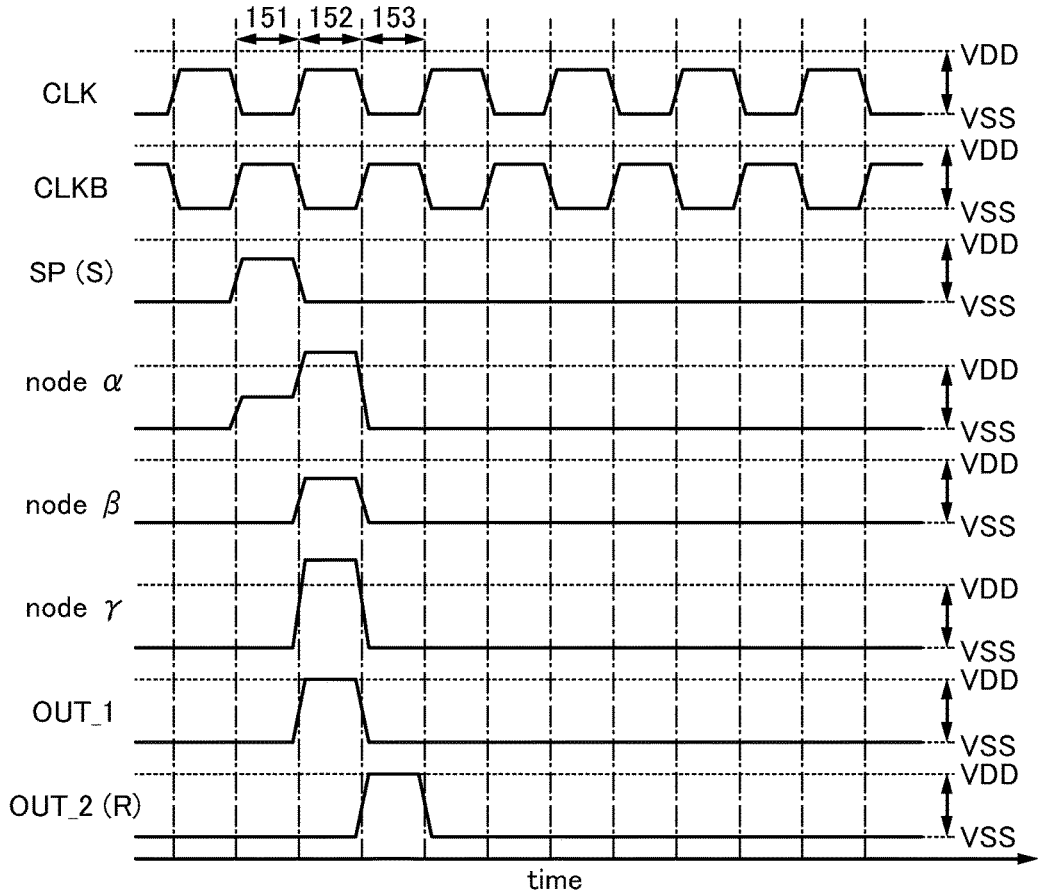
FIG. 2C is a timing chart.

For example, in the case of the shift register in FIG. 1C, when the pulse of the start pulse signal (SP) is input as in the first period 151 in FIG. 2C, the node α of the first pulse output circuit SR_1 is charged and then becomes floating.

Then, in a second period 152, the potential of the clock signal (CK) becomes high. At this time, the potentials of the set signal (S) and the reset signal (R) are low.

In the first period 151, the node α is charged and the transistor 101 is on; thus, when the potential of the clock signal (CK) becomes high, the node β is charged. Note that the transistors 102, 104, 105, 113, 114, 115, and 116 are off.

As the potential of the node β is increased, the potential of the node α that is floating is further increased by a bootstrap effect. The potential of the node α is eventually higher than the high level of the clock signal (CK) by at least VthN; thus, the potential of the node β is charged to a potential that is equal to the high-level potential of the clock signal (CK). Further, as the potential of the node β is increased, the transistor 106 is turned on and the node γ is charged. At this time, the node γ is charged to a potential that is lower than the potential of the node β by VthN, and the gate-source voltage of the transistor 106 becomes lower than VthN, so that the transistor 106 is turned off. At this time, the node γ becomes floating and the potential of the node γ is held.

When the potential of the node γ is increased, the transistor 103 is turned on and the output end (OUT) is charged, so that the potential of the output end (OUT) starts to increase. Under this condition, the potential of the output end (OUT) can be increased to only a potential that is lower than the potential of the node γ by VthN. However, as the potential of the output end (OUT) is increased, the potential of the node γ that is floating is also further increased by a bootstrap effect. When the potential of the node γ is eventually higher than the power supply potential VDD by at least VthN, the potential of the output end (OUT) is charged to VDD, and a pulse signal becomes high.

For example, in the case of the shift register in FIG. 1C, when the clock signal (CK) becomes high as in the second period 152 in FIG. 2C, the potential of the node α of the first pulse output circuit SR_1 is increased by a bootstrap effect, and the potential of the node β of the first pulse output circuit SR_1 is charged to a potential that is equal to the high level of the clock signal (CK). In addition, the potential of the node γ of the first pulse output circuit SR_1 increases and then becomes floating. At this time, as the potential of the output end (OUT) is increased, the potential of the node γ of the first pulse output circuit SR_1 is charged to a potential that is higher than the power supply potential VDD by a bootstrap effect. Then, when the potential of the node γ is higher than the power supply potential VDD by at least VthN, the potential of the output end (OUT) is charged to a potential that is equal to the power supply potential VDD. Thus, the pulse of a pulse signal is output from the first pulse output circuit SR_1.

The pulse of the pulse signal that is output from the first pulse output circuit SR_1 is the pulse of a set signal in the second pulse output circuit SR_2. In this manner, the pulse output circuits SR after the second stage sequentially output pulses in accordance with pulses of pulse signals input from the pulse output circuits SR in the previous stages like the first pulse output circuit SR_1.

In a third period 153, the pulse of the reset signal (R) is input. At this time, the potentials of the set signal (S) and the clock signal (CK) are low.

When the pulse of the reset signal (R) is input, the transistors 105, 114, and 115 are turned on, so that the transistors 102 and 104 are turned on. Note that the transistors 113 and 116 are off.

At this time, the potentials of the nodes α, β, and γ and the output end (OUT) become low. Thus, the pulse output circuit SR is set in a reset state.

In the case of the shift register in FIG. 1C, the pulse of a pulse signal that is output from the second pulse output circuit SR_2 is input to the first pulse output circuit SR_1 as the reset signal (R) as in the third period 153 in FIG. 2C. At this time, the potentials of the nodes α, β, and γ and the output end (OUT) of the first pulse output circuit SR_1 become low.

Similarly, the pulse of a pulse signal output from the third pulse output circuit SR_3 is the reset signal (R) of the second pulse output circuit SR_2. In this manner, the pulse output circuits SR after the second stage are set in a reset state in accordance with pulse signals input from the pulse output circuits SR in the subsequent stages like the first pulse output circuit SR_1.

The above is the description of the example of the method for driving the pulse output circuit SR in FIG. 2B.

Note that the structure of the pulse output circuit SR in this embodiment is not limited to the above structure.

Figures 1, 3A:
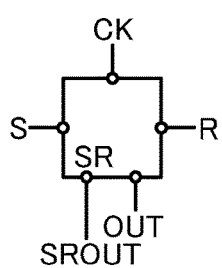
FIGS. 3A-1, 3A-2, and 3B illustrate a structure of a pulse output circuit.

For example, as illustrated in FIG. 3A-1, the pulse output circuit SR in FIG. 1A may also output a second pulse signal. At this time, the high-level potential of the second pulse signal is lower than the power supply potential VDD.

Figures 2, 3A:
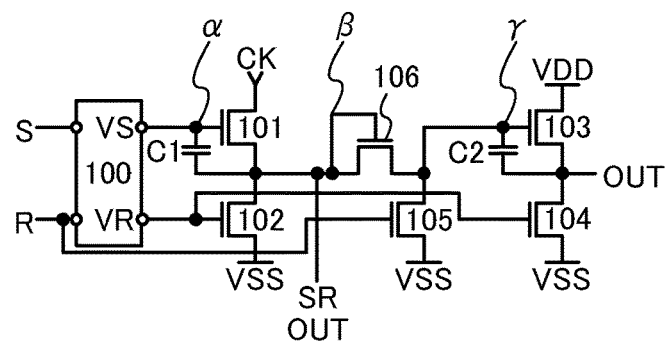

The pulse output circuit SR in FIG. 3A-1 has such a structure as to output the potential of the other of the source and the drain of the transistor 101 through an output end (SROUT) as the second pulse signal as illustrated in FIG. 3A-2, in addition to the structure in FIG. 2A. Thus, a pulse signal whose high-level potential is lower than a power supply potential can be generated and output.

Figure 3B:
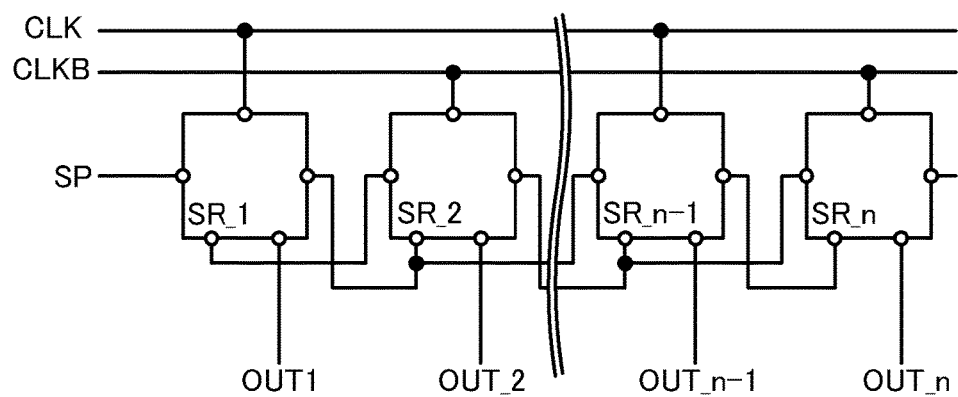

The plurality of pulse output circuits SR in FIG. 3A-2 (pulse output circuits SR_1 to SR_n) are used to constitute a shift register in FIG. 3B. In FIG. 3B, n is 4 or more. At this time, the start pulse signal (SP) is input to the pulse output circuit SR_1 as the set signal (S). A second pulse signal output from the output end (SROUT) of a pulse output circuit SR_k−1 (k is a natural number of 2 or more) is input to a pulse output circuit SR_k as the set signal (S). A second pulse signal output from the output end (SROUT) of the pulse output circuit SR_k is input to the pulse output circuit SR_k−1 as the reset signal (R). The clock signal CLK is input to pulse output circuits SR in odd-numbered stages as the clock signal (CK). The clock signal CLKB is input to pulse output circuits SR in even-numbered stages as the clock signal (CK). In the shift register in FIG. 3B, pulse signals are output through output ends (OUT_1 to OUT_n) of the pulse output circuits SR_1 to SR_n.

Figure 4:
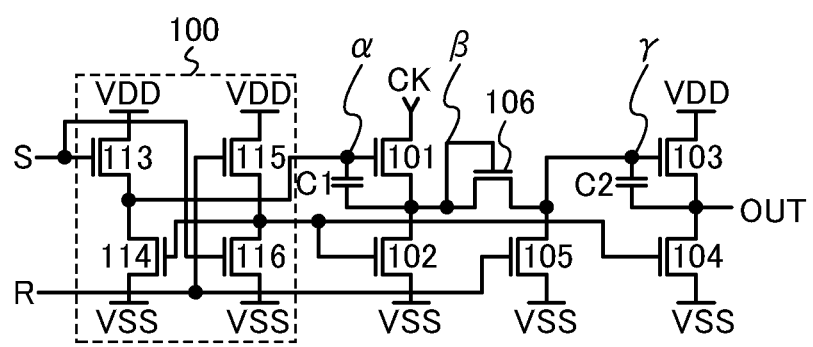
FIG. 4 illustrates a structure of a pulse output circuit.

Further, this embodiment is not limited to the above structure. For example, as illustrated in FIG. 4, instead of inputting the reset signal (R) to the gate of the transistor 114 in the pulse output circuit SR in FIG. 2B, the gate of the transistor 114 may be electrically connected to the other of the source and the drain of the transistor 115. Thus, the potential of the gate of the transistor 114 can be held.

The above is the description of the example of the pulse output circuit SR in this embodiment.

As described with reference to FIGS. 1A to 1C, FIGS. 2A to 2C, FIGS. 3A-1, 3A-2, and 3B, and FIG. 4, in the example of the pulse output circuit SR in this embodiment, at least the high-level potential of a clock signal is made lower than a high supply potential. Thus, it is possible to reduce the amount of change in potential of one of the source and the drain of the transistor 101 at the time when the transistor 101 is off that is a cause of deterioration of the transistor.

In the example of the pulse output circuit SR in this embodiment, the use of the transistors 103 to 106 can adjust the amplitude of the potential of the other of the source and the drain of the transistor 101. Thus, a pulse signal whose high-level potential is equal to the power supply potential VDD can be generated, and a decrease in high-level potential of a pulse signal output can be reduced. Consequently, the amplitude of a pulse signal output from the pulse output circuit SR or the amplitude of a pulse signal output from a driver circuit including the pulse output circuit SR can be set to a desired amplitude.

In addition, in a semiconductor device according to one embodiment of the present invention, in addition to the above structure, a transistor used in the pulse output circuit SR may include a pair of gates with a semiconductor film positioned therebetween.

When one of the pair of gates is regarded as a back gate, the back gate may be floating or may be supplied with a potential from another element. In the latter case, potentials at the same level may be applied to a normal gate and the back gate, or a fixed potential such as a ground potential may be applied only to the back gate. By controlling the potential applied to the back gate, the threshold voltage of the transistor can be controlled. By providing the back gate, a channel formation region is enlarged and drain current can be increased. Further, provision of the back gate facilitates formation of a depletion layer in the semiconductor film, which results in lower subthreshold swing.

In the semiconductor device according to one embodiment of the present invention, deterioration of electrical characteristics, such as a shift in threshold voltage, can be inhibited as described above. Even when the threshold voltage of a transistor is shifted, it is possible to set the threshold voltage of the transistor to a desired level by controlling a potential applied to a back gate. Accordingly, by controlling the threshold voltage using a back gate, the reliability of the semiconductor device can be further increased.

Note that the direction of a shift in threshold voltage of a transistor used in the pulse output circuit SR varies depending on the relation between the level of a potential applied to a gate and the level of a potential applied to a source or a drain at the time of operation. Specifically, as a period during which the transistor operates in a condition where a potential applied to one of the source and the drain is higher than the potential of the gate becomes longer, the threshold voltage of the transistor tends to be shifted in a negative direction. Further, as a period during which the transistor operates in a condition where a potential applied to one of the source and the drain is lower than the potential of the gate becomes longer, the threshold voltage of the transistor tends to be shifted in a positive direction.

In the case of the pulse output circuit SR in FIG. 1B, a period during which each of the transistors 101 and 103 operates in a condition where a potential applied to one of the source and the drain is higher than the potential of the gate is long; thus, electrical characteristics of each transistor tend to deteriorate in such a manner that the threshold voltage is shifted in a negative direction. In addition, in the case of the pulse output circuit SR in FIG. 1B, a period during which each of the transistors 102, 104, and 105 operates in a condition where a potential applied to one of the source and the drain is lower than the potential of the gate is long; thus, electrical characteristics of each transistor tend to deteriorate in such a manner that the threshold voltage is shifted in a positive direction.

Thus, in the semiconductor device according to one embodiment of the present invention, the pulse output circuit SR may have a structure where a back gate of a transistor whose threshold voltage tends to be shifted in a negative direction is electrically isolated from a back gate of a transistor whose threshold voltage tends to be shifted in a positive direction. Back gates of transistors whose threshold voltages tend to be shifted in a negative direction may be electrically connected to each other. Further, back gates of transistors whose threshold voltages tend to be shifted in a positive direction may be electrically connected to each other.

Figure 5A:
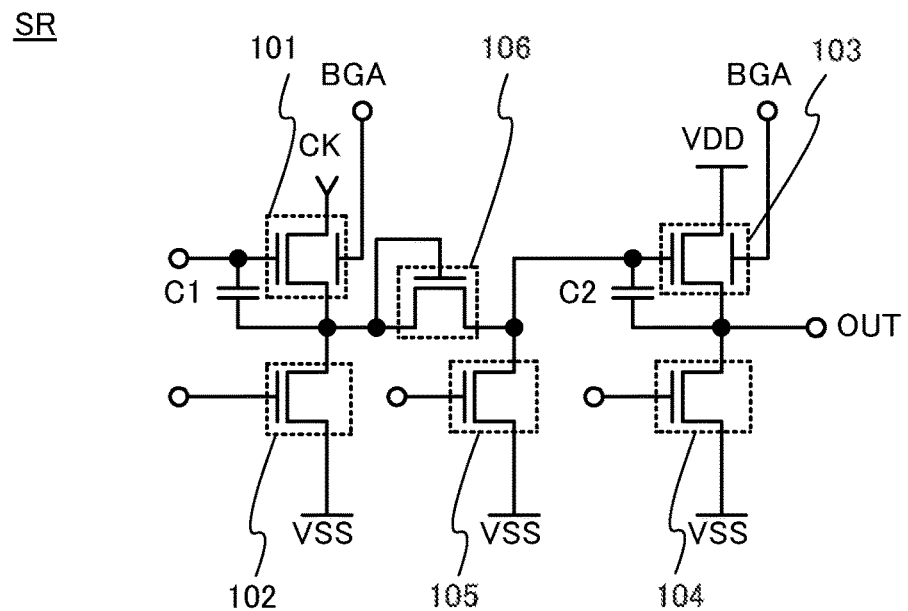
FIGS. 5A and 5B each illustrate a structure of a pulse output circuit.

FIG. 5A illustrates a structure example of a pulse output circuit SR in which a potential BGA is applied to a back gate of a transistor whose threshold voltage tends to be shifted in a negative direction. In the pulse output circuit SR in FIG. 5A, the potential BGA is applied to back gates of the transistors 101 and 103 whose threshold voltages tend to be shifted in a negative direction. Note that in FIG. 5A, the back gate of the transistor 101 may be electrically connected to the back gate of the transistor 103.

It is preferable to use, as the potential BGA, for example, the power supply potential VSS that is the lowest potential in the pulse output circuit SR and is equal to the low level of a control signal; however, the potential BGA may be lower than the power supply potential VSS. When a potential that is lower than the potential of a gate (also referred to as a front gate) is applied to a back gate, the threshold voltages of the transistors 101 and 103 are shifted in a positive direction, and the amount of shift in threshold voltage becomes larger as the potential BGA applied to the back gate becomes lower. Thus, even when the threshold voltages of the transistors 101 and 103 are shifted in a negative direction due to deterioration of electrical characteristics, by controlling the level of the potential BGA, the threshold voltages shifted in a negative direction can be shifted back in a positive direction, and the reliability of the semiconductor device can be increased.

Figure 5B:
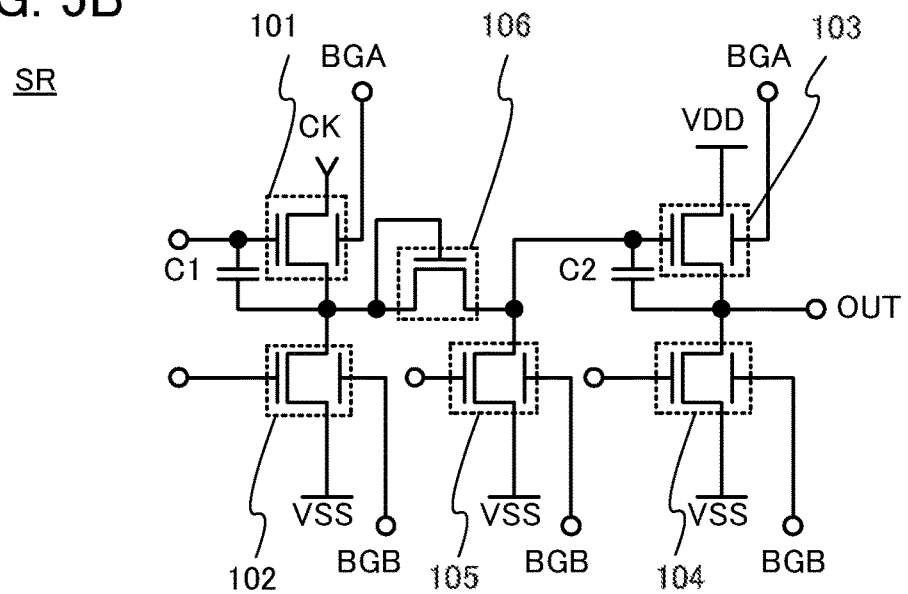

Next, FIG. 5B illustrates a structure example of a pulse output circuit SR that has a structure in which a potential BGB is applied to a back gate of a transistor whose threshold voltage tends to be shifted in a positive direction, in addition to the structure of the pulse output circuit SR in FIG. 5A. In the pulse output circuit SR in FIG. 5B, like the pulse output circuit SR in FIG. 5A, the potential BGA is applied to the back gates of the transistors 101 and 103 whose threshold voltages tend to be shifted in a negative direction. In the pulse output circuit SR in FIG. 5B, the potential BGB is applied to the back gates of the transistors 102, 104, and 105 whose threshold voltages tend to be shifted in a positive direction. Note that in FIG. 5B, the back gates of at least two of the transistors 102, 104, and 105 may be electrically connected to each other.

It is preferable to use, as the potential BGB, for example, a potential that is a high potential in the pulse output circuit SR and is equal to the high level of a control signal or the power supply potential VDD; however, the potential BGB may be higher than the potential that is equal to the high level of a control signal or the power supply potential VDD. When a potential that is higher than the potential of a front gate is applied to a back gate, the threshold voltages of the transistors 102, 104, and 105 are shifted in a negative direction, and the amount of shift in threshold voltage becomes larger as the potential BGB applied to the back gate becomes higher. Thus, even when the threshold voltages of the transistors 102, 104, and 105 are shifted in a positive direction due to deterioration of electrical characteristics, by controlling the level of the potential BGB, the threshold voltages shifted in a positive direction can be shifted back in a negative direction, and the reliability of the semiconductor device can be increased.

Note that in FIG. 5B, the transistors whose threshold voltages tend to be shifted in a negative direction include back gates, and the transistors whose threshold voltages tend to be shifted in a positive direction include back gates; however, it is possible to employ a structure where the transistors whose threshold voltages tend to be shifted in a negative direction do not include back gates and the transistors whose threshold voltages tend to be shifted in a positive direction include back gates.

Among the transistors whose threshold voltages tend to be shifted in a negative direction, the transistor whose electrical characteristics deteriorate greatly and whose threshold voltage is shifted greatly may be controlled so that the threshold voltage is adjusted by controlling the potential of the back gate. Alternatively, among the transistors whose threshold voltages tend to be shifted in a positive direction, the transistor whose electrical characteristics deteriorate greatly and whose threshold voltage is shifted greatly may be controlled so that the threshold voltage is adjusted by controlling the potential of the back gate.

A conductive film functioning as a back gate may be formed over the same layer as a conductive film functioning as an electrode of a display element in a pixel. In the case where the conductive film functioning as a back gate is formed over the same layer as the conductive film functioning as an electrode of a display element, the two conductive films can be formed by patterning one conductive film into a desired shape by etching or the like. Accordingly, the conductive film functioning as a back gate can be formed without an increase in steps of manufacturing a semiconductor device.

Figure 6A:
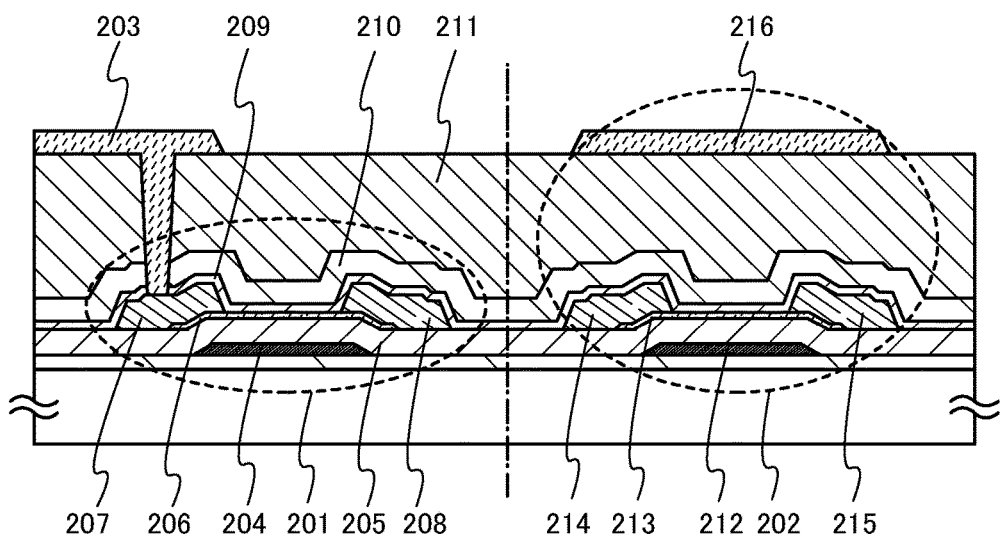
FIGS. 6A and 6B each illustrate a cross-sectional structure of a semiconductor device.

FIG. 6A illustrates an example of a cross-sectional structure of a transistor 201 provided in a pixel, a conductive film 203 connected to the transistor 201, and a transistor 202 provided in a driver circuit.

The transistor 201 in FIG. 6A includes a conductive film 204 that is provided over an insulating surface and functions as a gate, an insulating film 205 over the conductive film 204, a semiconductor film 206 that overlaps with the conductive film 204 over the insulating film 205, and conductive films 207 and 208 that are provided over the semiconductor film 206 and function as a source and a drain. In FIG. 6A, insulating films 209 and 210 are sequentially stacked over the semiconductor film 206 and the conductive films 207 and 208. The transistor 201 may include the insulating films 209 and 210 as components.

An insulating film 211 formed using a resin is provided over the insulating films 209 and 210. An opening is provided in the insulating films 209, 210, and 211, and the conductive film 203 that is connected to the conductive film 207 through the opening is provided over the insulating film 211. The conductive film 203 functions as an electrode of a display element.

For example, a liquid crystal element includes a pair of electrodes and a liquid crystal layer to which an electric field is applied by the pair of electrodes. Thus, in the case where the display element is a liquid crystal element, in addition to the conductive film 203 functioning as one of the pair of electrodes, a liquid crystal layer and a conductive film functioning as the other of the pair of electrodes may be provided over the insulating film 211.

Examples of a light-emitting element include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers provided between the anode and the cathode, at least one of which is a light-emitting layer containing a light-emitting substance. When the display element is an OLED, in addition to the conductive film 203 functioning as one of an anode and a cathode, an EL layer and a conductive film functioning as the other of the anode the cathode and may be provided over the insulating film 211.

From the EL layer, electroluminescence is obtained by current supplied when a potential difference between the cathode and the anode is higher than or equal to the threshold voltage Vthe of the light-emitting element. Electroluminescence includes luminescence (fluorescence) at the time of returning from a singlet-excited state to a ground state and luminescence (phosphorescence) at the time of returning from a triplet-excited state to a ground state.

The use of a resin for the insulating film 211 can prevent generation of unevenness on a surface where the conductive film 203 is formed, that is, can increase the flatness of the surface where the conductive film 203 is formed.

Specifically, an organic material such as an acrylic resin, an epoxy resin, a benzocyclobutene-based resin, polyimide, or polyamide can be used for the insulating film 211. As an alternative to the organic material, it is possible to use a silicone resin or the like. Note that the insulating film 211 having higher flatness can be formed by stacking a plurality of insulating films formed using these materials.

The transistor 202 in FIG. 6A includes a conductive film 212 that is provided over an insulating surface and functions as a gate, the insulating film 205 over the conductive film 212, a semiconductor film 213 that overlaps with the conductive film 212 over the insulating film 205, and conductive films 214 and 215 that are provided over the semiconductor film 213 and function as a source and a drain. The transistor 202 in FIG. 6A further includes the insulating films 209 and 210 that are sequentially stacked over the semiconductor film 213 and the conductive films 214 and 215, and the insulating film 211 over the insulating films 209 and 210. The transistor 202 further includes the conductive film 216 that functions as a back gate over the insulating films 209, 210, and 211 to overlap with the semiconductor film 213.

Note that in FIG. 6A, the conductive film 216 functioning as the back gate of the transistor 202 included in the driver circuit is formed over the insulating film 211 together with the conductive film 203 functioning as the electrode of the display element in the pixel. Thus, the conductive film 203 and the conductive film 216 can be formed by processing one conductive film into a desired shape by etching or the like. Accordingly, the conductive film 216 functioning as the back gate can be provided without an increase in steps of manufacturing a semiconductor device.

Specifically, for the conductive film 203 and a conductive film 216, any of indium oxide, indium oxide-tin oxide (indium tin oxide (ITO)), indium oxide-tin oxide containing silicon or silicon oxide, indium oxide-zinc oxide (indium zinc oxide), indium oxide containing tungsten oxide and zinc oxide, an Al—Zn-based oxide semiconductor containing nitrogen, a Zn-based oxide semiconductor containing nitrogen, a Sn—Zn-based oxide semiconductor containing nitrogen, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. Other examples are elements that belong to Group 1 or 2 in the periodic table, for example, an alkali metal such as lithium (Li) or cesium (Cs) and an alkaline earth metal such as magnesium (Mg), calcium (Ca), or strontium (Sr), an alloy containing such an element (e.g., MgAg or AlLi), a rare earth metal such as europium (Eu) or ytterbium (Yb), and an alloy containing such an element. Note that each of the conductive film 203 and the conductive film 216 can be formed in such a manner that, for example, a conductive film is formed using the above material by sputtering or vapor deposition (including vacuum vapor deposition), and then the conductive film is processed into a desired shape by etching through a photolithography process.

In FIG. 6A, the insulating films 209 and 210 are provided between the semiconductor films 206 and 213 and the insulating film 211. However, the number of insulating films provided between the semiconductor films 206 and 213 and the insulating film 211 may be one, or may be three or more.

The insulating film 210 preferably contains oxygen at a proportion higher than or equal to the stoichiometric composition and has a function of supplying part of oxygen to the semiconductor film 206 by heating. In addition, the insulating film 210 preferably has a few defects, typically, the spin density derived from a signal that appears at g=2.001 due to a dangling bond of silicon is $1\times10^{18}$ spins/cm$^3$ or lower when measured by ESR. Note that in the case where the semiconductor film 206 is damaged at the time of formation of the insulating film 210 when the insulating film 210 is directly formed on the semiconductor films 206 and 213, the insulating film 209 is preferably provided between the semiconductor films 206 and 213 and the insulating film 210, as illustrated in FIG. 6A. The insulating film 209 preferably causes little damage to the semiconductor film 206 when the insulating film 209 is formed compared to the case of the insulating film 210 and has a function of passing oxygen. If damage to the semiconductor films 206 and 213 can be reduced and the insulating film 210 can be formed directly on the semiconductor films 206 and 213, the insulating film 209 is not necessarily provided.

The insulating film 209 preferably has a few defects, typically, the spin density derived from a signal that appears at g=2.001 due to a dangling bond of silicon is $3\times10^{17}$ spins/cm$^3$ or lower when measured by ESR. This is because if the density of defects in the insulating film 209 is high, oxygen is bonded to the defects and the amount of oxygen that passes through the insulating film 209 is decreased.

Further, an interface between the insulating film 209 and the semiconductor films 206 and 213 preferably has a few defects, typically, the spin density of a signal that appears at g=1.93 due to oxygen vacancies in an oxide semiconductor used for the semiconductor films 206 and 213 is lower than or equal to $1\times10^{17}$ spins/cm$^3$, preferably lower than or equal to the measurement limit when measured by ESR where a magnetic field is applied parallel to a film surface.

Figure 6B:
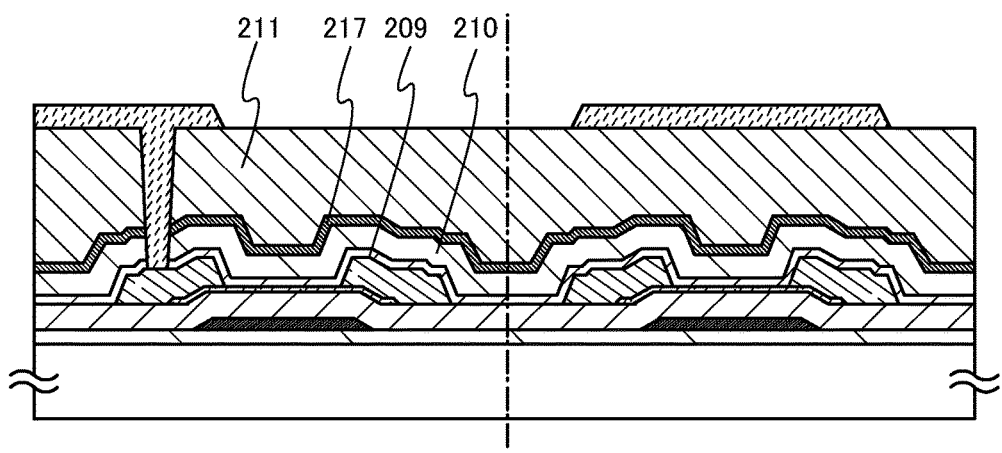

Next, FIG. 6B illustrates a cross-sectional structure of the transistor 201, the conductive film 203 connected to the transistor 201, and the transistor 202 where an insulating film 217 is further provided between the insulating films 210 and 211 in the cross-sectional structure in FIG. 6A. The insulating film 217 preferably has an effect of blocking diffusion of oxygen, hydrogen, and water. Alternatively, the insulating film 217 preferably has an effect of blocking diffusion of hydrogen and water.

As an insulating film has higher density and becomes denser or has a fewer dangling bonds and becomes more chemically stable, the insulating film has a higher blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 217 has an effect of blocking diffusion of water, hydrogen, and the like, impurities such as water and hydrogen that exist in the insulating film 211 formed using a resin or exist outside the panel can be prevented from entering the semiconductor film 206 or 213. In the case where an oxide semiconductor is used for the semiconductor film 206 or 213, part of water or hydrogen entering the oxide semiconductor serves as an electron donor (donor). Thus, the use of the insulating film 217 having the blocking effect can prevent shifts in threshold voltages of the transistors 201 and 202 due to generation of donors.

In addition, in the case where an oxide semiconductor is used for the semiconductor film 206 or 213, when the insulating film 217 has an effect of blocking diffusion of oxygen, diffusion of oxygen from the oxide semiconductor into the outside can be prevented. Accordingly, oxygen vacancies in the oxide semiconductor that serve as donors are reduced, so that shifts in threshold voltages of the transistors 201 and 202 due to generation of donors can be prevented.

In the case where adhesion of the insulating films 217 and 211 is higher than that of the insulating films 210 and 211, the use of the insulating film 217 can prevent separation of the insulating film 211.

In one embodiment of the present invention, a conductive film functioning as a back gate may be connected to a node to which a ground potential is applied, and the conductive film may be used as a discharge path for electric charge accumulated in the insulating film 211. When the discharge path for electric charge accumulated in the insulating film 211 is secured, it is possible to prevent a shift in threshold voltage of the transistor provided below the insulating film 211 due to accumulation of the electric charge.

Figure 7A:
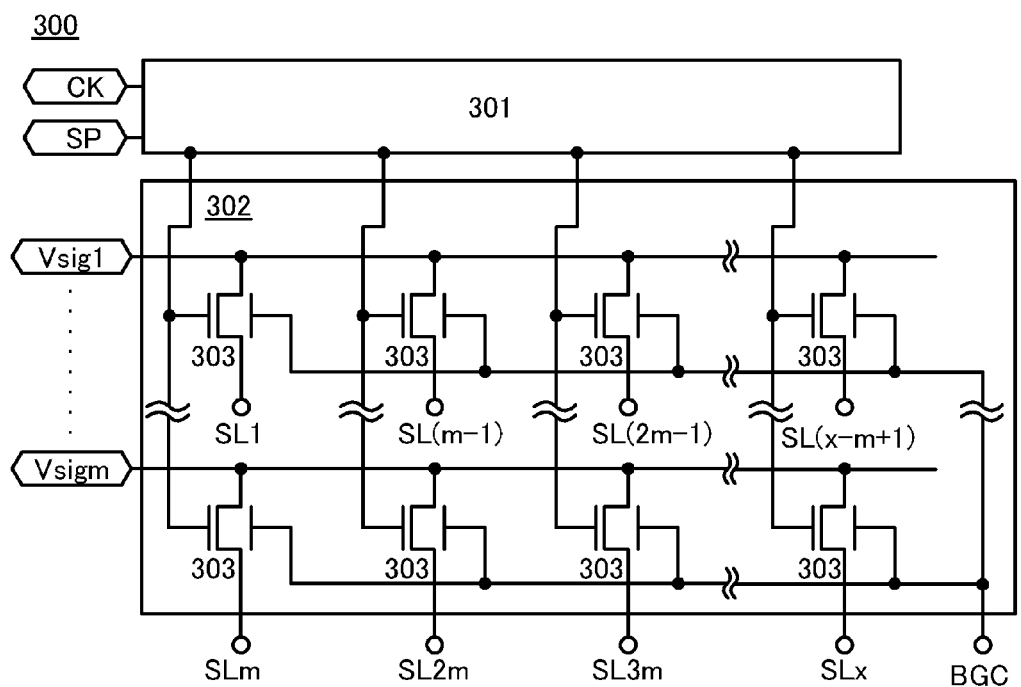
FIGS. 7A and 7B each illustrate a structure of a signal line driver circuit.

FIG. 7A illustrates a structure example of a signal line driver circuit 300 that includes transistors each having a back gate. The signal line driver circuit 300 in FIG. 7A includes a shift register 301 generating pulse signals in response to the clock signal CK and the start pulse signal SP and a switch group 302 sampling image signals in response to pulse signals output from the shift register 301.

Note that the shift register 301 is used in the signal line driver circuit 300 in FIG. 7A; however, a circuit controlling timing of sampling image signals can be used instead of the shift register 301. In the signal line driver circuit 300 in FIG. 7A, pulse signals output from the shift register 301 are directly input to the switch group 302; however, pulse signals output from the shift register 301 may be input to the switch group 302 through a buffer, a level shifter having a function of adjusting the amplitudes of pulse signals output from the shift register 301, or the like.

In FIG. 7A, a plurality of pulse signals are sequentially output from the shift register 301, and the switch group 302 includes a plurality of switches that are turned on or off in response to the plurality of pulse signals output from the shift register 301. Specifically, in FIG. 7A, transistors 303 each having a back gate are used as the switches.

The plurality of pulse signals output from the shift register 301 each correspond to m transistors 303. In other words, the potential of one pulse signal is applied to gates of the m transistors 303, and the m transistors 303 are concurrently turned on or off in response to the potential. When the m transistors 303 are on, m (m is a natural number) image signals Vsig1 to Vsigm are input to signal lines SL1 to SLm through the m transistors 303. In FIG. 7A, the image signals Vsig1 to Vsigm are input to signal lines SL1 to SLx (x is a natural number of m or more) through x transistors 303.

In FIG. 7A, a potential BGC is applied to a conductive film functioning as a back gate. In one embodiment of the present invention, by controlling the level of the potential BGC, the threshold voltage of the transistor 303 can be set to a desired level. When the potential BGC is set to a ground potential, the conductive film can function as a discharge path for electric charge accumulated in the insulating film 211.

Figure 7B:
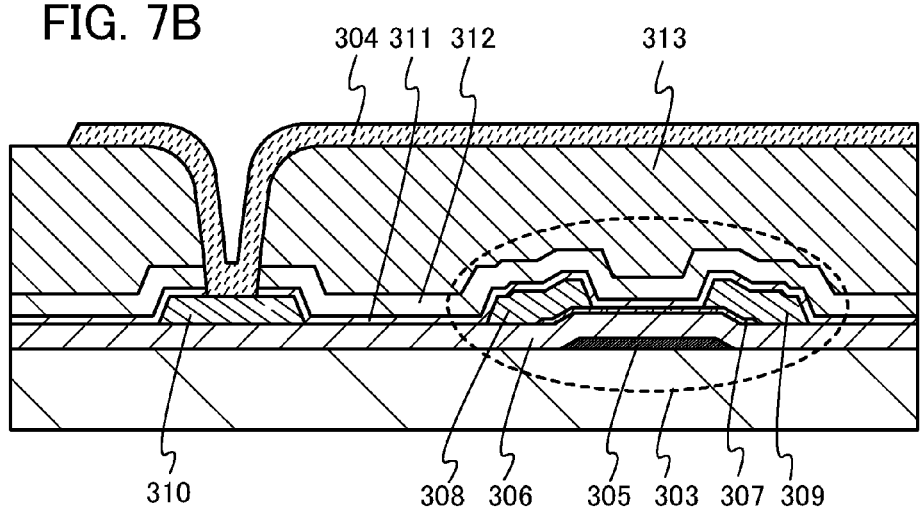

FIG. 7B illustrates a cross-sectional structure of the transistor 303 and a conductive film 304 functioning as a discharge path. The transistor 303 in FIG. 7B includes a conductive film 305 that is provided over an insulating surface and functions as a gate, an insulating film 306 over the conductive film 305, a semiconductor film 307 that overlaps with the conductive film 305 over the insulating film 306, and conductive films 308 and 309 that are provided over the semiconductor film 307 and function as a source and a drain. In addition, in FIG. 7B, a conductive film 310 is provided over the insulating film 306. Insulating films 311 and 312 are sequentially stacked over the semiconductor film 307 and the conductive films 308, 309, and 310, and an insulating film 313 is formed using a resin over the insulating films 311 and 312. The conductive film 304 functioning as a discharge path is provided over the insulating film 313.

Note that in the case where the conductive film 304 functions as a discharge path, the transistor 303 does not necessarily include the insulating films 311, 312, and 313 and the conductive film 304.

The insulating films 311, 312, and 313 have an opening, and the conductive films 310 and 304 are connected to each other over the insulating film 313 through the opening. Like the conductive film functioning as a back gate, one conductive film formed over the insulating film 313 is processed into a desired shape by etching or the like, so that the conductive film 304 can be formed together with a conductive film functioning as an electrode of a display element in a pixel. Thus, the conductive film 304 functioning as a discharge path can be provided without an increase in steps of manufacturing a semiconductor device.

Note that in the case where the conductive film 304 functions as a discharge path, it is preferable to increase the area of the conductive film 304 provided over the insulating film 311 because electric charge accumulated in the insulating film 311 can be discharged with higher efficiency.

Provision of the conductive film 304 functioning as a discharge path can prevent a shift in threshold voltage of the transistor 303 provided below the insulating film 211 due to accumulation of the electric charge. Thus, the above structure can further increase the reliability of the semiconductor device.

Note that in FIGS. 7A and 7B, the conductive film 304 functioning as a back gate or a discharge path is provided over the switch group 302 of the signal line driver circuit 300; however, in one embodiment of the present invention, the conductive film 304 functioning as a back gate or a discharge path may be provided over a scan line driver circuit or a pulse output circuit SR included in the scan line driver circuit.

Figure 8A:
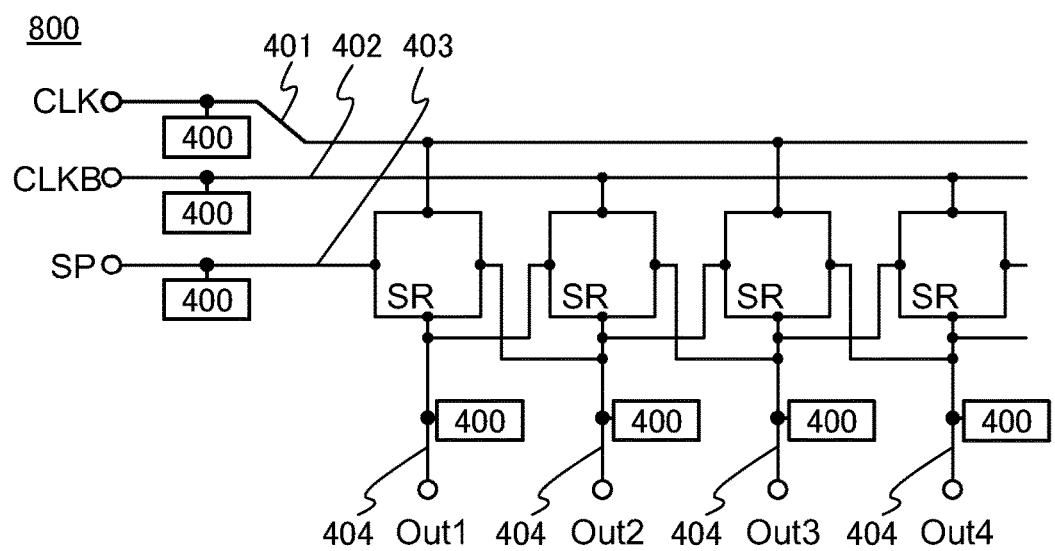
FIG. 8A illustrates a structure of a driver circuit.

Next, the structure of a driver circuit such as a signal line driver circuit or a scan line driver circuit provided with a protection circuit is described. The protection circuit has a function of discharging electric charge accumulated in an insulating film or the like so that the electric charge is prevented from being discharged around a semiconductor element such as a transistor included in a driver circuit. FIG. 8A illustrates a structure example of a driver circuit 800 including a protection circuit.

The driver circuit 800 includes the plurality of pulse output circuits SR according to one embodiment of the present invention, and the clock signal CLK, the clock signal CLKB that is obtained by inversion of the polarity of the clock signal, and the start pulse signal SP are input to the pulse output circuit SR through a wiring 401, a wiring 402, and a wiring 403, respectively. In FIG. 8A, protection circuits 400 are connected to the wiring 401, the wiring 402, and the wiring 403.

Pulse signals output from the plurality of pulse output circuits SR are input to subsequent circuits through a plurality of wirings 404. In FIG. 8A, the protection circuits 400 are connected to the plurality of wirings 404.

However, in the case where a different circuit such as a level shifter, a buffer, or a switch group is provided between the pulse output circuit SR and a pixel portion, the protection circuits 400 may be connected to wirings to which signals output from the different circuit are input.

Figure 8B:
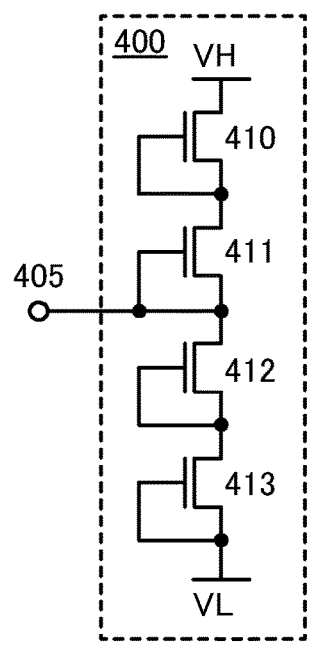
FIG. 8B illustrates a structure of a protection circuit.

Then, FIG. 8B illustrates a specific structure example of the protection circuit 400. The protection circuit 400 in FIG. 8B includes n-channel transistors 410 to 413. One of a source and a drain of the transistor 410 is connected to a gate of the transistor 410. One of a source and a drain of the transistor 411 is connected to a gate of the transistor 411. One of a source and a drain of the transistor 412 is connected to a gate of the transistor 412. One of a source and a drain of the transistor 413 is connected to a gate of the transistor 413. The other of the source and the drain of the transistor 410 is connected to a node to which a high-level potential VH is applied, and the gate of the transistor 410 is connected to the other of the source and the drain of the transistor 411. The gate of the transistor 411 is connected to a terminal 405 and the other of the source and the drain of the transistor 412. The gate of the transistor 412 is connected to the other of the source and the drain of the transistor 413. The gate of the transistor 413 is connected to a node to which a low-level potential VL is applied.

The terminal 405 is connected to one of the wirings (e.g., the wirings 401, 402, 403, and 404) in FIG. 8A.

When the transistors 410 to 413 are connected as described above, the transistors 410 and 411 are provided between the node to which the potential VH is applied and the terminal 405 as inversely bias-connected diodes, and the transistors 412 and 413 are provided between the terminal 405 and the node to which the potential VL is applied as inversely bias-connected diodes.

In one embodiment of the present invention, provision of the protection circuit can further increase the reliability of the semiconductor device.

Embodiment 2

In a semiconductor device according to one embodiment of the present invention, a transistor may include a channel formation region in a semiconductor film of amorphous, microcrystalline, polycrystalline, or single crystal silicon, germanium, or the like. Alternatively, the transistor may include a channel formation region in a semiconductor film whose bandgap is wider than that of silicon and whose intrinsic carrier density is lower than that of silicon. Any of the following can be used as silicon: amorphous silicon formed by sputtering or vapor deposition such as plasma-enhanced CVD; polycrystalline silicon obtained in such a manner that amorphous silicon is crystallized by laser annealing or the like; single crystal silicon obtained in such a manner that a surface portion of a single crystal silicon wafer is separated by implantation of hydrogen ions or the like into the silicon wafer; and the like.

A highly-purified oxide semiconductor (a purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly-purified oxide semiconductor film has extremely low off-state current and high reliability.

Specifically, various experiments can prove low off-state current of a transistor including a channel formation region in a highly-purified oxide semiconductor film. For example, even when an element has a channel width of $1 \times 10^6$ μm and a channel length of 10 μm, off-state current can be lower than or equal to the measurement limit of a semiconductor parameter analyzer, i.e., lower than or equal to $1 \times 10^{-13}$ A, at a voltage (drain voltage) between a source and a drain of 1 to 10 V. In that case, it can be seen that off-state current standardized on the channel width of the transistor is lower than or equal to 100 zA/μm. In addition, a capacitor and a transistor were connected to each other and off-state current was measured using a circuit in which electric charge flowing to or from the capacitor is controlled by the transistor. In the measurement, a highly-purified oxide semiconductor film was used in the channel formation region of the transistor, and the off-state current of the transistor was measured from a change in the amount of electric charge of the capacitor per unit hour. As a result, it can be seen that, in the case where the voltage between a source electrode and a drain electrode of the transistor is 3 V, a lower off-state current of several tens of yoctoamperes per micrometer is obtained. Accordingly, the transistor including the highly-purified oxide semiconductor film in the channel formation region has much lower off-state current than a crystalline silicon transistor.

Next, an example of a transistor including a channel formation region in an oxide semiconductor film is described with reference to drawings.

Figure 9A:
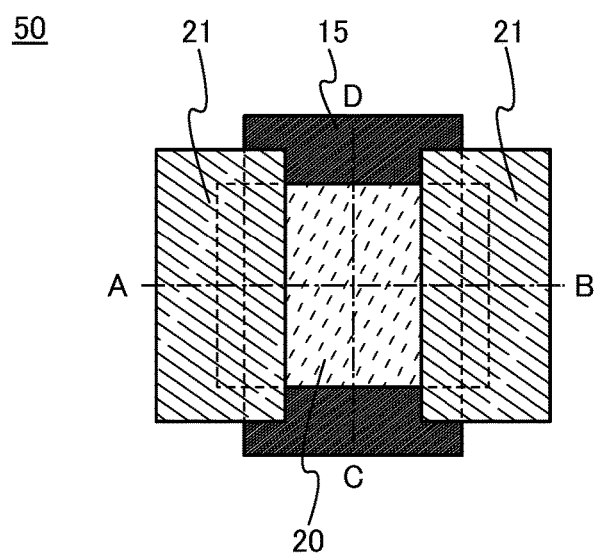
FIGS. 9A to 9C illustrate one aspect of a transistor.
Figure 9C:
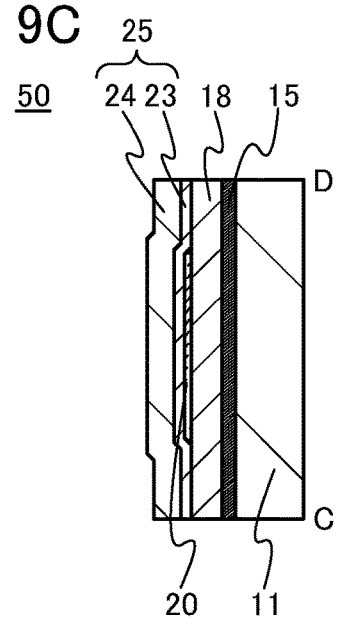
Figure 9B:
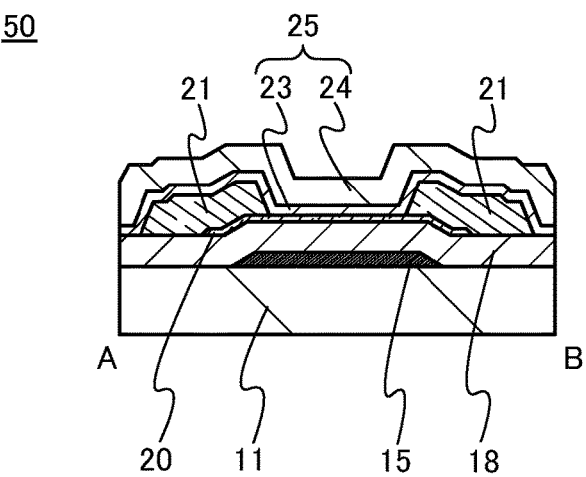

FIGS. 9A to 9C are a top view and cross-sectional views of a transistor 50 including a channel formation region in an oxide semiconductor film. FIG. 9A is a top view of the transistor 50, FIG. 9B is a cross-sectional view taken along dashed line A-B in FIG. 9A, and FIG. 9C is a cross-sectional view taken along dashed line C-D in FIG. 9A. Note that FIG. 9A does not illustrate some components of the transistor 50 (e.g., a substrate 11, an insulating film 18, an insulating film 23, and an insulating film 24) for clarity.

The transistor 50 in FIGS. 9B and 9C includes a conductive film 15 functioning as a gate over the substrate 11. The transistor 50 further includes the insulating film 18 over the substrate 11 and the conductive film 15, an oxide semiconductor film 20 that overlaps with the conductive film 15 with the insulating film 18 provided therebetween, and a pair of conductive films 21 that functions as a source and a drain and is in contact with the oxide semiconductor film 20. A protective film 25 including the insulating films 23 and 24 is formed over the insulating film 18, the oxide semiconductor film 20, and the pair of conductive films 21.

The insulating film 23 is formed to be in contact with the oxide semiconductor film 20 in the transistor 50 in this embodiment. The insulating film 23 is preferably an oxide insulating film passing oxygen. In that case, in the insulating film 23, not all oxygen entering the insulating film 23 from the outside does not move to the outside of the insulating film 23, and some oxygen may remain in the insulating film 23. Alternatively, oxygen enters the insulating film 23 and oxygen contained in the insulating film 23 moves to the outside of the insulating film 23, so that oxygen may move in the insulating film 23.

With the use of an oxide insulating film passing oxygen as the insulating film 23, oxygen released from an oxide insulating film that contains oxygen at a higher proportion than the stoichiometric composition and is provided over the insulating film 23 can move to the oxide semiconductor film 20 through the insulating film 23.

As the insulating film 23, a silicon oxide film, a silicon oxynitride film, or the like with a thickness of 5 to 150 nm, preferably 5 to 50 nm, more preferably 10 to 30 nm can be used.

The insulating film 24 is formed to be in contact with the insulating film 23. The insulating film 24 is preferably an oxide insulating film that contains oxygen at a higher proportion than the stoichiometric composition. In that case, as the insulating film 24, a silicon oxide film, a silicon oxynitride film, or the like with a thickness of 30 to 500 nm, preferably 150 to 400 nm can be used.

The oxide insulating film that contains oxygen at a higher proportion than the stoichiometric composition is an oxide insulating film from which part of oxygen is released by heating. Thus, when the oxide insulating film from which part of oxygen is released by heating is provided over the insulating film 23 passing oxygen as the insulating film 24, oxygen can move to the oxide semiconductor film 20 and oxygen vacancies in the oxide semiconductor film 20 can be compensated. Alternatively, when the insulating film 24 is formed over the insulating film 23 passing oxygen during heating, oxygen can move to the oxide semiconductor film 20 and oxygen vacancies in the oxide semiconductor film 20 can be compensated. Alternatively, when the insulating film 24 is formed over the insulating film 23 passing oxygen and is then heated, oxygen can move to the oxide semiconductor film 20 and oxygen vacancies in the oxide semiconductor film 20 can be compensated. Consequently, the amount of oxygen vacancies in the oxide semiconductor film can be reduced.

When the oxide insulating film that contains oxygen at a higher proportion than the stoichiometric composition is provided over a back channel of the oxide semiconductor film 20 (a surface of the oxide semiconductor film 20 that is opposite to a surface facing the conductive film 15) through the oxide insulating film passing oxygen, oxygen can move on the back channel side of the oxide semiconductor film 20, and oxygen vacancies on the back channel side can be reduced.

Note that in steps of forming the insulating film 24, when the oxide semiconductor film 20 is not damaged, it is possible not to provide the insulating film 23, and only the insulating film 24 that is an oxide insulating film from which part of oxygen is released by heating may be provided as the protective film.

Note that a transistor including an oxide semiconductor film is an n-channel transistor; thus, in this specification, a transistor that can be regarded as having no drain current flowing therein when gate voltage is 0 V is defined as a transistor having normally-off characteristics. In contrast, a transistor that can be regarded as having drain current flowing therein when gate voltage is 0 V is defined as a transistor having normally-on characteristics.

Other details of the transistor 50 are described below.

There is no particular limitation on a material and the like of the substrate 11 as long as the material has heat resistance high enough to withstand at least heat treatment performed later. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semi-conductor substrate made of silicon germanium or the like, an SOI substrate, or the like can be used. Alternatively, any of these substrates provided with a semiconductor element may be used as the substrate 11.

Alternatively, a flexible substrate may be used as the substrate 11, and the transistor 50 may be provided directly on the flexible substrate. Alternatively, a separation layer may be provided between the substrate 11 and the transistor 50. The separation layer can be used when part or all of a semiconductor device formed over the separation layer is completed and then separated from the substrate 11 and transferred to another substrate. In such a case, the transistor 50 can be transferred to a substrate having low heat resistance or a flexible substrate.

A base insulating film may be provided between the substrate 11 and the conductive film 15. Examples of the base insulating film include a silicon oxide film, a silicon oxynitride film, a silicon nitride film, a silicon nitride oxide film, a gallium oxide film, a hafnium oxide film, an yttrium oxide film, an aluminum oxide film, and an aluminum oxynitride film. Note that when a silicon nitride film, a gallium oxide film, a hafnium oxide film, an yttrium oxide film, an aluminum oxide film, or the like is used as the base insulating film, it is possible to inhibit diffusion of impurities such as an alkali metal, water, and hydrogen into the oxide semiconductor film 20 from the substrate 11. In this specification, a silicon oxynitride film means a film that includes more oxygen than nitrogen, and a silicon nitride oxide film means a film that includes more nitrogen than oxygen.

The conductive film 15 can be formed using a metal element selected from aluminum, chromium, copper, tantalum, titanium, molybdenum, or tungsten; an alloy containing any of these metal elements as its component; an alloy containing these metal elements in combination; or the like. Further, one or more metal elements selected from manganese or zirconium may be used. The conductive film 15 may have a single-layer structure or a layered structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, or a three-layer structure in which a titanium film, an aluminum film, and a titanium film are stacked in that order can be used. Alternatively, a film, an alloy film, or a nitride film that contains aluminum and one or more elements selected from titanium, tantalum, tungsten, molybdenum, chromium, neodymium, and scandium may be used.

Alternatively, the conductive film 15 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a layered structure including the light-transmitting conductive material and the metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, or a film of a metal nitride (e.g., InN or ZnN), or the like may be provided between the conductive film 15 and the insulating film 18. These films each have a work function of 5 eV or higher, preferably 5.5 eV or higher that is higher than the electron affinity of the oxide semiconductor. Thus, the threshold voltage of the transistor including an oxide semi-conductor can be shifted in a positive direction, and a so-called normally-off switching element can be achieved. For example, in the case where an In—Ga—Zn-based oxynitride semiconductor film is used, an In—Ga—Zn-based oxynitride semiconductor film having higher nitrogen concentration than at least the oxide semiconductor film 20, specifically, an In—Ga—Zn-based oxynitride semiconductor film having a nitrogen concentration of 7 at. % or higher is used.

The insulating film 18 may be formed to have a single-layer structure or a layered structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film. The insulating film 18 may be formed using an oxide insulator from which oxygen is released by heating. With the use of a film from which oxygen is released by heating as the insulating film 18, interface states at the interface between the oxide semiconductor film 20 and the gate insulating film 18 can be reduced; thus, a transistor with less deterioration in electrical characteristics can be obtained. Further, when an insulating film that has an effect of blocking diffusion of oxygen, hydrogen, water, and the like is used as the insulating film 18, oxygen can be prevented from diffusing from the oxide semiconductor film 20 into the outside, and hydrogen, water, and the like can be prevented from entering the oxide semiconductor film 20 from the outside. As the insulating film that has an effect of blocking diffusion of oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used. Further, when an insulating film that has an effect of blocking diffusion of hydrogen, water, and the like is provided as the insulating film 18, hydrogen, water, and the like can be prevented from entering the oxide semiconductor film 20 from the outside. As the insulating film that has an effect of blocking diffusion of hydrogen, water, and the like, a silicon nitride film, a silicon nitride oxide film, or the like can be used.

When the insulating film 18 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current of the transistor can be reduced.

The thickness of the insulating film 18 is preferably 5 to 400 nm, more preferably 10 to 300 nm, still more preferably 50 to 250 nm.

The oxide semiconductor film 20 preferably contains at least indium (In) or zinc (Zn). Alternatively, the oxide semiconductor film 20 preferably contains In and Zn. In order to reduce variations in electrical characteristics of the transistor including an oxide semiconductor, the oxide semiconductor film 20 preferably contains one or more of stabilizers in addition to In and/or Zn.

As a stabilizer, gallium (Ga), tin (Sn), hafnium (Hf), aluminum (Al), zirconium (Zr), or the like can be used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be used.

As the oxide semiconductor, for example, the following can be used: indium oxide; tin oxide; zinc oxide; a binary metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, or an In—W-based metal oxide; a ternary metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; or a quaternary metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide.

Note that, here, for example, an In—Ga—Zn-based metal oxide means an oxide whose main components are In, Ga, and Zn, and there is no limitation on the ratio of In, Ga, and Zn. The In—Ga—Zn-based metal oxide may contain a metal element other than In, Ga, and Zn.

A material represented by $InMO_3(ZnO)_m$ (m>0, where m is not an integer) may be used as the oxide semiconductor. Note that M denotes one or more metal elements selected from Ga, Fe, Mn, or Co. A material represented by $In_2SnO_5(ZnO)_n$ (n>0, where n is an integer) may be used as the oxide semiconductor.

For example, an In—Ga—Zn-based metal oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide with an atomic ratio close to the above atomic ratio can be used. Alternatively, an In—Sn—Zn-based metal oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratio may be used.

However, without limitation to the materials given above, a material with an appropriate composition may be used depending on electrical characteristics (e.g., field-effect mobility and threshold voltage). In order to obtain needed electrical characteristics, it is preferable that carrier density, impurity concentration, defect density, an atomic ratio between a metal element and oxygen, interatomic distance, density, and the like be set to appropriate values.

For example, with an In—Sn—Zn-based metal oxide, high mobility can be comparatively easily obtained. However, even with an In—Ga—Zn-based metal oxide, mobility can be increased by lowering defect density in a bulk.

Further, the energy gap of a metal oxide that can form the oxide semiconductor film 20 is 2 eV or higher, preferably 2.5 eV or higher, more preferably 3 eV or higher. In this manner, the off-state current of the transistor can be reduced by using an oxide semiconductor having a wide energy gap.

The structure of an oxide semiconductor film is described below.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In this specification, the term "parallel" indicates that an angle formed between two straight lines is −10° to 10°, and accordingly includes the case where the angle is −5° to 5°. In addition, the term "perpendicular" indicates that an angle formed between two straight lines is 80° to 100°, and accordingly includes the case where the angle is 85° to 95°.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Further, when an impurity is added to the CAAC-OS film, the crystallinity in a region to which the impurity is added is changed, and the crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

Alternatively, the oxide semiconductor film 20 may have a layered structure of a plurality of oxide semiconductor films. For example, the oxide semiconductor film 20 may have a layered structure of a first oxide semiconductor film and a second oxide semiconductor film that are formed using metal oxides with different compositions. For example, the first oxide semiconductor film may be formed using any of a binary metal oxide, a ternary metal oxide, and a quaternary metal oxide, and the second oxide semiconductor film may be formed using any of these that is different from the oxide for the first oxide semiconductor film.

Further, the constituent elements of the first oxide semiconductor film and the second oxide semiconductor film are the same, and the composition of the constituent elements of the first oxide semiconductor film and the second oxide semiconductor film may be different. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3. Note that the proportion of each atom in the atomic ratio of the oxide semiconductor film varies within a range of ±20% as an error.

In that case, one of the first oxide semiconductor film and the second oxide semiconductor film that is closer to the conductive film functioning as a gate (on a channel side) preferably contains In and Ga at a proportion of In>Ga. The other of the first oxide semiconductor film and the second oxide semiconductor film that is farther from the conductive film functioning as a gate (on a back channel side) preferably contains In and Ga at a proportion of In≤Ga.

Further, the oxide semiconductor film 20 may have a three-layer structure of a first oxide semiconductor film, a second oxide semiconductor film, and a third oxide semiconductor film, in which the constituent elements thereof is the same and the composition of the constituent elements of the first oxide semiconductor film, the second oxide semiconductor film, and the third oxide semiconductor film is different. For example, the first oxide semiconductor film may have an atomic ratio of In:Ga:Zn=1:3:2, the second oxide semiconductor film may have an atomic ratio of In:Ga:Zn=3:1:2, and the third oxide semiconductor film may have an atomic ratio of In:Ga:Zn=1:1:1.

An oxide semiconductor film that contains less In than Ga and Zn at an atomic ratio, typically, the first oxide semiconductor film containing In, Ga, and Zn at an atomic ratio of 1:3:2, causes less oxygen vacancies than an oxide semiconductor film containing more In than Ga and Zn at an atomic ratio, typically, the second oxide semiconductor film, and an oxide semiconductor film containing Ga, Zn, and In at the same atomic ratio, typically, the third oxide semiconductor film. Thus, an increase in carrier density can be inhibited. Further, when the first oxide semiconductor film containing In, Ga, and Zn at an atomic ratio of 1:3:2 has an amorphous structure, the second oxide semiconductor film is likely to be a CAAC-OS film.

Since the constituent elements of the first oxide semiconductor film, the second oxide semiconductor film, and the third oxide semiconductor film are the same, the first oxide semiconductor film has a few trap levels at the interface with the second oxide semiconductor film. Thus, when the oxide semiconductor film 20 has the above structure, the amount of change in threshold voltage of the transistor due to a change over time or a BT photostress test can be reduced.

In an oxide semiconductor, the s orbital of heavy metal mainly contributes to carrier transfer, and overlap of the s orbitals is likely to increase when the In content in the oxide semiconductor is increased. Thus, an oxide having a composition of In>Ga has higher carrier mobility than an oxide having a composition of In≤Ga. Further, in Ga, the formation energy of an oxygen vacancy is high and thus the oxygen vacancy is less likely to occur, than in In; thus, the oxide having a composition of In≤Ga has more stable characteristics than the oxide having a composition of In>Ga.

An oxide semiconductor containing In and Ga at a proportion of In>Ga is used on a channel side and an oxide semiconductor containing In and Ga at a proportion of In≤Ga is used on a back channel side, so that the field-effect mobility and reliability of a transistor can be further increased.

Further, the first oxide semiconductor film, the second oxide semiconductor film, and the third oxide semiconductor film may be formed using oxide semiconductors having different crystallinity. In other words, the oxide semiconductor film may be formed using any of a single crystal oxide semiconductor, a polycrystalline oxide semiconductor, an amorphous oxide semiconductor, and a CAAC-OS, as appropriate. When an amorphous oxide semiconductor film is applied to any of the first oxide semiconductor film, the second oxide semiconductor film, and the third oxide semiconductor film, internal stress or external stress of the oxide semiconductor film 20 is relieved, variations in characteristics of a transistor is reduced, and the reliability of the transistor can be further increased.

The thickness of the oxide semiconductor film 20 is preferably 1 to 100 nm, more preferably 1 to 50 nm, still more preferably 1 to 30 nm, even more preferably 3 to 20 nm.

The concentration of an alkali metal or an alkaline earth metal in the oxide semiconductor film 20 that is measured by secondary ion mass spectrometry (SIMS) is preferably $1 \times 10^{18}$ atoms/cm$^3$ or lower, more preferably $2 \times 10^{16}$ atoms/cm$^3$ or lower. This is because an alkali metal and an alkaline earth metal are bonded to an oxide semiconductor and generate carriers in some cases, and cause an increase in off-state current of the transistor.

The concentration of hydrogen in the oxide semiconductor film 20 that is measured by SIMS is preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, even more preferably lower than or equal to $1 \times 10^{16}$ atoms/cm$^3$.

Hydrogen contained in the oxide semiconductor film 20 reacts with oxygen bonded to a metal atom to produce water, and a vacancy is formed in a lattice from which oxygen is released (or a portion from which oxygen is released). In addition, the bond of part of hydrogen and oxygen causes generation of electrons serving as carriers. Thus, impurities containing hydrogen are greatly reduced in the step of forming the oxide semiconductor film, so that the concentration of hydrogen in the oxide semiconductor film can be reduced. When an oxide semiconductor film that is highly purified by removing hydrogen as much as possible is used as a channel region, a shift in threshold voltage in a negative direction can be reduced, and leakage current between a source and a drain of the transistor (typically, off-state current) can be reduced. As a result, the electrical characteristics of the transistor can be improved.

The oxide semiconductor film 20 may contain nitrogen at a concentration of $5 \times 10^{18}$ atoms/cm$^3$ or lower.

The pair of conductive films 21 is formed to have a single-layer structure or a layered structure including, as a conductive material, any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in that order, a three-layer structure in which a molybdenum film or a molybdenum nitride film, an aluminum film or a copper film, and a molybdenum film or a molybdenum nitride film are stacked in that order, or the like can be used. Note that a transparent conductive material containing indium oxide, tin oxide, or zinc oxide may be used.

Next, a method for forming the transistor 50 in FIGS. 9A to 9C is described with reference to FIGS. 10A to 10D.

Figure 10A:
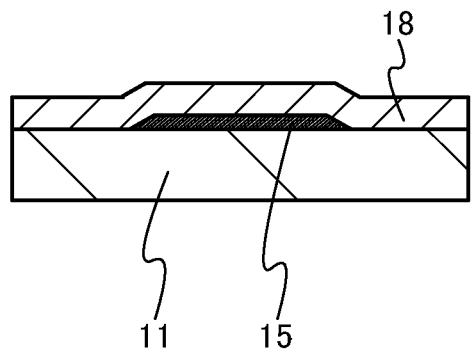
FIGS. 10A to 10D are cross-sectional views illustrating one aspect of a method for forming a transistor.

As illustrated in FIG. 10A, the conductive film 15 is formed over the substrate 11, and the insulating film 18 is formed over the conductive film 15.

A method for forming the conductive film 15 is described below. First, a conductive film is formed by sputtering, CVD, vapor deposition, or the like. Then, a mask is formed over the conductive film by a photolithography process. Next, with the use of the mask, part of the conductive film is etched, so that the conductive film 15 is formed. After that, the mask is removed.

Note that the conductive film 15 may be formed by an electrolytic plating method, a printing method, an inkjet method, or the like instead of the formation method.

In this embodiment, a 100-nm-thick tungsten film is formed by sputtering. Then, a mask is formed by a photolithography process and the tungsten film is dry-etched using the mask to form the conductive film 15.

The insulating film 18 is formed by sputtering, CVD, vapor deposition, or the like.

In the case where the insulating film 18 is formed using a silicon oxide film, a silicon oxynitride film, or a silicon nitride oxide film, a deposition gas containing silicon and an oxidizing gas are preferably used as source gases. Typical examples of the deposition gas containing silicon include silane, disilane, trisilane, and silane fluoride. As the oxidizing gas, oxygen, ozone, dinitrogen monoxide, nitrogen dioxide, or the like can be used.

In the case where a silicon nitride film is formed as the insulating film 18, it is preferable to use a two-step formation method. First, a first silicon nitride film with a few defects is formed by plasma-enhanced CVD in which a mixed gas of silane, nitrogen, and ammonia is used as a source gas. Then, a second silicon nitride film in which the hydrogen concentration is low and hydrogen can be blocked is formed by switching the source gas to a mixed gas of silane and nitrogen. With such a formation method, a silicon nitride film having a few defects and blocking hydrogen can be formed as the insulating film 18.

In the case where a gallium oxide film is formed as the insulating film 18, metal organic chemical vapor deposition (MOCVD) can be used.

Figure 10B:
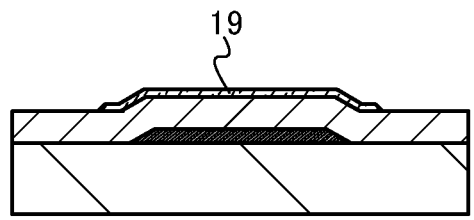

Next, as illustrated in FIG. 10B, an oxide semiconductor film 19 is formed over the insulating film 18.

A method for forming the oxide semiconductor film 19 is described below. An oxide semiconductor film is formed over the insulating film 18 by sputtering, coating, pulsed laser vapor deposition, laser ablation, or the like. Then, after a mask is formed over the oxide semiconductor film by a photolithography process, the oxide semiconductor film is partly etched using the mask. Accordingly, the oxide semiconductor film 19 that is over the insulating film 18 and subjected to element isolation to partly overlap with the conductive film 15 is formed, as illustrated in FIG. 10B. After that, the mask is removed.

Alternatively, by using a printing method for forming the oxide semiconductor film 19, the oxide semiconductor film 19 subjected to element isolation can be formed directly.

In the case where the oxide semiconductor film is formed by sputtering, a power source for generating plasma can be an RF power source, an AC power source, a DC power source, or the like as appropriate.

As a sputtering gas, a rare gas (typically argon), oxygen, or a mixed gas of a rare gas and oxygen is used as appropriate. In the case where the mixed gas of a rare gas and oxygen is used, the proportion of oxygen is preferably higher than that of a rare gas.

Further, a target may be selected as appropriate depending on the composition of the oxide semiconductor film to be formed.

For example, in the case where the oxide semiconductor film is formed by sputtering at a substrate temperature of 150 to 750° C., preferably 150 to 450° C., more preferably 200 to 350° C., the oxide semiconductor film can be a CAAC-OS film.

For example, a CAAC-OS film is deposited by sputtering with a polycrystalline oxide semiconductor sputtering target. When ions collide with the sputtering target, a crystal region included in the sputtering target may be separated from the target along the a-b plane, and a sputtered particle having a plane parallel to the a-b plane (a flat-plate-like sputtered particle or a pellet-like sputtered particle) might be separated from the sputtering target. In that case, the flat-plate-like sputtered particle reaches a substrate while maintaining its crystal state, so that the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Further, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100 to 740° C., preferably 200 to 500° C. By increasing the substrate heating temperature during the deposition, when the flat-plate-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the sputtering target, an In—Ga—Zn-based metal oxide target is described below.

A polycrystalline In—Ga—Zn-based metal oxide target is made by mixing $InO_X$ powder, $GaO_Y$ powder, and $ZnO_Z$ powder in a predetermined mole ratio, applying pressure, and performing heat treatment at 1000 to 1500° C. Note that X, Y, and Z are each a given positive number. Here, the predetermined mole ratio of the $InO_X$ powder, the $GaO_Y$ powder, and the $ZnO_Z$ powder is, for example, 2:2:1, 8:4:3, 3:1:1, 1:1:1, 4:2:3, or 3:1:2. The kinds of powder and the mole ratio for mixing powder may be changed as appropriate depending on a sputtering target to be formed.

After the oxide semiconductor film is formed, heat treatment for dehydration or dehydrogenation of the oxide semiconductor film may be performed. The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the inert gas atmosphere and the oxygen atmosphere do not contain hydrogen, water, and the like. The treatment time is 3 minutes to 24 hours.

By performing heat treatment after forming the oxide semiconductor film, the concentration of hydrogen in the oxide semiconductor film 20 can be lower than $5 \times 10^{18}$ atoms/cm$^3$, preferably lower than or equal to $1 \times 10^{18}$ atoms/cm$^3$, more preferably lower than or equal to $5 \times 10^{17}$ atoms/cm$^3$, still more preferably lower than or equal to $1 \times 10^{16}$ atoms/cm$^3$.

In this embodiment, a 35-nm-thick oxide semiconductor film is formed by sputtering, a mask is formed over the oxide semiconductor film, and then part of the oxide semiconductor film is selectively etched to form the oxide semiconductor film 19.

Figure 10C:
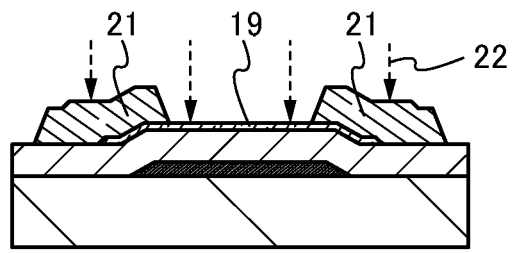

Next, as illustrated in FIG. 10C, the pair of conductive films 21 is formed.

A method for forming the pair of conductive films 21 is described below. First, a conductive film is formed by sputtering, CVD, vapor deposition, or the like. Then, a mask is formed over the conductive film by a photolithography process. Next, the conductive film is etched using the mask to form the pair of conductive films 21. After that, the mask is removed.

In this embodiment, a 50-nm-thick tungsten film, a 400-nm-thick aluminum film, and a 100-nm-thick titanium film are stacked in that order by sputtering. Then, a mask is formed over the titanium film by a photolithography process and the tungsten film, the aluminum film, and the titanium film are dry-etched using the mask to form the pair of conductive films 21.

After the first conductive film 21 is formed, cleaning treatment is preferably performed to remove an etching residue. A short circuit between the pair of conductive films 21 can be inhibited by this cleaning treatment. The cleaning treatment can be performed using an alkaline solution such as a tetramethylammonium hydroxide (TMAH) solution, an acidic solution such as a hydrofluoric acid or an oxalic acid solution, or water.

Figure 10D:
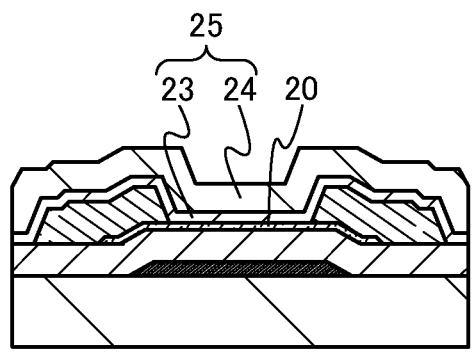

Next, the oxide semiconductor film 20 in FIG. 10D may be formed in such a manner that the oxide semiconductor film 19 is exposed to plasma generated in an oxidizing atmosphere to be supplied with oxygen 22, as illustrated in FIG. 10C. As the oxidizing atmosphere, an atmosphere of oxygen, ozone, dinitrogen monoxide, nitrogen dioxide, or the like can be used. Further, in plasma treatment, the oxide semiconductor film 19 is preferably exposed to plasma generated with no bias applied to the substrate 11 side. Consequently, the oxide semiconductor film 19 can be supplied with oxygen without being damaged, and the amount of oxygen vacancies in the oxide semiconductor film 20 can be reduced.

In this embodiment, the oxide semiconductor film 20 is formed by exposing the oxide semiconductor film 19 to oxygen plasma that is generated in such a manner that dinitrogen monoxide is introduced into a treatment chamber of a plasma-enhanced CVD apparatus, and an upper electrode provided in the treatment chamber is supplied with a high-frequency power of 150 W with the use of a high-frequency power supply of 27.12 MHz. Note that the plasma-enhanced CVD apparatus is a parallel plate plasma-enhanced CVD apparatus in which the electrode area is 6000 cm$^2$, and power per unit area (power density) into which supplied power is converted is $2.5 \times 10^{-2}$ W/cm$^2$.

Exposure of a surface of the oxide semiconductor film 19 to plasma generated in an oxidizing atmosphere enables supply of oxygen to the oxide semiconductor film 19, so that the amount of oxygen vacancies in the oxide semiconductor film can be reduced. Further, impurities remaining on the surface of the oxide semiconductor film 19 due to etching treatment, for example, halogen such as fluorine or chlorine, can be removed.

Note that heat treatment is preferably performed before plasma treatment is performed on the oxide semiconductor film 19. The heat treatment can be performed, for example, in a manner similar to that of the heat treatment performed after the oxide semiconductor film 19 is formed.

Next, the insulating film 23 is formed over the oxide semiconductor film 20 and the pair of conductive films 21. Then, the insulating film 24 is formed over the insulating film 23. At this time, the insulating film 23 is formed without exposure to the atmosphere after the oxide semiconductor film 20 is formed by the plasma treatment, so that the concentration of impurities at the interface between the oxide semiconductor film 20 and the insulating film 23 can be reduced.

Further, it is preferable to form the insulating film 24 without exposure to the atmosphere, directly after the insulating film 23 is formed. The insulating film 24 is formed directly after the insulating film 23 is formed, by adjusting at least one of the flow rate of the source gas, the pressure, the high-frequency power, and the substrate temperature without exposure to the atmosphere, so that the concentration of impurities at the interface between the insulating film 23 and the insulating film 24 can be reduced and oxygen contained in the insulating film 24 can move to the oxide semiconductor film 20. Accordingly, the amount of oxygen vacancies in the oxide semiconductor film 20 can be reduced.

As the insulating film 23, a silicon oxide film or a silicon oxynitride film is formed under the following conditions: the substrate placed in a treatment chamber of the plasma-enhanced CVD apparatus that is vacuum-evacuated is held at 180 to 400° C., preferably 200 to 370° C., the pressure in the treatment chamber is 20 to 250 Pa, preferably 40 to 200 Pa with introduction of a source gas into the treatment chamber, and high-frequency power is supplied to an electrode provided in the treatment chamber.

A deposition gas containing silicon and an oxidizing gas are preferably used as the source gases of the insulating film 23. Typical examples of the deposition gas containing silicon include silane, disilane, trisilane, and silane fluoride. As the oxidizing gas, oxygen, ozone, dinitrogen monoxide, nitrogen dioxide, or the like can be used.

Under the above conditions, an oxide insulating film that passes oxygen can be formed as the insulating film 23. With the insulating film 23, damage to the oxide semiconductor film 20 can be reduced during a later formation process of the insulating film 24.

Note that when the ratio of the amount of the oxidizing gas to the amount of the deposition gas containing silicon is higher than or equal to 100, the hydrogen content in the insulating film 23 can be reduced, and dangling bonds in the insulating film 23 can be reduced. Oxygen that moves from the insulating film 24 might be captured by the dangling bond in the insulating film 23. Thus, oxygen contained in the insulating film 24 containing oxygen at a higher proportion than the stoichiometric composition can efficiently move to an oxide semiconductor film of the transistor and oxygen vacancies in the oxide semiconductor film can be compensated. As a result, the amount of hydrogen entering the oxide semiconductor film 20 can be reduced, and oxygen vacancies in the oxide semiconductor film can be reduced. Consequently, a negative shift in threshold voltage of the transistor can be reduced, and leakage current between a source and a drain of the transistor can be reduced; accordingly, the electrical characteristics of the transistor can be improved.

In this embodiment, as the insulating film 23, a 50-nm-thick silicon oxynitride film is formed by plasma-enhanced CVD under the following conditions: silane with a flow rate of 20 sccm and dinitrogen monoxide with a flow rate of 3000 sccm are used as the source gases, the pressure in the treatment chamber is 40 Pa, the substrate temperature is 220° C., and a high-frequency power of 100 W is supplied to parallel plate electrodes with a high-frequency power supply of 27.12 MHz. Note that a plasma-enhanced CVD apparatus is a parallel plate plasma-enhanced CVD apparatus in which the electrode area is 6000 cm$^2$, and power per unit area (power density) into which supplied power is converted is $1.6 \times 10^{-2}$ W/cm$^2$. Under the above conditions, a silicon oxynitride film that passes oxygen can be formed.

As the insulating film 24, a silicon oxide film or a silicon oxynitride film is formed under the following conditions: the substrate placed in a treatment chamber of the plasma-enhanced CVD apparatus that is vacuum-evacuated is held at 180 to 260° C., preferably 180 to 230° C., the pressure is 100 to 250 Pa, preferably 100 to 200 Pa with introduction of a source gas into the treatment chamber, and a high-frequency power of 0.17 to 0.5 W/cm$^2$, preferably 0.25 to 0.35 W/cm$^2$ is supplied to an electrode provided in the treatment chamber.

As the deposition conditions of the insulating film 24, the high-frequency power having the power density is supplied to the treatment chamber having the pressure, so that the degradation efficiency of the source gas in plasma is increased, oxygen radicals are increased, and oxidation of the source gas is promoted. Thus, the oxygen content in the insulating film 24 becomes higher than that in the stoichiometric composition. However, in the case where the substrate temperature is within the temperature range, a bond between silicon and oxygen is weak; thus, part of oxygen is released by heating. Accordingly, it is possible to form an oxide insulating film which contains oxygen at a higher proportion than the stoichiometric composition and from which part of oxygen is released by heating. Further, the insulating film 23 is provided over the oxide semiconductor film 20. Accordingly, in the process of forming the insulating film 24, the insulating film 23 serves as a protective film of the oxide semiconductor film 20. Consequently, the insulating film 24 can be formed using the high-frequency power having high power density while damage to the oxide semiconductor film 20 is reduced.

In this embodiment, as the insulating film 24, a 400-nm-thick silicon oxynitride film is formed by plasma-enhanced CVD under the following conditions: silane with a flow rate of 160 sccm and dinitrogen monoxide with a flow rate of 4000 sccm are used as the source gas, the pressure in the treatment chamber is 200 Pa, the substrate temperature is 220° C., and a high-frequency power of 1500 W is supplied to parallel plate electrodes with a high-frequency power supply of 27.12 MHz. Note that a plasma-enhanced CVD apparatus is a parallel plate plasma-enhanced CVD apparatus in which the electrode area is 6000 cm$^2$, and power per unit area (power density) into which supplied power is converted is $2.5 \times 10^{-1}$ W/cm$^2$.

Next, heat treatment is performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

An electric furnace, an RTA apparatus, or the like can be used for the heat treatment. With the use of an RTA apparatus, the heat treatment can be performed at a temperature of higher than or equal to the strain point of the substrate if the heating time is short. Thus, the heat treatment time can be shortened.

The heat treatment may be performed under an atmosphere of nitrogen, oxygen, ultra-dry air (air whose water content is 20 ppm or less, preferably 1 ppm or less, more preferably 10 ppb or less), or a rare gas (e.g., argon or helium). The atmosphere of nitrogen, oxygen, ultra-dry air, or a rare gas preferably does not contain hydrogen, water, and the like.

In this embodiment, the heat treatment is performed at 350° C. for 1 hour in an atmosphere of nitrogen and oxygen.

Through the above steps, it is possible to form a transistor with excellent electrical characteristics in which a shift in threshold voltage in a negative direction can be reduced. In addition, it is possible to form a highly reliable transistor with small variations in electrical characteristics due to a change over time or a BT photostress test, typically, a variation in threshold voltage of 0 to 2.5 V.

Figure 11:
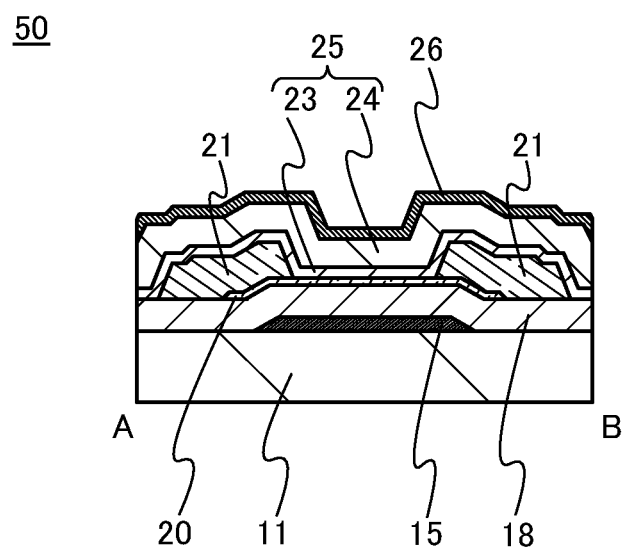
FIG. 11 illustrates one aspect of a transistor.

Note that the transistor 50 whose structure and formation method are described with reference to FIGS. 9A to 9C and FIGS. 10A to 10D may include an insulating film 26 having an effect of blocking diffusion of oxygen, hydrogen, water, and the like over the protective film 25. FIG. 11 is an example of a cross-sectional view of the transistor 50 including the insulating film 26 having an effect of blocking diffusion of oxygen, hydrogen, water, and the like over the protective film 25.

The transistor 50 in FIG. 11 includes the insulating film 26 over the insulating film 24. In the case where the insulating film 26 has an effect of blocking diffusion of water, hydrogen, and the like, entry of impurities such as water and hydrogen into the oxide semiconductor film 20 can be prevented. Part of water or hydrogen entering the oxide semiconductor serves as an electron donor (donor); thus, the use of the insulating film 26 having the blocking effect can prevent a shift in threshold voltage of the transistor 50.

In the case where the insulating film 26 has an effect of blocking diffusion of oxygen, diffusion of oxygen from the oxide semiconductor film 20 into the outside can be prevented. Accordingly, oxygen vacancies in the oxide semiconductor film 20 that serve as donors are reduced, so that a shift in threshold voltage of the transistor 50 can be prevented.

Thus, provision of the insulating film 26 having an effect of blocking diffusion of oxygen, hydrogen, water, and the like over the protective film 25 can increase the reliability of the semiconductor device.

The insulating film 26 having an effect of blocking diffusion of oxygen, hydrogen, water, and the like can be formed using aluminum oxide, aluminum oxynitride, gallium oxide, gallium oxynitride, yttrium oxide, yttrium oxynitride, hafnium oxide, hafnium oxynitride, or the like. The insulating film 26 having an effect of blocking diffusion of hydrogen, water, and the like can be formed using silicon nitride, silicon nitride oxide, or the like.

For example, in the case where the insulating film 26 is formed using a silicon nitride film, the silicon nitride film preferably has an effect of blocking diffusion of hydrogen, water, and the like and does not easily release hydrogen, ammonia and the like. The silicon nitride film having the above characteristics can be formed by plasma-enhanced CVD using a mixed gas of silane, nitrogen, and ammonia as a source gas.

Note that when ammonia is used as the source gas, at the time of formation, a bond between a silicon atom and a hydrogen atom in silane or a triple bond between nitrogen atoms in nitrogen is easily broken by dissociated ammonia. Thus, at the time of formation, degradation of silane or nitrogen is promoted, and a dense silicon nitride film can be formed. When the flow rate of ammonia in the source gas is too high, the amount of hydrogen and ammonia absorbed into the silicon nitride film is increased, so that a silicon nitride film that releases a large amount of hydrogen and ammonia is formed. Thus, the flow rate of ammonia at the time of formation of the silicon nitride film is preferably a flow rate with which degradation of silane is promoted and the amount of released hydrogen, ammonia, and the like is decreased because the reliability of the semiconductor device is increased.

Specifically, in the silicon nitride film, in thermal desorption spectrometry, the amount of released hydrogen molecules is preferably less than $5 \times 10^{21}$ molecule/cm$^3$, more preferably less than or equal to $3 \times 10^{21}$ molecule/cm$^3$, still more preferably less than or equal to $1 \times 10^{21}$ molecule/cm$^3$, and the amount of released ammonia molecules is preferably less than $1 \times 10^{22}$ molecule/cm$^3$, more preferably less than or equal to $5 \times 10^{21}$ molecule/cm$^3$, much more preferably less than or equal to $1 \times 10^{21}$ molecule/cm$^3$.

Here, a method for measuring the amount of released hydrogen molecules and ammonia by thermal desorption spectrometry (hereinafter referred to as TDS analysis) is described below.

The amount of released gas in the TDS analysis is proportional to an integral value of a spectrum. Thus, the amount of released gas can be calculated from the ratio between the integral value of a spectrum of an insulating film and the reference value of a standard sample. The reference value of a standard sample means the ratio of the density of a predetermined atom contained in a sample to the integral value of a spectrum.

For example, the number of released hydrogen molecules ($N_{H2}$) from an insulating film can be calculated according to Formula 1 using the TDS analysis results of a silicon wafer containing hydrogen at predetermined density that is the standard sample, and the TDS analysis results of the insulating film. Here, all the spectra having a mass number of 2 that are obtained by the TDS analysis are assumed to originate from a hydrogen molecule. Further, a hydrogen atom having a mass number other than 1 that is an isotope of a hydrogen atom is not taken into consideration because the proportion of such a molecule in the natural world is minimal.

$$N_{H2} = \frac{N_{H2(S)}}{S_{H2(S)}} \times S_{H2} \times \alpha \qquad \text{Formula 1}$$

Note that $N_{H2}$ is the amount of released hydrogen molecules. Here, $N_{H2(s)}$ is the value obtained by conversion of the amount of hydrogen molecules released from the standard sample into density, and $S_{H2(s)}$ is the integral value of a spectrum when the standard sample is subjected to TDS analysis. The reference value of the standard sample is set to $N_{H2(s)}/S_{H2(s)}$. Here, $S_{H2}$ is the integral value of a spectrum when the insulating film is subjected to TDS analysis, and a is a coefficient affecting the intensity of the spectrum in the TDS analysis. Refer to Japanese Published Patent Application No. 6-275697 for details of Formula 1. Note that the amount of hydrogen released from the insulating film is obtained by measurement with a thermal desorption spectrometer produced by ESCO Ltd., EMD-WA1000S/W using a silicon wafer containing hydrogen atoms at $1 \times 10^{16}$ atoms/cm$^2$ as the standard sample.

By substituting the integral value of a spectrum when the insulating film is subjected to TDS analysis to obtain the amount of ammonia released from the insulating film into $S_{H2}$ in Formula 1, the amount of released ammonia can be calculated.

Specifically, when the ratio of the flow rate of nitrogen to the flow rate of ammonia is 5 to 50, preferably 10 to 50, it is possible to form a silicon nitride film that has a high effect of blocking diffusion of hydrogen, water, and the like and does not easily release hydrogen, ammonia and the like.

In this embodiment, as the insulating film 26, a 50-nm-thick silicon oxynitride film is formed by plasma-enhanced CVD under the following conditions: silane with a flow rate of 50 sccm, nitrogen with a flow rate of 5000 sccm, and ammonia with a flow rate of 100 sccm are used as the source gases, the pressure in the treatment chamber is 200 Pa, the substrate temperature is 220° C., and a high-frequency power of 1000 W is supplied to parallel plate electrodes with a high-frequency power supply of 27.12 MHz. Note that the structure of a plasma-enhanced CVD apparatus is the same as that of the apparatus used for forming the insulating film 23 and the insulating film 24. Under the conditions, it is possible to form a silicon nitride film that has a high effect of blocking diffusion of hydrogen, water, and the like and does not easily release hydrogen, ammonia, and the like.

Note that the transistor 50 in FIGS. 9A to 9C, FIGS. 10A to 10D, and FIG. 11 may have, for example, layout in which the conductive film 15 functioning as a gate completely covers the oxide semiconductor film 20 when it is seen from the plane. Such layout can completely block irradiation light from the substrate 11 with the conductive film 15. Thus, deterioration in characteristics, such as a shift in threshold voltage of the transistor 50, can be prevented.

The transistor 50 in FIGS. 9A to 9C, FIGS. 10A to 10D, and FIG. 11 has a bottom-gate structure; however, in a semiconductor device according to one embodiment of the present invention, a transistor with a top-gate structure may be used.

Figure 12A:
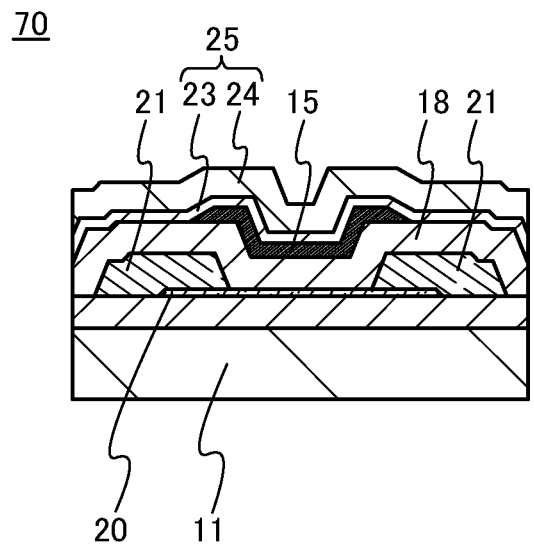
FIGS. 12A and 12B illustrate one aspect of a transistor.

FIG. 12A is an example of a cross-sectional view of a transistor 70 with a top-gate structure. The transistor 70 in FIG. 12A includes the oxide semiconductor film 20 over the substrate 11. The transistor 70 in FIG. 12A further includes the pair of conductive films 21 that functions as a source and a drain and is in contact with the oxide semiconductor film 20, the insulating film 18 that is formed over the oxide semiconductor film 20 and the pair of conductive films 21, and the conductive film 15 that functions as a gate and overlaps with the oxide semiconductor film 20 with the insulating film 18 provided therebetween. The protective film 25 including the insulating film 23 and the insulating film 24 is formed over the insulating film 18 and the conductive film 15.

Figure 12B:
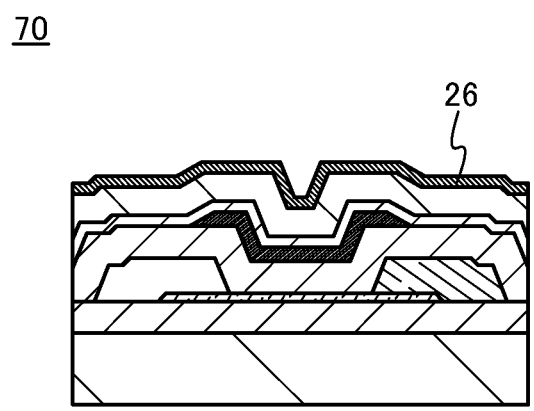

Note that the transistor 70 in FIG. 12A may include the insulating film 26 having an effect of blocking diffusion of oxygen, hydrogen, water, and the like over the protective film 25. FIG. 12B is an example of a cross-sectional view of the transistor 70 including the insulating film 26 having an effect of blocking diffusion of oxygen, hydrogen, water, and the like over the protective film 25.

The transistor 70 in FIG. 12B includes the insulating film 26 over the insulating film 24. In the case where the insulating film 26 has an effect of blocking diffusion of water, hydrogen, and the like, entry of impurities such as water and hydrogen into the oxide semiconductor film 20 can be prevented. Part of water or hydrogen entering the oxide semiconductor serves as an electron donor; thus, the use of the insulating film 26 having the blocking effect can prevent a shift in threshold voltage of the transistor 70.

This embodiment can be combined with any of the other embodiments as appropriate.

Embodiment 3

Figure 13A:
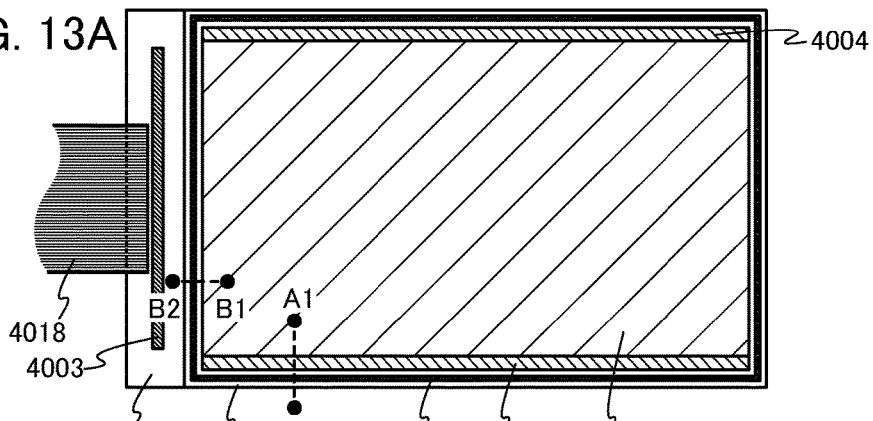
FIG. 13A is a top view of a liquid crystal display device.
Figure 13B:
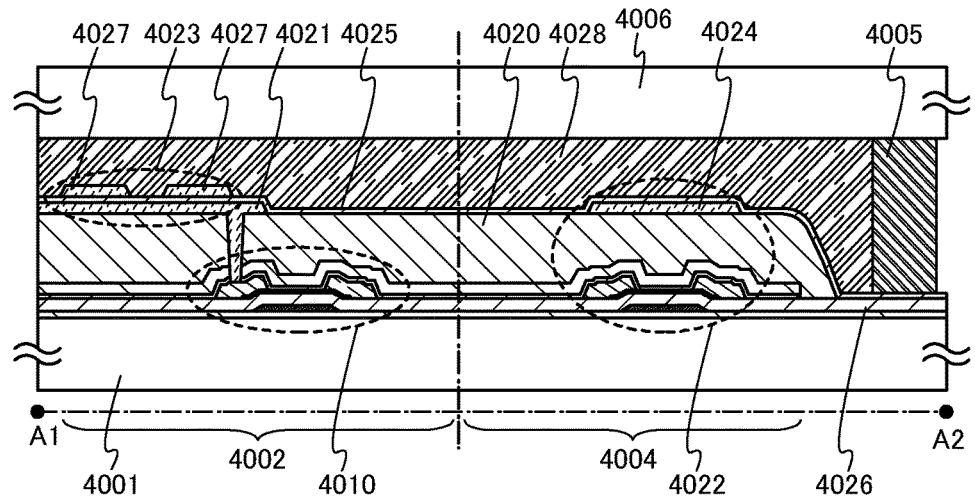
FIGS. 13B and 13C are cross-sectional views of the liquid crystal display device.
Figure 13C:
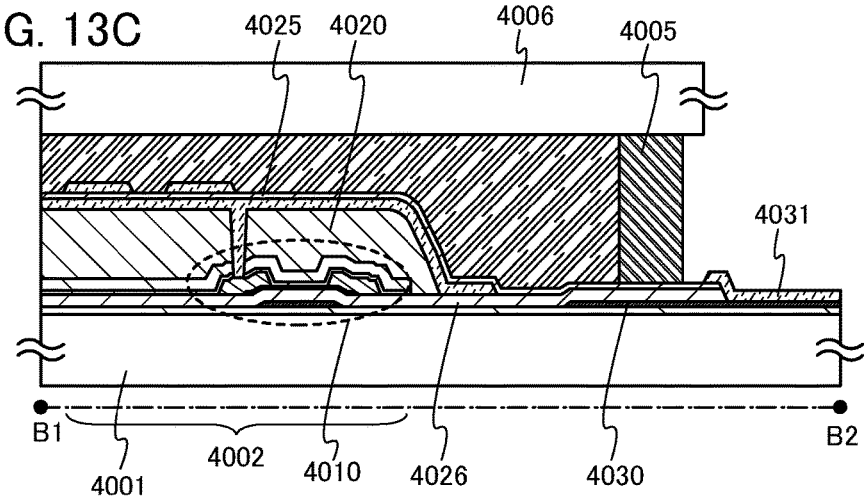

Next, an appearance of a liquid crystal display device according to one embodiment of the present invention is described with reference to FIGS. 13A to 13C. FIG. 13A is a top view of a liquid crystal display device where a substrate 4001 and a substrate 4006 are bonded to each other with a sealant 4005. FIG. 13B corresponds to a cross-sectional view taken along broken line A1-A2 in FIG. 13A. FIG. 13C corresponds to a cross-sectional view taken along broken line B1-B2 in FIG. 13A. Note that FIGS. 13A to 13C illustrate a fringe field switching (FFS)-mode liquid crystal display device.

The sealant 4005 is provided to surround a pixel portion 4002 and a pair of scan line driver circuits 4004 provided over the substrate 4001. The substrate 4006 is provided over the pixel portion 4002 and the scan line driver circuit 4004. Thus, the pixel portion 4002 and the scan line driver circuit 4004 are sealed by the substrate 4001, the sealant 4005, and the substrate 4006.

A signal line driver circuit 4003 is mounted in a region which is different from a region surrounded by the sealant 4005 over the substrate 4001.

A plurality of transistors are included in the pixel portion 4002 and the scan line driver circuit 4004 provided over the substrate 4001. FIG. 13B illustrates a transistor 4010 included in the pixel portion 4002 and a transistor 4022 included in the scan line driver circuit 4004. FIG. 13C illustrates the transistor 4010 included in the pixel portion 4002.

In the pixel portion 4002 and the scan line driver circuit 4004, an insulating film 4020 formed using a resin is provided over the transistor 4010 and the transistor 4022. A first electrode 4021 of a liquid crystal element 4023 and a conductive film 4024 are provided over the insulating film 4020. The conductive film 4024 can function as a discharge path for electric charge accumulated in the insulating film 4020. Alternatively, the conductive film 4024 and the insulating film 4020 can be included as components of the transistor 4022, and the conductive film 4024 can function as a back gate.

An insulating film 4025 is provided over the insulating film 4020, the first electrode 4021, and the conductive film 4024. The insulating film 4025 preferably has a high effect of blocking diffusion of water, hydrogen, and the like. As the insulating film 4025, a silicon nitride film, a silicon nitride oxide film, or the like can be used.

As illustrated in FIGS. 13B and 13C, in one embodiment of the present invention, the insulating film 4020 is removed at an end portion of the panel. The insulating film 4025 over the insulating film 4020 is in contact with an insulating film 4026 functioning as a gate insulating film of each of the transistors 4010 and 4022 between the sealant 4005 and the substrate 4001.

In the case where the insulating film 4025 and the insulating film 4026 each have a high effect of blocking diffusion of water, hydrogen, and the like, when the insulating film 4025 is in contact with the insulating film 4026 at an end portion of the panel, entry of water, hydrogen, and the like from the end portion of the panel or the sealant 4005 into semiconductor films of the transistors 4010 and 4022 can be prevented.

A second electrode 4027 of the liquid crystal element 4023 is provided over the insulating film 4025. A liquid crystal layer 4028 is provided between the second electrode 4027 and the insulating film 4025, and the substrate 4006. The liquid crystal element 4023 includes the first electrode 4021, the second electrode 4027, and the liquid crystal layer 4028.

In the liquid crystal display device according to one embodiment of the present invention, the liquid crystal layer can be formed using, for example, a liquid crystal material classified into a thermotropic liquid crystal or a lyotropic liquid crystal. Alternatively, the liquid crystal layer can be formed using, for example, a liquid crystal material classified into a nematic liquid crystal, a smectic liquid crystal, a cholesteric liquid crystal, or a discotic liquid crystal. Alternatively, the liquid crystal layer can be formed using, for example, a liquid crystal material classified into a ferroelectric liquid crystal or an anti-ferroelectric liquid crystal. Alternatively, the liquid crystal layer can be formed using, for example, a liquid crystal material classified into a high-molecular liquid crystal such as a main-chain high-molecular liquid crystal, a side-chain high-molecular liquid crystal, or a composite-type high-molecular liquid crystal, or a low-molecular liquid crystal. Alternatively, the liquid crystal layer can be formed using, for example, a liquid crystal material classified into a polymer dispersed liquid crystal (PDLC).

Alternatively, a liquid crystal exhibiting a blue phase for which an alignment film is not used may be used for the liquid crystal layer. A blue phase is one of liquid crystal phases that is generated just before a cholesteric phase changes into an isotropic phase while the temperature of a cholesteric liquid crystal is increased. Since the blue phase is only generated within a narrow range of temperature, a chiral material or an ultraviolet curable resin is added so that the temperature range is improved. A liquid crystal composition including a liquid crystal exhibiting a blue phase and a chiral material is preferable because it has a short response time of 1 ms or less, and is optically isotropic, which makes the alignment process unneeded and viewing angle dependence small.

Although a fringe field switching (FFS) mode is used as a method for driving the liquid crystal in this embodiment, the following can be used as a method for driving the liquid crystal: a twisted nematic (TN) mode, a super twisted nematic (STN) mode, a vertical alignment (VA) mode, a multi-domain vertical alignment (MVA) mode, an in-plane-switching (IPS) mode, an optically compensated birefringence (OCB) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, and the like.

In particular, in the case of a horizontal electric field-mode liquid crystal display device, the amplitude of a potential applied to a scan line tends to be larger than that in a liquid crystal display device with a different mode. Thus, in the case of a horizontal electric field-mode liquid crystal display device, electrical characteristics of a transistor included in a pulse output circuit easily deteriorate. Accordingly, one embodiment of the present invention is more effective in increasing the reliability of a horizontal electric field-mode liquid crystal display device such as an FFS-mode liquid crystal display device, a blue phase-mode liquid crystal display device, or an IPS-mode liquid crystal display device.

In the liquid crystal element 4023, alignment of liquid crystal molecules included in the liquid crystal layer 4028 is changed in accordance with the level of voltage applied between the first electrode 4021 and the second electrode 4027, so that transmittance is changed. Accordingly, when the transmittance of the liquid crystal element 4023 is controlled by the potential of an image signal input to the first electrode 4021, gradation can be expressed.

The liquid crystal display device according to one embodiment of the present invention may display a color image by using a color filter or may display a color image by sequentially turning on a plurality of light sources whose hues are different from each other.

Image signals from the signal line driver circuit 4003 and a variety of control signals and power supply potentials from an FPC 4018 are supplied to the scan line driver circuit 4004 or the pixel portion 4002 through lead wirings 4030 and 4031.

This embodiment can be combined with any of the other embodiments as appropriate.

Embodiment 4

Figure 14:
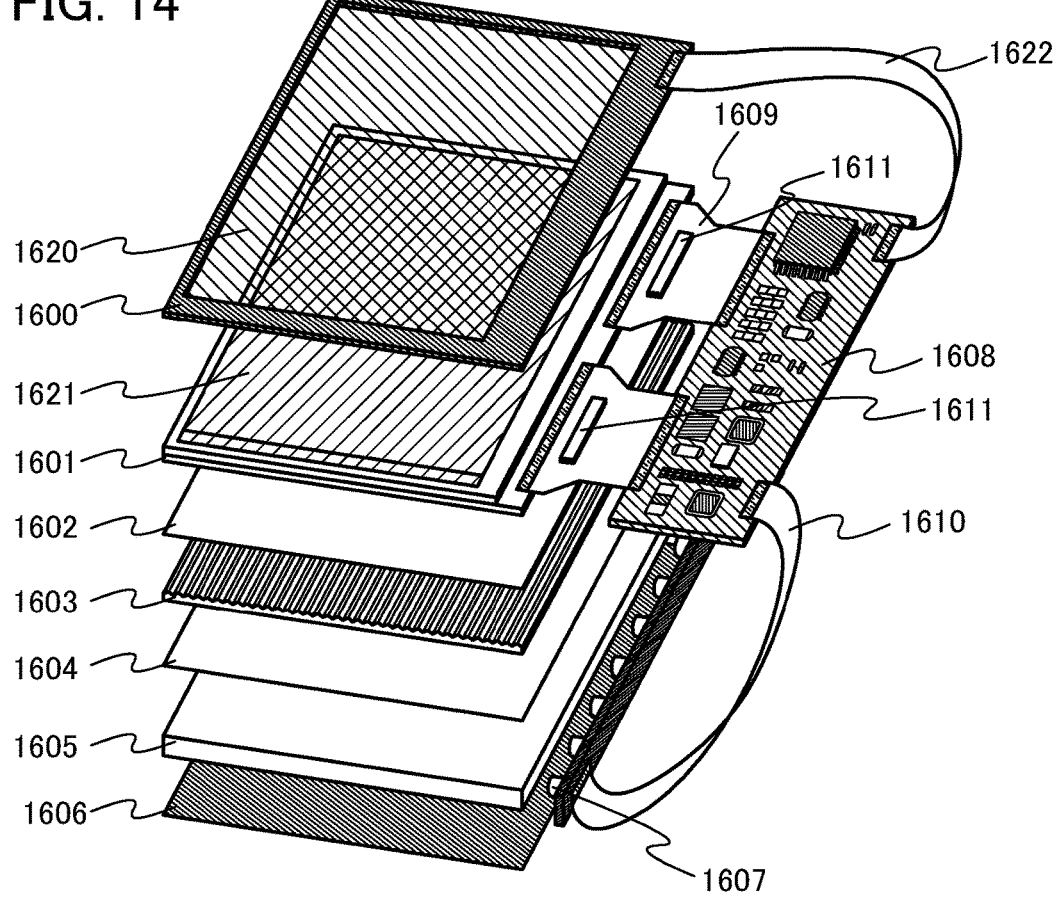
FIG. 14 is a perspective view illustrating a structure of a semiconductor display device.

Next, FIG. 14 is an example of a perspective view illustrating the structure of a liquid crystal display device according to one embodiment of the present invention. The liquid crystal display device in FIG. 14 includes a touch panel 1600, a panel 1601, a first diffuser plate 1602, a prism sheet 1603, a second diffuser plate 1604, a light guide plate 1605, a reflector 1606, a backlight 1607, a circuit board 1608, and substrates 1611 provided with signal line driver circuits.

The touch panel 1600, the panel 1601, the first diffuser plate 1602, the prism sheet 1603, the second diffuser plate 1604, the light guide plate 1605, and the reflector 1606 are sequentially stacked. The backlight 1607 is provided at an end portion of the light guide plate 1605. Light from the backlight 1607 that is diffused into the light guide plate 1605 is uniformly delivered to the panel 1601 with the first diffuser plate 1602, the prism sheet 1603, and the second diffuser plate 1604.

The touch panel 1600 includes a position detection portion 1620. The position detection portion 1620 is provided to overlap with a pixel portion 1621 included in the panel 1601. When a finger, a stylus, or the like touches or gets close to the position detection portion 1620, a signal including the positional information is generated. The position in the position detection portion 1620 can be detected by any of various systems such as a resistive system, a capacitive system, an ultrasonic system, an optical system including an infrared ray system, and an electromagnetic induction system.

Note that in the liquid crystal display device in FIG. 14, the touch panel 1600 is provided between the panel 1601 and the user. In that case, when the position detection portion 1620 of the touch panel 1600 has light-transmitting properties, the user can see an image in the pixel portion 1621 through the position detection portion 1620. Note that the touch panel 1600 is not necessarily provided between the panel 1601 and the user. For example, in the case where the touch panel 1600 is of an electromagnetic induction system, the panel 1601 may be provided between the user and the touch panel 1600.

Although the first diffuser plate 1602 and the second diffuser plate 1604 are used in this embodiment, the number of diffuser plates is not limited thereto. The number of diffuser plates may be one, or may be three or more. The diffuser plate may be provided between the light guide plate 1605 and the panel 1601. Thus, the diffuser plate may be provided only on the side closer to the panel 1601 than the prism sheet 1603, or may be provided only on the side closer to the light guide plate 1605 than the prism sheet 1603.

The shape of the prism sheet 1603 is not limited to a sawtooth shape in the section in FIG. 14, and may be a shape with which light from the light guide plate 1605 can be concentrated on the panel 1601 side.

The circuit board 1608 is provided with a control circuit for the touch panel, a CPU, a controller, a control circuit that controls driving of the backlight 1607, and the like. In FIG. 14, the circuit board 1608 and the panel 1601 are connected to each other with a COF tape 1609. Further, the substrates 1611 provided with the signal line driver circuits are connected to the COF tapes 1609 by a chip on film (COF) method. In addition, the circuit board 1608 and the touch panel 1600 are connected to each other through an FPC 1622.

In FIG. 14, the control circuit that controls driving of the backlight 1607 is connected to the backlight 1607 through an FPC 1610. However, the control circuit may be formed in the panel 1601. In that case, the panel 1601 is connected to the backlight 1607 through an FPC or the like.

Note that although FIG. 14 illustrates an edge-light type backlight where the backlight 1607 is provided on the edge of the panel 1601, the liquid crystal display device of the present invention may be a direct-type in which the backlight 1607 is provided directly below the panel 1601.

This embodiment can be combined with any of the other embodiments as appropriate.

Embodiment 5

A semiconductor device according to one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the semiconductor device according to one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 15A to 15D illustrate specific examples of these electronic devices.

Figure 15A:
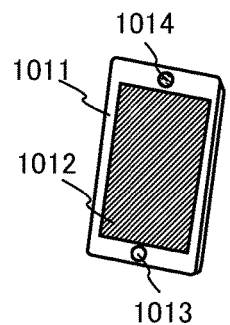
FIGS. 15A to 15D each illustrate an electronic device.

An electronic device in FIG. 15A is an example of a portable information terminal.

The electronic device in FIG. 15A includes a housing 1011, a panel 1012 incorporated in the housing 1011, a button 1013, and a speaker 1014.

The housing 1011 may be provided with a connection terminal for connecting the electronic device to an external device and a button for operating the electronic device.

The panel 1012 may be formed using the display device in Embodiment 2.

The panel 1012 may be a touch panel. Thus, touch detection can be performed on the panel 1012.

The button 1013 is provided for the housing 1011. When the button 1013 is a power button, for example, pressing the button 1013 can turn on or off the electronic device.

The speaker 1014 is provided for the housing 1011. The speaker 1014 outputs sound.

Note that the housing 1011 may be provided with a microphone, in which case the electronic device in FIG. 15A can function as a telephone, for example.

The electronic device in FIG. 15A functions as one or more of a telephone, an e-book reader, a personal computer, and a game machine, for example.

Figure 15B:
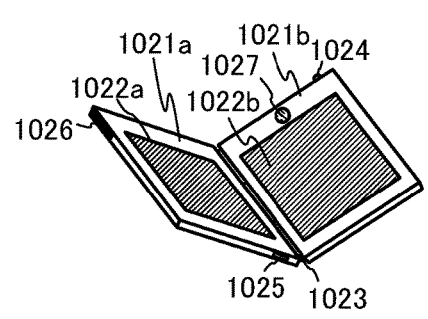

The electronic device in FIG. 15B is an example of a foldable information terminal.

The electronic device in FIG. 15B includes a housing 1021a, a housing 1021b, a panel 1022a incorporated in the housing 1021a, a panel 1022b incorporated in the housing 1021b, a hinge 1023, a button 1024, a connection terminal 1025, a storage medium insertion portion 1026, and a speaker 1027.

The housing 1021a and the housing 1021b are connected to each other by the hinge 1023.

The panels 1022a and 1022b may be formed using the display device in Embodiment 2.

The panels 1022a and 1022b may be touch panels. Thus, touch detection can be performed on the panels 1022a and 1022b.

Since the electronic device in FIG. 15B includes the hinge 1023, it can be folded so that the panels 1022a and 1022b face each other.

The button 1024 is provided for the housing 1021b. Note that the housing 1021a may be provided with the button 1024. For example, when the button 1024 that functions as a power button is provided and pressed, supply of power supply voltage to the electronic device can be controlled.

The connection terminal 1025 is provided for the housing 1021a. Note that the connection terminal 1025 may be provided for the housing 1021b. Alternatively, the plurality of connection terminals 1025 may be provided for either one or both the housings 1021a and 1021b. The connection terminal 1025 is a terminal for connecting the electronic device in FIG. 15B to another device.

The storage media insertion portion 1026 is provided for the housing 1021a. The storage medium insertion portion 1026 may be provided for the housing 1021b. Alternatively, the plurality of storage medium insertion portions 1026 may be provided for either one or both the housings 1021a and 1021b. For example, a card-type recording medium is inserted into the recording medium insertion portion so that data can be read to the electronic device from the card-type recording medium or data stored in the electronic device can be written to the card-type recording medium.

The speaker 1027 is provided for the housing 1021b. The speaker 1027 outputs sound. Note that the speaker 1027 may be provided for the housing 1021a.

Note that the housing 1021a or the housing 1021b may be provided with a microphone. The housing 1021a or the housing 1021b may be provided with a microphone, in which case the electronic device in FIG. 15B can function as a telephone, for example.

The electronic device in FIG. 15B functions as one or more of a telephone, an e-book reader, a personal computer, and a game machine, for example.

Figure 15C:
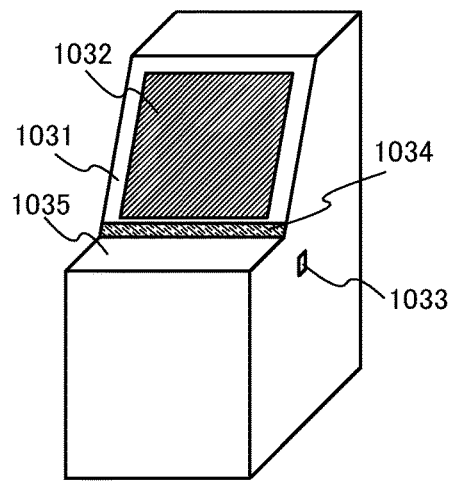

The electronic device in FIG. 15C is an example of a stationary information terminal. The stationary information terminal in FIG. 15C includes a housing 1031, a panel 1032 incorporated in the housing 1031, a button 1033, and a speaker 1034.

The panel 1032 may be formed using the display device in Embodiment 2.

The panel 1032 may be a touch panel. Thus, touch detection can be performed on the panel 1032.

Note that a panel that is similar to the panel 1032 may be provided for a deck portion 1035 of the housing 1031.

The housing 1031 may be provided with one or more of a ticket slot from which a ticket or the like is dispensed, a coin slot, a bill slot, and the like.

The button 1033 is provided for the housing 1031. For example, when the button 1033 is a power button, supply of power supply voltage to the electronic device can be controlled by pressing the button 1033.

The speaker 1034 is provided for the housing 1031. The speaker 1034 outputs sound.

The electronic device in FIG. 15C functions as an automated teller machine, an information communication terminal (also referred to as a multimedia station) for ordering a ticket or the like, or a game machine, for example.

Figure 15D:
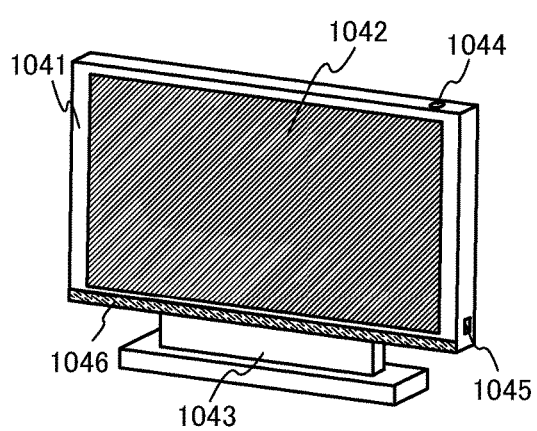

FIG. 15D is an example of a stationary information terminal. The electronic device in FIG. 15D includes a housing 1041, a panel 1042 incorporated in the housing 1041, a support 1043 supporting the housing 1041, a button 1044, a connection terminal 1045, and a speaker 1046.

Note that a connection terminal for connecting the housing 1041 to an external device may be provided.

The panel 1042 may be formed using the display device in Embodiment 2.

The panel 1042 may be a touch panel. Thus, touch detection can be performed on the panel 1042.

The button 1044 is provided for the housing 1041. For example, when the button 1044 is a power button, supply of power supply voltage to the electronic device can be controlled by pressing the button 1044.

The connection terminal 1045 is provided for the housing 1041. The connection terminal 1045 is a terminal for connecting the electronic device in FIG. 15D to another device. For example, when the electronic device in FIG. 15D and a personal computer are connected by the connection terminal 1045, the panel 1042 can display an image corresponding to a data signal input from the personal computer. For example, when the panel 1042 of the electronic device in FIG. 15D is larger than a panel of an electronic device connected thereto, a displayed image of the electronic device can be enlarged, in which case a plurality of viewers can easily recognize the image at the same time.

The speaker 1046 is provided for the housing 1041. The speaker 1046 outputs sound.

The electronic device in FIG. 15D functions as one or more of an output monitor, a personal computer, and a television set, for example.

The above is the description of the electronic devices in FIGS. 15A to 15D.

As described with reference to FIGS. 15A to 15D, the use of a semiconductor device according to one embodiment of the present invention for the electronic device in this embodiment can provide a highly reliable electronic device.

Example 1

In this example, evaluation results of a silicon nitride film that can be applied to a transistor according to one embodiment of the present invention are described. Specifically, evaluation results of the amount of hydrogen molecules released by heating, the amount of ammonia molecules released by heating, and the amount of water molecules released by heating are described.

First, a method for forming samples to be evaluated is described. The formed samples have a structure 1 and a structure 2.

Figure 16A:
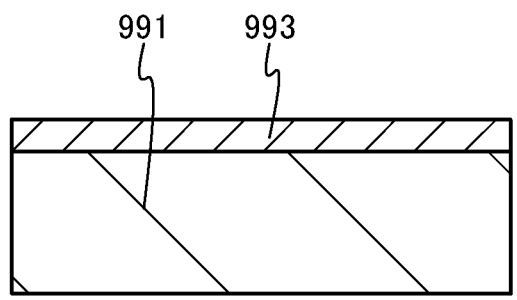
FIGS. 16A and 16B each illustrate a structure used for a sample.

The structure 1 was formed by forming a silicon nitride film 993 over a silicon wafer 991 by plasma-enhanced CVD in a deposition condition that can be applied to the insulating film 26 formed using silicon nitride described in Embodiment 2 (see FIG. 16A).

The silicon nitride film 993 was formed in conditions 1 to 3, and samples formed in the conditions 1 to 3 were used as samples A1 to A3. Note that in each of the samples A1 to A3, the thickness of the silicon nitride film 993 was 50 nm.

In the condition 1, the temperature at which the silicon wafer 991 is held is 220° C., silane with a flow rate of 50 sccm, nitrogen with a flow rate of 5000 sccm, and ammonia with a flow rate of 100 sccm are used as source gases, the pressure in a treatment chamber is 200 Pa, and a high-frequency power of 1000 W (a power density of $1.6 \times 10^{-1}$ W/cm$^2$) at 27.12 MHz is supplied to parallel plate electrodes. Note that the ratio of the flow rate of nitrogen to the flow rate of ammonia is 50.

The condition 2 differs from the condition 1 in that the high-frequency power supplied to parallel plate electrodes is 150 W (a power density of $2.5 \times 10^{-2}$ W/cm$^2$).

In the condition 3, the temperature at which the silicon wafer 991 is held is 220° C., silane with a flow rate of 30 sccm, nitrogen with a flow rate of 1500 sccm, and ammonia with a flow rate of 1500 sccm are used as source gases, the pressure in the treatment chamber is 200 Pa, and a high-frequency power of 150 W (a power density of $2.5 \times 10^{-2}$ W/cm$^2$) at 27.12 MHz is supplied to parallel plate electrodes. Note that the ratio of the flow rate of nitrogen to the flow rate of ammonia is 1.

TDS analysis was performed on the samples A1 to A3.

The peaks of curves obtained from TDS analysis appear due to release of atoms or molecules contained in the analyzed samples (in this example, the samples A1 to A3) to the outside. Note that the total amount of atoms or molecules released to the outside corresponds to the integral value of the peak. Thus, the total amount of atoms or molecules contained in the silicon nitride film 993 can be evaluated by the height of peak intensity.

Figure 17A:
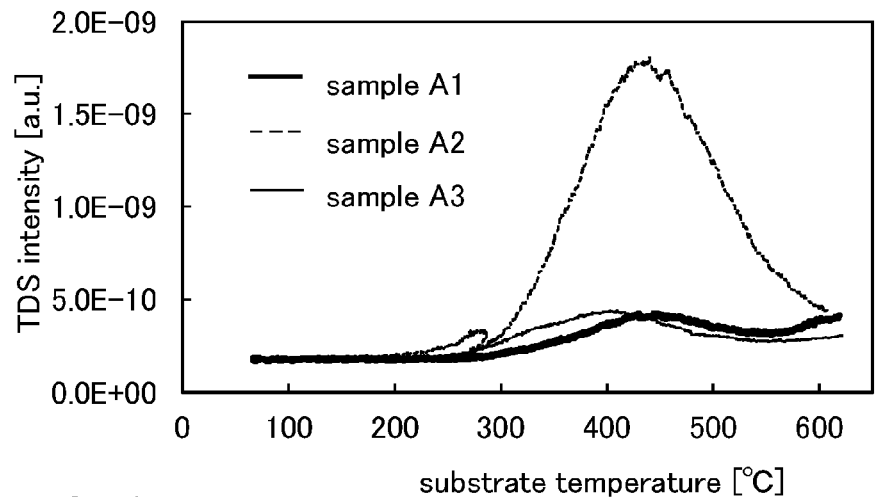
FIGS. 17A to 17C show TDS analysis results.
Figure 17B:
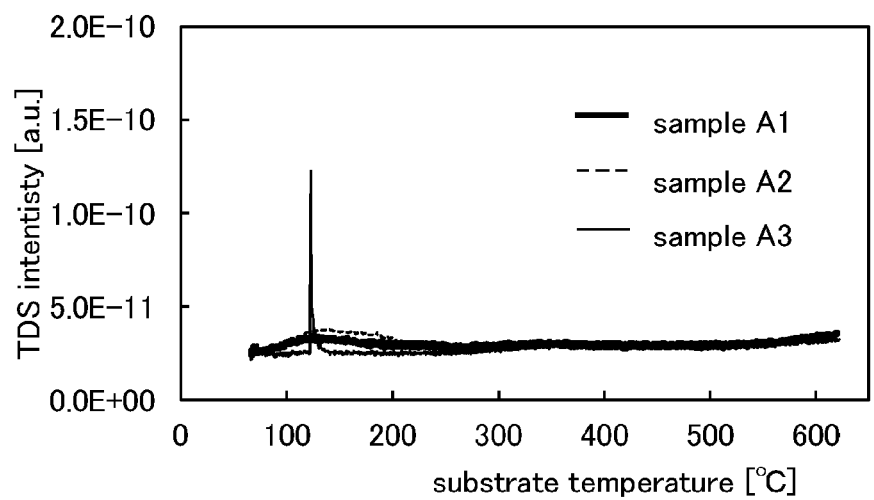
Figure 17C:
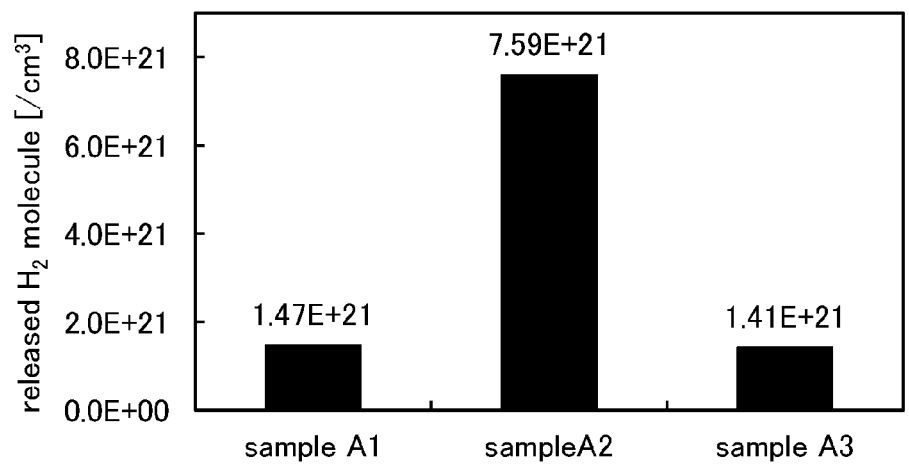
Figure 18A:
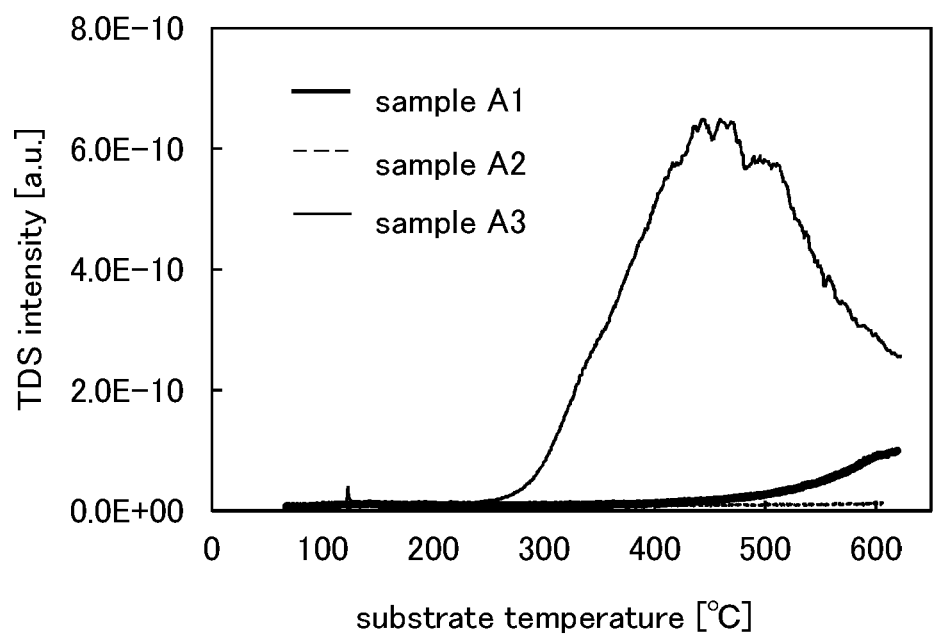
FIGS. 18A and 18B show TDS analysis results.
Figure 18B:
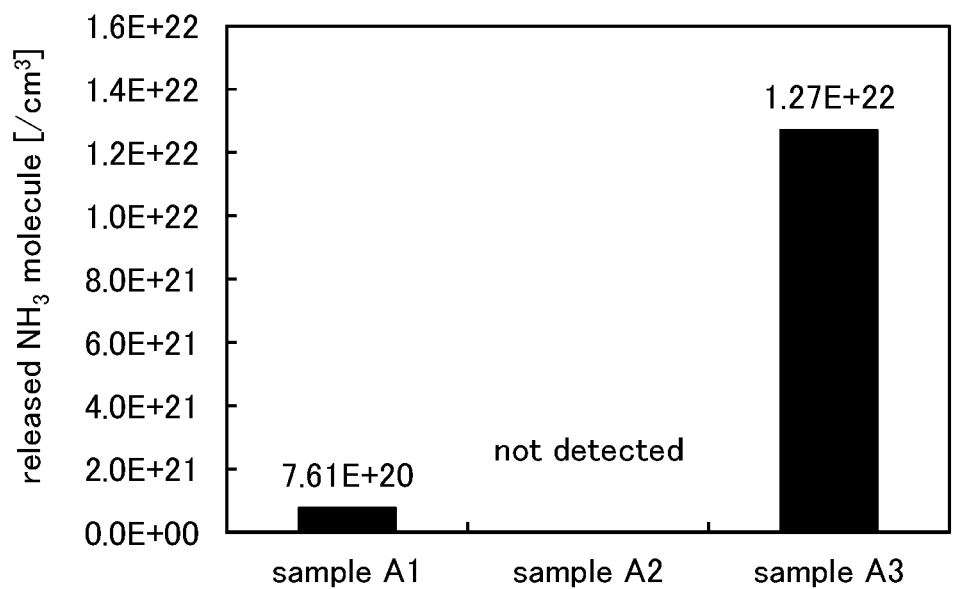

FIGS. 17A to 17C and FIGS. 18A and 18B show the results obtained from TDS analysis performed on the samples A1 to A3. FIG. 17A is a graph showing the amount of released hydrogen molecules versus the substrate temperature. FIG. 17B is a graph showing the amount of released water molecules versus the substrate temperature. FIG. 17C is a graph showing the amount of released hydrogen molecules calculated from the integral values of curve peaks in FIG. 17A. FIG. 18A is a graph showing the amount of released ammonia molecules versus the substrate temperature. FIG. 18B is a graph showing the amount of released ammonia molecules calculated from the integral values of curve peaks in FIG. 18A. Note that in the TDS analysis, the detection limit of hydrogen molecules is $1.0 \times 10^{21}$ molecule/cm$^3$ or less, and the detection limit of ammonia molecules is $2.0 \times 10^{20}$ molecule/cm$^3$.

FIG. 17A shows that the sample A2 has higher hydrogen molecule TDS intensity than the samples A1 and A3. FIG. 17C shows that the amount of released hydrogen molecules versus the substrate temperature in the sample A2 is approximately five times those of the samples A1 and A3. FIG. 17B shows that the samples A1 to A3 each have a peak indicating release of water molecules at a substrate temperature of 100 to 200° C. Note that only the sample A3 has a sharp peak in the above range.

FIG. 18A shows that the sample A3 has higher ammonia molecule TDS intensity than the samples A1 and A2. FIG. 18B shows that the amount of released ammonia molecules versus the substrate temperature in the sample A3 is at least approximately 16 or more times those of the samples A1 and A2. Note that the amount of released ammonia molecules in the sample A2 is lower than or equal to the detection limit.

Figure 16B:
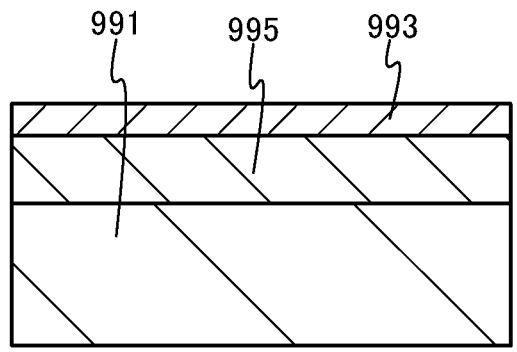

Next, among the samples formed, the structure 2 is described. The structure 2 was formed by forming a silicon oxynitride film 995 over the silicon wafer 991 by plasma-enhanced CVD in a formation condition that can be applied to the insulating film 24 formed using silicon oxynitride described in Embodiment 2 and forming the silicon nitride film 993 over the silicon oxynitride film 995 like the structure 1 (see FIG. 16B).

Figure 20A:
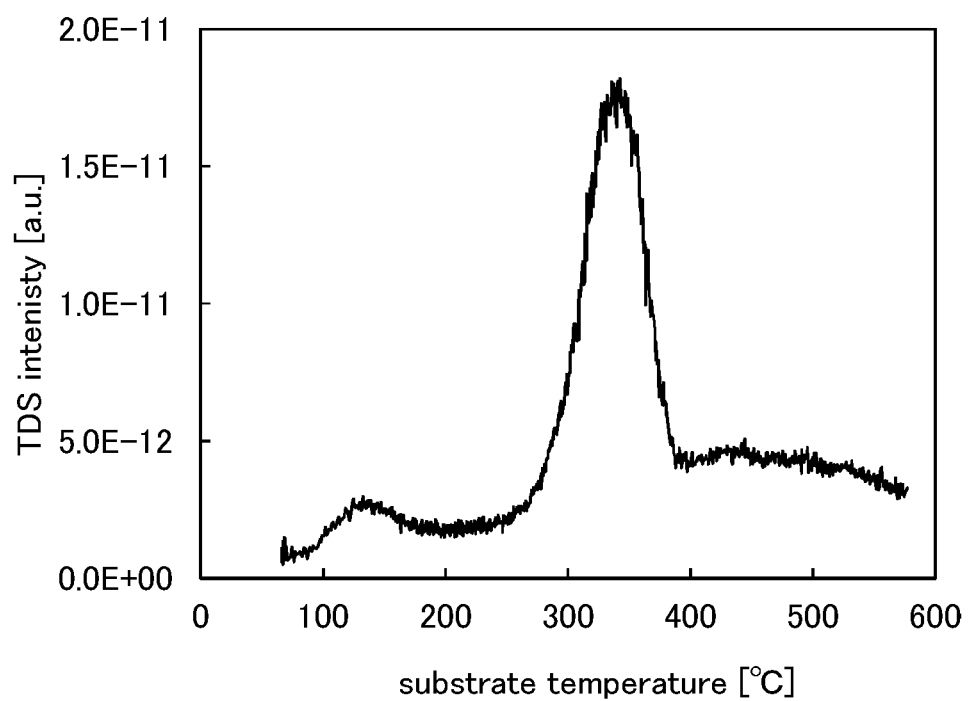
FIGS. 20A and 20B show TDS analysis results.
Figure 20B:
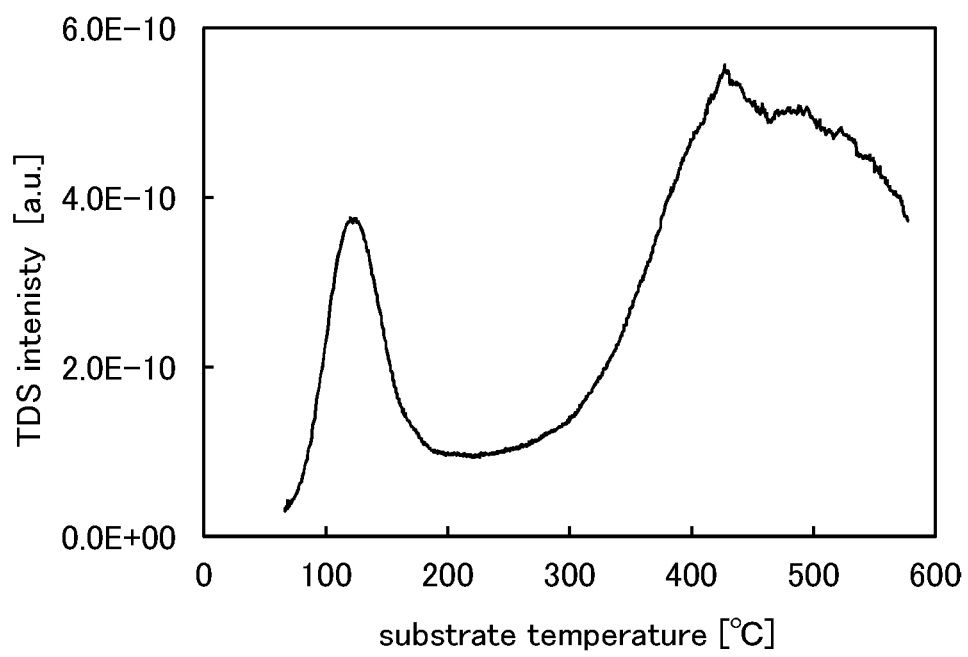

In order to evaluate an effect of inhibiting movement of water in the silicon nitride film 993 in the structure 2, the silicon oxynitride film 995 was a silicon oxynitride film containing oxygen at a higher proportion than the stoichiometric composition. Here, FIGS. 20A and 20B show the results obtained from TDS analysis performed on a sample in which only a silicon oxynitride film is formed over a silicon wafer. FIG. 20A is a graph showing the amount of released oxygen molecules versus the substrate temperature. FIG. 20B is a graph showing the amount of released water molecules versus the substrate temperature. The silicon oxynitride film containing oxygen at a higher proportion than the stoichiometric composition contains water (see FIG. 20B) in addition to oxygen (see FIG. 20A). Thus, in samples A4 to A6, by evaluating the amount of released water molecules versus the substrate temperature, it is possible to evaluate whether the silicon nitride film 993 has an effect of inhibiting movement of water.

In the condition for forming the silicon oxynitride film 995, the temperature at which the silicon wafer 991 is held is 220° C., silane with a flow rate of 160 sccm and nitrogen monoxide with a flow rate of 4000 sccm are used as source gases, the pressure in the treatment chamber is 200 Pa, and a high-frequency power of 1500 W (a power density of $2.5 \times 10^{-1}$ W/cm$^2$) at 27.12 MHz is supplied to parallel plate electrodes. The thickness of the silicon oxynitride film 995 was 400 nm.

In the structure 2, the silicon nitride film 993 was formed in the conditions 1 to 3, and samples formed in the conditions 1 to 3 were used as the samples A4 to A6. Note that in each of the samples A4 to A6, the thickness of the silicon nitride film 993 was 50 nm. The details of the conditions 1 to 3 are the same as those in the structure 1.

In order to evaluate an effect of inhibiting movement of water in the structure 2, TDS analysis was performed on the samples A4 to A6.

Figure 19A:
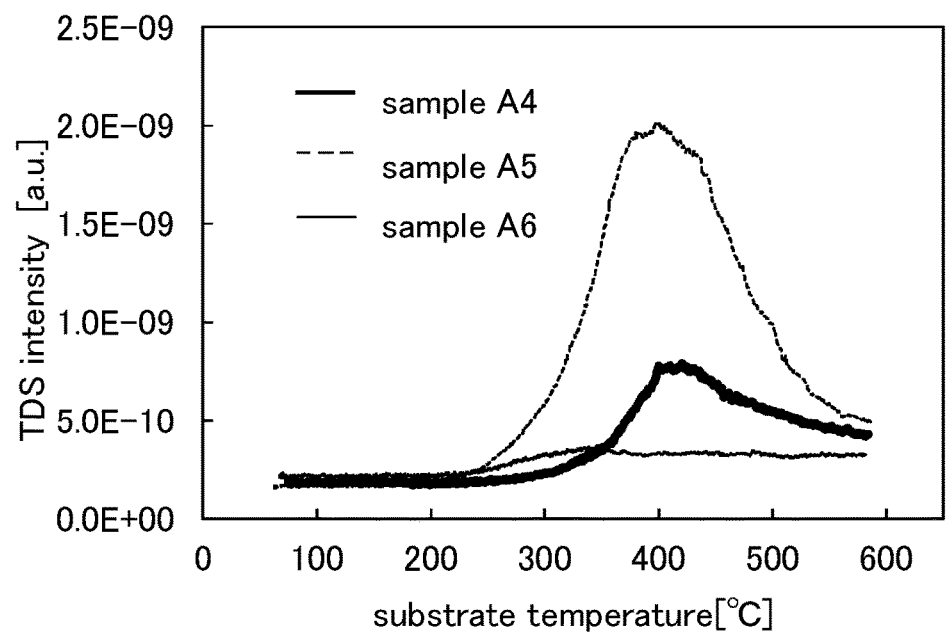
FIGS. 19A and 19B show TDS analysis results.
Figure 19B:
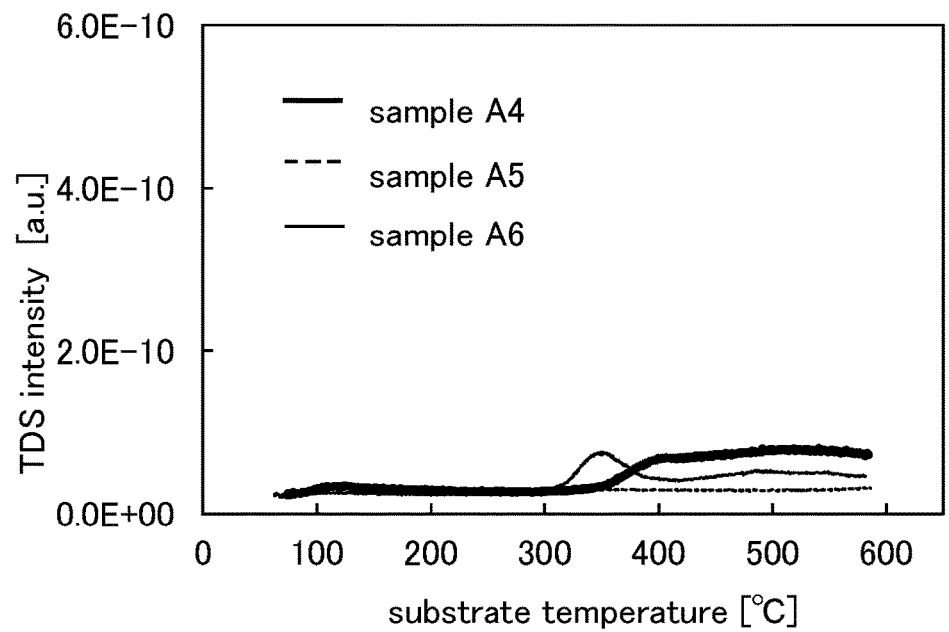

FIGS. 19A and 19B show the results obtained from the TDS analysis performed on the samples A4 to A6. FIG. 19A is a graph showing the amount of released hydrogen molecules versus the substrate temperature. FIG. 19B is a graph showing the amount of released water molecules versus the substrate temperature.

FIG. 19A shows that the sample A5 has higher hydrogen molecule TDS intensity than the samples A4 and A6. From FIG. 19B, it can be seen that water molecule TDS intensity has a weak peak, but the samples A4 to A6 do not have a significant difference.

In the structure 2, the samples A4 to A6 each have extremely low intensity of a peak indicating release of water molecules, though the samples A4 to A6 each include the silicon oxynitride film 995 containing water. Thus, it can be said that the conditions for the samples A4 to A6 are conditions where an insulating film having an effect of inhibiting movement of water can be formed.

However, the sample A2 including the silicon nitride film formed in the same condition as the sample A5 has a large amount of released hydrogen molecules, and the sample A3 has a large amount of released ammonia molecules. When an oxide semiconductor film of a transistor including an oxide semiconductor contains hydrogen and nitrogen, electrons that serve as carriers are generated in the oxide semiconductor film, so that the transistor becomes normally on. Thus, a hydrogen molecule and an ammonia molecule that is a supply source of nitrogen are impurities that vary the electrical characteristics of the transistor. For example, an insulating film having a large amount of released ammonia molecules like the sample A3 means an insulating film having a large number of supply sources of nitrogen. By forming such an insulating film over a transistor or forming such an insulating film as a gate insulating film of a transistor, the transistor becomes normally on.

Thus, by providing a silicon nitride film having a small amount of released hydrogen molecules and a small amount of released ammonia molecules over the transistor including the oxide semiconductor film, like the silicon nitride film formed in the condition 1 in the samples A1 and A4, it is possible to form a transistor whose electrical characteristics are hardly varied or a transistor with higher reliability. Further, by providing a silicon nitride film having a small amount of released hydrogen molecules and a small amount of released ammonia molecules as the gate insulating film of the transistor including the oxide semiconductor film, like the silicon nitride film formed in the condition 1 in the samples A1 and A4, it is possible to form a transistor whose electrical characteristics are hardly varied or a transistor with higher reliability.

Next, a transistor including a silicon nitride film formed in the conditions 1 to 3 was formed, and Vg-Id characteristics were measured.

First, steps of forming transistors included in samples B1 to B3 are described. In this example, the steps are described with reference to FIGS. 10A to 10D and FIG. 11.

First, as illustrated in FIG. 10A, a glass substrate was used as the substrate 11, and the conductive film 15 was formed over the substrate 11.

A 100 nm-thick tungsten film was formed by sputtering, a mask was formed over the tungsten film by a photolithography process, and part of the tungsten film was etched using the mask, so that the conductive film 15 functioning as a gate was formed.

Next, the insulating film 18 was formed over the conductive film 15.

As the gate insulating film, a stacked layer including a 50-nm-thick silicon nitride film and a 200-nm-thick silicon oxynitride film was formed. The silicon nitride film was formed in the following manner: silane and nitrogen were supplied at 50 sccm and 5000 sccm, respectively, into a treatment chamber of a plasma-enhanced CVD apparatus; the pressure of the treatment chamber was adjusted to 60 Pa; and a power of 150 W was supplied with a high-frequency power supply of 27.12 MHz. The silicon oxynitride film was formed in the following manner: silane and dinitrogen monoxide were supplied at 20 sccm and 3000 sccm, respectively, into the treatment chamber of the plasma-enhanced CVD apparatus; the pressure of the treatment chamber was adjusted to 40 Pa; and a power of 100 W was supplied with a high-frequency power supply of 27.12 MHz. Note that each of the silicon nitride film and the silicon oxynitride film was formed at a substrate temperature of 350° C.

Next, the oxide semiconductor film 19 overlapping with the conductive film 15 with the insulating film 18 provided therebetween was formed.

Here, an IGZO film which is a CAAC-OS film was formed over the insulating film 18 by sputtering, a mask was formed over the IGZO film by a photolithography process, and the IGZO film was partly etched using the mask. Then, the etched IGZO film was subjected to heat treatment, so that the oxide semiconductor film 19 was formed. Note that the thickness of the IGZO film formed in this example was 35 nm.

The IGZO film was formed in such a manner that a sputtering target where In:Ga:Zn=1:1:1 (atomic ratio) was used, argon and oxygen were supplied as a sputtering gas into a reaction chamber of a sputtering apparatus at a flow rate of 50 sccm for each, and deposition was performed at a DC power of 5 kW with the pressure in the reaction chamber adjusted to 0.6 Pa. Note that the IGZO film was formed at a substrate temperature of 170° C.

Next, heat treatment was performed to release water, hydrogen, and the like contained in the oxide semiconductor film. Here, heat treatment was performed at 450° C. for one hour in a nitrogen atmosphere, and then heat treatment was performed at 450° C. for one hour in an atmosphere of nitrogen and oxygen.

For the structure obtained through the steps up to here, FIG. 10B can be referred to.

Next, after the insulating film 18 was partly etched to expose a gate electrode (not illustrated), the pair of conductive films 21 that is in contact with the oxide semiconductor film 19 was formed, as illustrated in FIG. 10C.

A conductive film was formed over the insulating film 18 and the oxide semiconductor film 19, a mask was formed over the conductive film by a photolithography process, and the conductive film was partly etched using the mask, so that the pair of conductive films 21 was formed. Note that as the conductive film, a 400-nm-thick aluminum film was formed over a 50-nm-thick tungsten film, and a 100-nm-thick titanium film was formed over the aluminum film.

Next, the substrate was moved to a treatment chamber in a reduced pressure and heated at 220° C., and then moved to a treatment chamber filled with dinitrogen monoxide. Then, the oxide semiconductor film 19 was exposed to oxygen plasma which is generated in such a manner that an upper electrode provided in the treatment chamber is supplied with a high-frequency power of 150 W with the use of a high-frequency power supply of 27.12 MHz.

Next, as illustrated in FIG. 10D, after the plasma treatment, a 50-nm-thick first silicon oxynitride film and a 400-nm-thick second silicon oxynitride film were sequentially stacked over the oxide semiconductor film 19 and the pair of conductive films 21 without exposure to the atmosphere as the insulating film 23 and the insulating film 24.

The first silicon oxynitride film was formed by plasma-enhanced CVD under the following conditions: silane with a flow rate of 30 sccm and dinitrogen monoxide with a flow rate of 4000 sccm were used as source gases, the pressure in a treatment chamber was 40 Pa, the substrate temperature was 220° C., and a high-frequency power of 150 W was supplied to parallel plate electrodes.

The second silicon oxynitride film was formed by plasma-enhanced CVD under the following conditions: silane with a flow rate of 160 sccm and dinitrogen monoxide with a flow rate of 4000 sccm were used as source gases, the pressure in a treatment chamber was 200 Pa, the substrate temperature was 220° C., and a high-frequency power of 1500 W was supplied to parallel plate electrodes. Under the conditions, it is possible to form a silicon oxynitride film which contains oxygen at a higher proportion than the stoichiometric composition and from which part of oxygen is released by heating.

Next, heat treatment was performed to release water, hydrogen, and the like from the insulating film 23. Here, the heat treatment was performed at 350° C. for one hour in an atmosphere of nitrogen and oxygen.

Then, as illustrated in FIG. 11, the insulating film 26 was formed over the insulating film 24.

In the sample B1, a silicon nitride film was formed as the insulating film 26 in the condition 1 of the sample A1.

In the sample B2, a silicon nitride film was formed as the insulating film 26 in the condition 2 of the sample A2.

In the sample B3, a silicon nitride film was formed as the insulating film 26 in the condition 3 of the sample A3.

Next, although not illustrated, the insulating film 23, the insulating film 24, and the insulating film 26 were partly etched, so that an opening through which the pair of conductive films 21 is partly exposed was formed.

Next, a planarization film (not illustrated) was formed over the insulating film 26. Here, the insulating film 26 was coated with a composition, and exposure and development were performed, so that a planarization film having an opening through which the pair of conductive films 21 is partly exposed was formed. Note that a 1.5-µm-thick acrylic resin was formed as the planarization film. Then, heat treatment was performed. The heat treatment was performed at a temperature of 250° C. for one hour in an atmosphere containing nitrogen.

Next, a conductive film connected to part of the pair of conductive films 21 was formed (not illustrated). Here, a 100-nm-thick ITO film containing silicon oxide was formed by sputtering.

Through the above steps, the transistors included in the samples B1 to B3 were formed.

Next, the Vg-Id characteristics of the transistors included in the samples B1 to B3 were measured.

Then, a pressure cooker test (PCT) was performed as an accelerated life test to evaluate moisture resistance. In the PCT in this example, the samples B1 to B3 were held for 15 hours under the following conditions: the temperature was 130° C., the humidity was 85%, and the pressure was 0.23 MPa.

FIGS. 21A to 21C, FIGS. 22A to 22C, and FIGS. 23A to 23C show the initial Vg-Id characteristics of the transistors included in the samples B1 to B3 and the Vg-Id characteristics of the transistors included in the samples B1 to B3 after the PCT.

Note that in each sample, the Vg-Id characteristics of a transistor 1 with a channel length L of 2 µm and a channel width W of 50 µm and a transistor 2 with a channel length L of 6 µm and a channel width W of 50 µm were measured.

Figure 21A:
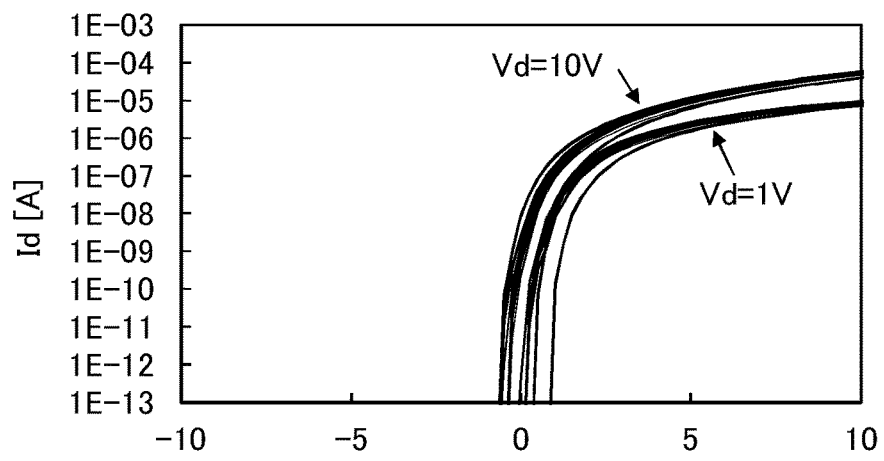
FIGS. 21A to 21C each show Vg-Id characteristics of a transistor.
Figure 21B:
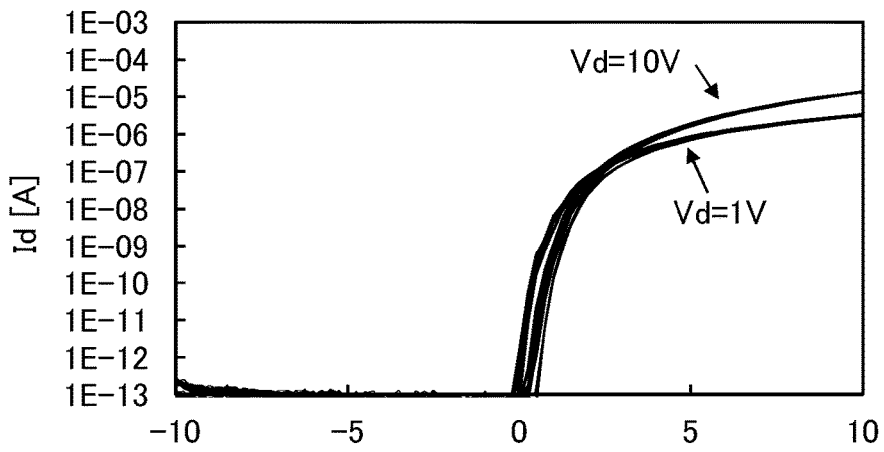
Figure 21C:
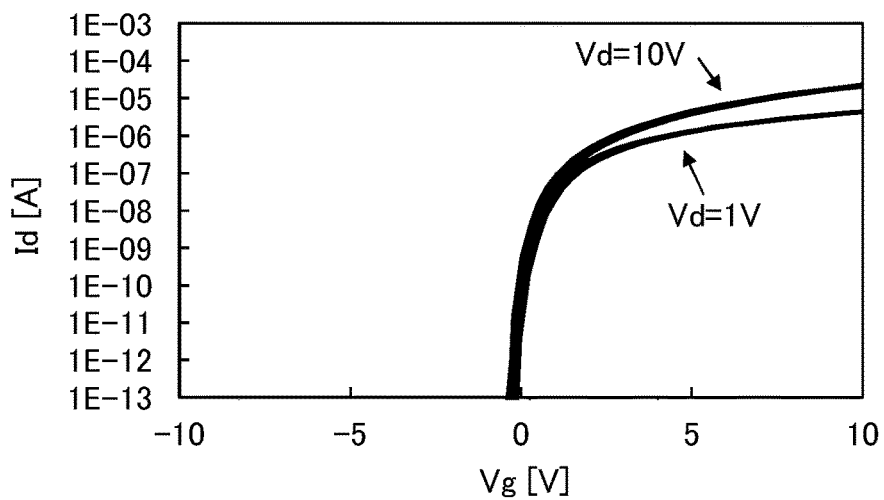
Figure 22A:
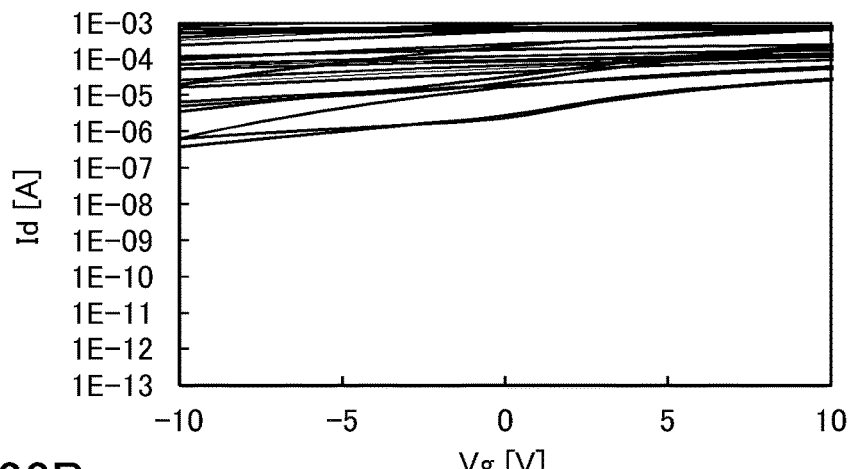
FIGS. 22A to 22C each show Vg-Id characteristics of a transistor.
Figure 22B:
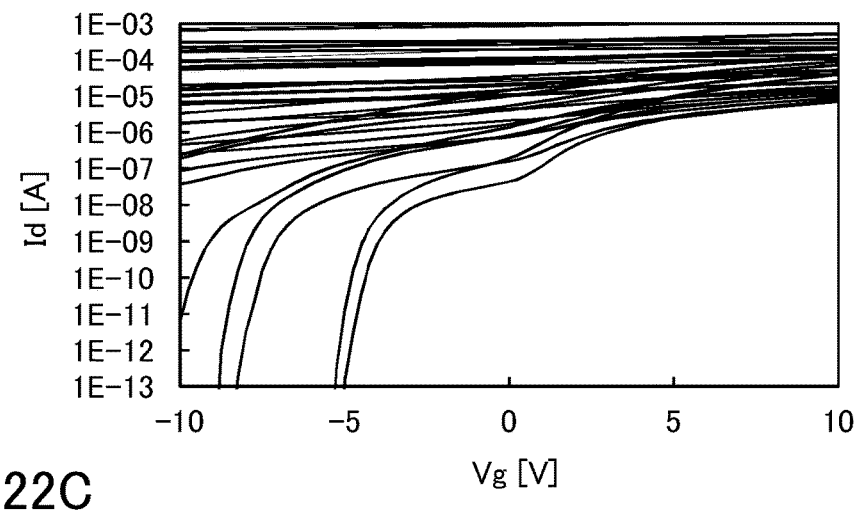
Figure 22C:
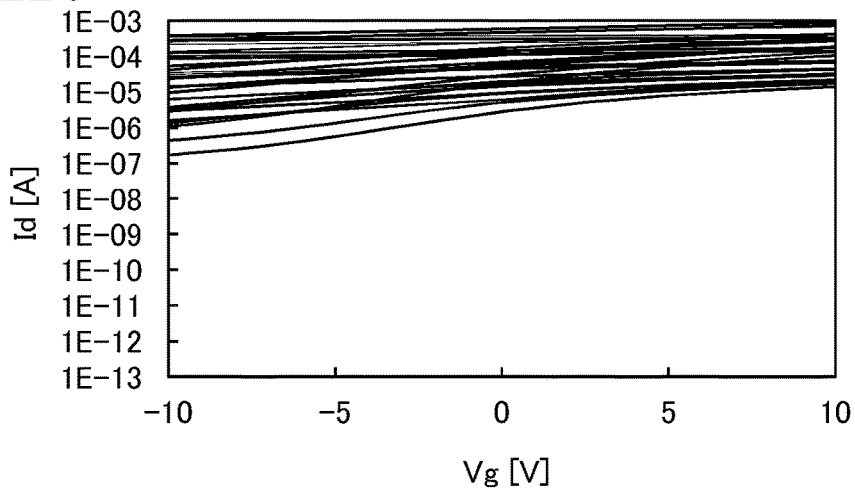
Figure 23A:
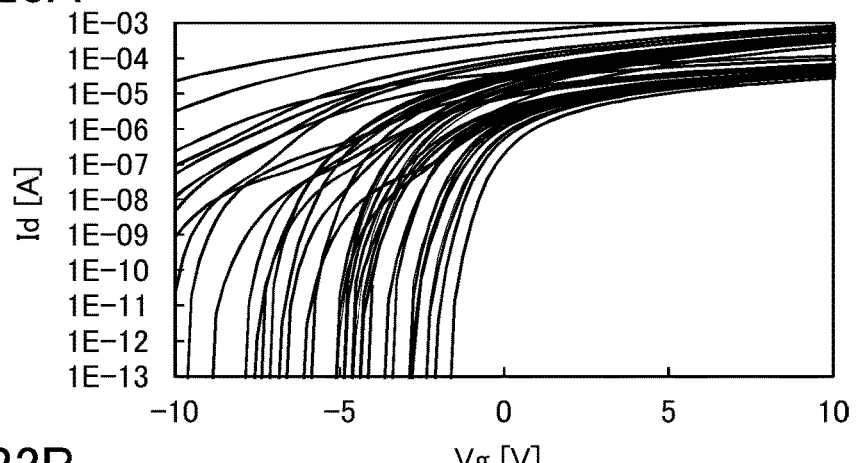
FIGS. 23A to 23C each show Vg-Id characteristics of a transistor.
Figure 23B:
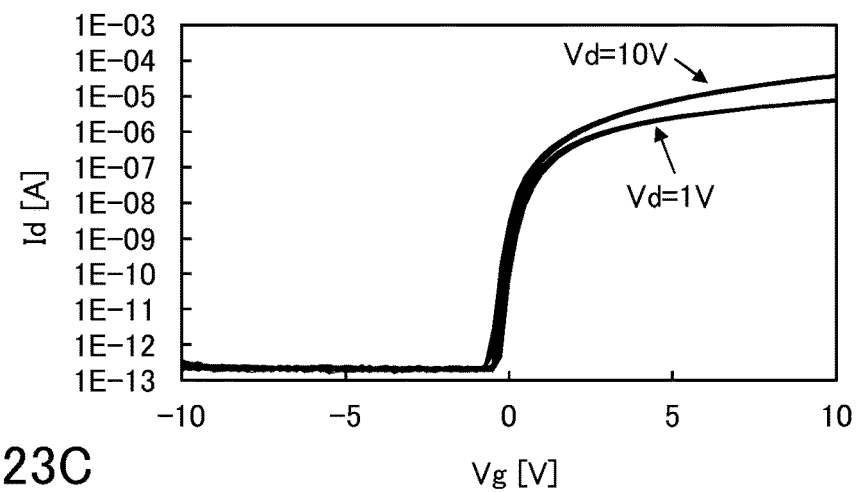
Figure 23C:
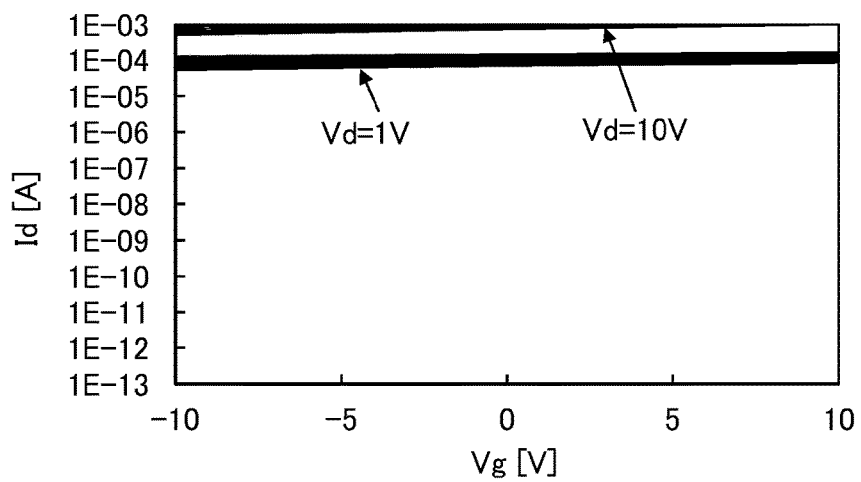

FIG. 21A, FIG. 22A, and FIG. 23A show the initial characteristics of the transistors 1 included in the samples. FIG. 21B, FIG. 22B, and FIG. 23B show the initial characteristics of the transistors 2 included in the samples. FIG. 21C, FIG. 22C, and FIG. 23C show the Vg-Id characteristics of the transistors 2 included in the samples after the PCT. In addition, in each sample, 24 transistors having the same structure were formed on the substrate.

In the Vg-Id characteristics shown in FIG. 22A, switching characteristics are not found. In the Vg-Id characteristics shown in FIG. 23A, threshold voltages are varied greatly. However, in the Vg-Id characteristics shown in FIG. 21A, good switching characteristics are found, and threshold voltages are varied slightly.

Threshold voltages in the initial Vg-Id characteristics shown in FIG. 21B and FIG. 23B are varied more slightly than those in the initial Vg-Id characteristics shown in FIG. 22B.

Switching characteristics which are better than those in the Vg-Id characteristics after the PCT in FIG. 22C and FIG. 23C are found in the Vg-Id characteristics after the PCT in FIG. 21C.

Accordingly, by forming a silicon nitride film with a small amount of released hydrogen molecules and a small amount of released ammonia molecules over a transistor, a shift in threshold voltage in a negative direction can be inhibited, and the reliability of the transistor can be improved.

Next, the insulating film 26 was formed in steps that are similar to those of the samples B1 to B3 in this example and in conditions other than the conditions 1 to 3, so that a plurality of samples were formed. In addition, in each sample, 24 transistors having the same structure were formed on the substrate, and the initial Vg-Id characteristics of the transistors were compared. Note that the transistors each have a channel length L of 2 µm and a channel width W of 50 µm.

Figure 24:
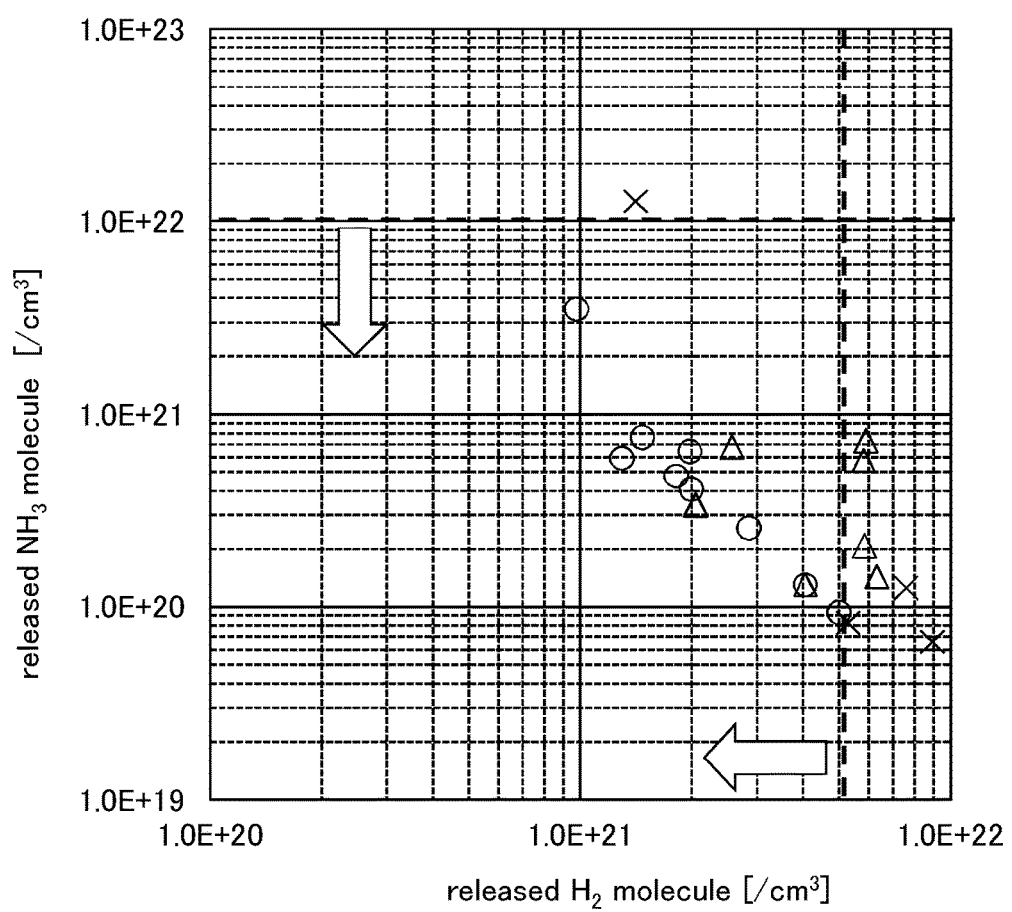
FIG. 24 shows the amount of hydrogen molecules and the amount of ammonia molecules released from a silicon nitride film.

FIG. 24 shows the relation between the amount of hydrogen and the amount of ammonia released from the insulating film 26 and the initial Vg-Id characteristics of the transistors in the samples B1 to B3 and the plurality of samples in which the insulating film 26 is formed in conditions other than the conditions 1 to 3.

In FIG. 24, the horizontal axis represents the amount of hydrogen released from the insulating film 26, and the vertical axis represents the amount of ammonia released from the insulating film 26. In addition, in FIG. 24, a circle indicates that in the 24 transistors on the substrate, a difference between the maximum threshold voltage and the minimum threshold voltage (Vth_max−Vth_min) is lower than or equal to 1 V. Further, a triangle indicates that Vth_max−Vth_min is higher than 1 V and lower than or equal to 3 V. Furthermore, a cross indicates that Vth_max−Vth_min is higher than 3 V.

In FIG. 24, a cross is not plotted in a region where the amount of hydrogen released from the insulating film 26 is smaller than $5\times10^{21}$ molecule/cm$^3$ and the amount of ammonia released from the insulating film 26 is smaller than $1\times10^{22}$ molecule/cm$^3$. Thus, it can be said that by providing a silicon nitride film where the amount of released hydrogen is smaller than $5\times10^{21}$ molecule/cm$^3$ and the amount of released ammonia is smaller than $1\times10^{22}$ molecule/cm$^3$ over a transistor, variations in threshold voltages of the transistors are reduced. Further, a shift in threshold voltage in a negative direction can be inhibited.

This application is based on Japanese Patent Application serial No. 2012-147225 filed with Japan Patent Office on Jun. 29, 2012, the entire contents of which are hereby incorporated by reference.

What is claimed is:

1. A semiconductor device comprising:
a pulse output circuit comprising:
a first transistor comprising a gate, a first terminal, and a second terminal;
a first capacitor comprising a first terminal and a second terminal;
a second transistor comprising a gate, a first terminal, and a second terminal;
a third transistor comprising a gate, a first terminal, and a second terminal;
a second capacitor comprising a first terminal and a second terminal; and
a fourth transistor comprising a gate, a first terminal, and a second terminal,
wherein the gate of the first transistor is electrically connected to the first terminal of the first capacitor,
wherein the first terminal of the first transistor is electrically connected to the second terminal of the first capacitor and the first terminal of the second transistor,
wherein the second terminal of the second transistor is electrically connected to the gate of the third transistor and the first terminal of the second capacitor,
wherein the first terminal of the third transistor is electrically connected to the second terminal of the second capacitor and the first terminal of the fourth transistor,
wherein the first transistor, the second transistor, the third transistor, and the fourth transistor have the same conductivity type,
wherein the second terminal of the first transistor is electrically connected to a first wiring configured to be supplied with a clock signal,
wherein the second terminal of the third transistor is electrically connected to a second wiring configured to be supplied with a high power supply potential, and
wherein an output end of the pulse output circuit is electrically connected to the second wiring though the first terminal of the third transistor and the second terminal of the third transistor.

2. The semiconductor device according to claim 1, wherein the gate of the second transistor is electrically connected to the first terminal of the second transistor.

3. The semiconductor device according to claim 1, further comprising:
a fifth transistor comprising a gate, a first terminal, and a second terminal; and
a sixth transistor comprising a gate, a first terminal, and a second terminal,
wherein the gate of the fourth transistor is electrically connected to the gate of the fifth transistor,
wherein the first terminal of the fifth transistor is electrically connected to the first terminal of the first transistor, the second terminal of the first capacitor, and the first terminal of the second transistor, and
wherein the first terminal of the sixth transistor is electrically connected to the second terminal of the second transistor, the gate of the third transistor, and the first terminal of the second capacitor.

4. The semiconductor device according to claim 3, further comprising:
a seventh transistor comprising a gate, a first terminal, and a second terminal;
an eighth transistor comprising a gate, a first terminal, and a second terminal;
a ninth transistor comprising a gate, a first terminal, and a second terminal; and
a tenth transistor comprising a gate, a first terminal, and a second terminal,
wherein the gate of the seventh transistor is electrically connected to the gate of the tenth transistor,
wherein the first terminal of the seventh transistor is electrically connected to the gate of the first transistor, the first terminal of the first capacitor, and the first terminal of the eighth transistor,
wherein the gate of the eighth transistor is electrically connected to the gate of the sixth transistor and the gate of the ninth transistor, and
wherein the first terminal of the ninth transistor is electrically connected to the gate of the fourth transistor, the gate of the fifth transistor, and the first terminal of the tenth transistor.

5. The semiconductor device according to claim 1,
wherein at least one of the first transistor, the second transistor, the third transistor, and the fourth transistor comprises a semiconductor film, and
wherein the semiconductor film comprises indium and zinc.

6. A display device comprising:
a pixel portion; and
a driver circuit functionally connected to the pixel portion,
wherein the driver circuit comprises the semiconductor device according to claim 1.

7. A semiconductor device comprising:
a first transistor comprising a first gate, a second gate, a first terminal, and a second terminal;
a first capacitor comprising a first terminal and a second terminal;
a second transistor comprising a gate, a first terminal, and a second terminal;
a third transistor comprising a first gate, a second gate, a first terminal, and a second terminal;
a second capacitor comprising a first terminal and a second terminal; and
a fourth transistor comprising a first gate, a first terminal, and a second terminal,
wherein the first gate of the first transistor is electrically connected to the first terminal of the first capacitor,
wherein the first terminal of the first transistor is electrically connected to the second terminal of the first capacitor and the first terminal of the second transistor,
wherein the second terminal of the second transistor is electrically connected to the first gate of the third transistor and the first terminal of the second capacitor,
wherein the first terminal of the third transistor is electrically connected to the second terminal of the second capacitor and the first terminal of the fourth transistor,
wherein the first transistor, the second transistor, the third transistor, and the fourth transistor have the same conductivity type,
wherein the first gate and the second gate of the first transistor are overlapped with each other,
wherein the first gate and the second gate of the third transistor are overlapped with each other,
wherein the second terminal of the first transistor is electrically connected to a first wiring configured to be supplied with a clock signal, wherein the second terminal of the third transistor is electrically connected to a second wiring configured to be supplied with a high power supply potential, and wherein an output end of the pulse output circuit is electrically connected to the second wiring though the first terminal of the third transistor and the second terminal of the third transistor.

8. The semiconductor device according to claim 7, wherein the gate of the second transistor is electrically connected to the first terminal of the second transistor.

9. The semiconductor device according to claim 7, further comprising:

a fifth transistor comprising a first gate, a first terminal, and a second terminal; and a sixth transistor comprising a first gate, a first terminal, and a second terminal, wherein the first gate of the fourth transistor is electrically connected to the first gate of the fifth transistor, wherein the first terminal of the fifth transistor is electrically connected to the first terminal of the first transistor, the second terminal of the first capacitor, and the first terminal of the second transistor, and wherein the first terminal of the sixth transistor is electrically connected to the second terminal of the second transistor, the first gate of the third transistor, and the first terminal of the second capacitor.

10. The semiconductor device according to claim 9, further comprising:

a seventh transistor comprising a gate, a first terminal, and a second terminal;

an eighth transistor comprising a gate, a first terminal, and a second terminal;

a ninth transistor comprising a gate, a first terminal, and a second terminal; and a tenth transistor comprising a gate, a first terminal, and a second terminal, wherein the gate of the seventh transistor is electrically connected to the gate of the tenth transistor, wherein the first terminal of the seventh transistor is electrically connected to the first gate of the first transistor, the first terminal of the first capacitor, and the first terminal of the eighth transistor, wherein the gate of the eighth transistor is electrically connected to the first gate of the sixth transistor and the gate of the ninth transistor, and wherein the first terminal of the ninth transistor is electrically connected to the first gate of the fourth transistor, the first gate of the fifth transistor, and the first terminal of the tenth transistor.

11. The semiconductor device according to claim 7, wherein at least one of the first transistor, the second transistor, the third transistor, and the fourth transistor comprises a semiconductor film, and wherein the semiconductor film comprises indium and zinc.

12. The semiconductor device according to claim 7, wherein the fourth transistor further comprises a second gate overlapping with the first gate.

13. The semiconductor device according to claim 9, wherein the fifth transistor further comprises a second gate overlapping with the first gate, and wherein the sixth transistor further comprises a second gate overlapping with the second gate.

14. A display device comprising:

a pixel portion; and a driver circuit functionally connected to the pixel portion, wherein the driver circuit comprises the semiconductor device according to claim 7.

* * * * *